US010928726B2

(12) United States Patent
Kawashima et al.

(10) Patent No.: US 10,928,726 B2
(45) Date of Patent: Feb. 23, 2021

(54) DISPERSION LIQUID, COMPOSITION, FILM, MANUFACTURING METHOD OF FILM, AND DISPERSANT

(71) Applicant: FUJIFILM Corporation, Tokyo (JP)

(72) Inventors: Takashi Kawashima, Haibara-gun (JP); Yoshinori Taguchi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 60 days.

(21) Appl. No.: 16/299,666

(22) Filed: Mar. 12, 2019

(65) Prior Publication Data

US 2019/0212648 A1 Jul. 11, 2019

Related U.S. Application Data

(63) Continuation of application No. PCT/JP2017/033791, filed on Sep. 20, 2017.

(30) Foreign Application Priority Data

Sep. 27, 2016 (JP) .............................. JP2016-188040

(51) Int. Cl.
| | | |
|---|---|---|
| *G03F 7/00* | (2006.01) | |
| *C09D 17/00* | (2006.01) | |
| *C09D 4/06* | (2006.01) | |
| *C09D 7/45* | (2018.01) | |
| *C09D 133/06* | (2006.01) | |
| *C08K 3/22* | (2006.01) | |
| *G03F 7/105* | (2006.01) | |
| *G03F 7/07* | (2006.01) | |
| *C08L 101/02* | (2006.01) | |
| *G03F 7/004* | (2006.01) | |
| *G03F 7/075* | (2006.01) | |
| *G03F 7/027* | (2006.01) | |

(52) U.S. Cl.
CPC .............. *G03F 7/0048* (2013.01); *C08K 3/22* (2013.01); *C08L 101/02* (2013.01); *C09D 4/06* (2013.01); *C09D 7/45* (2018.01); *C09D 17/002* (2013.01); *C09D 17/008* (2013.01); *C09D 133/066* (2013.01); *G03F 7/0047* (2013.01); *G03F 7/027* (2013.01); *G03F 7/0755* (2013.01); *G03F 7/105* (2013.01); *C08K 2003/2241* (2013.01)

(58) Field of Classification Search
CPC ...... G03F 7/0048; G03F 7/106; G03F 7/0755; G03F 7/0047; G03F 7/027; C09D 17/002; C09D 17/008; C09D 4/06; C09D 7/45; C09D 133/066; C08K 3/22; C08K 2003/2241; C08L 101/02
USPC ........................................................ 516/31
See application file for complete search history.

(56) References Cited

U.S. PATENT DOCUMENTS

| | | | |
|---|---|---|---|
| 9,447,270 B2 * | 9/2016 | Arayama | .................. C08F 2/44 |
| 10,287,422 B2 * | 5/2019 | Arayama | .................. C09D 7/66 |
| 2009/0263631 A1 | 10/2009 | Sakamoto et al. | |
| 2010/0233595 A1 | 9/2010 | Takahashi et al. | |
| 2015/0166780 A1 * | 6/2015 | Arayama | .................. C08K 9/04 |
| | | | 522/39 |
| 2015/0166816 A1 | 6/2015 | Arayama et al. | |
| 2015/0338733 A1 | 11/2015 | Kaneko | |
| 2016/0090495 A1 | 3/2016 | Suzuki | |
| 2017/0029599 A1 * | 2/2017 | Arayama | ................ G03F 7/038 |

FOREIGN PATENT DOCUMENTS

| | | | |
|---|---|---|---|
| CN | 101405310 A | | 4/2009 |
| CN | 103874961 A | | 6/2014 |
| CN | 104412161 A | | 3/2015 |
| CN | 104603210 A | | 5/2015 |
| CN | 104640932 A | | 5/2015 |
| CN | 105462360 A | | 4/2016 |
| JP | 11-209554 A | | 8/1999 |
| JP | 11209554 A | * | 8/1999 |
| JP | 2007-72374 A | | 3/2007 |
| JP | 2008-19292 A | | 1/2008 |
| JP | 2008-95087 A | | 4/2008 |
| JP | 2013-125087 A | | 6/2013 |
| JP | 2013125087 A | * | 6/2013 |
| JP | 2014-170189 A | | 9/2014 |
| JP | 2016-69415 A | | 5/2016 |
| JP | 2016-170324 A | | 9/2016 |
| WO | WO 2013/054870 A1 | | 4/2013 |
| WO | WO 2014/003111 A1 | | 1/2014 |
| WO | WO 2014/034813 A1 | | 3/2014 |
| WO | WO 2014/034815 A1 | | 3/2014 |
| WO | WO 2014/157720 A1 | | 10/2014 |

(Continued)

OTHER PUBLICATIONS

Japanese Office Action, dated Nov. 26, 2019, for Japanese Application No. 2018-542437, with an English translation.

Japanese Office Action for corresponding Japanese Application No. 2018-542437, dated Feb. 12, 2020, with English Machine translation.

International Preliminary Report on Patentability and Written Opinion of the International Searching Authority(Forms PCT/IB/326, PCT/IB/373 and PCT/ISA/237), dated Apr. 11, 2019, for International Application No. PCT/JP2017/033791, with an English Translation of the Written Opinion.

(Continued)

*Primary Examiner* — Michael Bernshteyn
(74) *Attorney, Agent, or Firm* — Birch, Stewart, Kolasch & Birch, LLP

(57) ABSTRACT

Provided are a dispersion liquid and a composition which have excellent particle dispersibility and make it possible to manufacture a film having a high color valency. Also provided are a film, a manufacturing method of a film, and a dispersant. The dispersion liquid contains particles, a solvent, and a dispersant. The dispersant has a particle adsorption portion and a solvophilic portion, and the solvophilic portion includes a moiety which is decomposed or denatured by an external stimulus.

15 Claims, No Drawings

(56) References Cited

FOREIGN PATENT DOCUMENTS

WO     WO-2014157720 A1 * 10/2014 ................ C08F 2/48
WO     WO 2016/006669 A1     1/2016

OTHER PUBLICATIONS

International Search Report (Form PCT/ISA/210), dated Dec. 12, 2017, for International Application No. PCT/JP2017/033791, with an English translation.
Japanese Office Action, dated Apr. 7, 2020, for Japanese Application No. 2018-542437, with an English transtation.
Chinese Office Action and Search Report for corresponding Chinese Application No. 201780055009.4, dated Nov. 3, 2020, with English translation of the Office Action.

* cited by examiner

DISPERSION LIQUID, COMPOSITION, FILM, MANUFACTURING METHOD OF FILM, AND DISPERSANT

CROSS-REFERENCE TO RELATED APPLICATIONS

This application is a Continuation of PCT International Application No. PCT/JP2017/033791 filed on Sep. 20, 2017, which claims priority under 35 U.S.C § 119(a) to Japanese Patent Application No. 2016-188040 filed on Sep. 27, 2016. Each of the above application(s) is hereby expressly incorporated by reference, in its entirety, into the present application.

BACKGROUND OF THE INVENTION

1. Field of the Invention

The present invention relates to a dispersion liquid, a composition, a film, a manufacturing method of a film, and a dispersant.

2. Description of the Related Art

A process of manufacturing a film by using a composition containing particles and a binder is being performed. In the composition containing particles, the particles are used in the form of a dispersion liquid in which the particles are dispersed in the presence of a dispersant and a solvent. As the dispersant, a resin, which has a particle adsorption portion and a solvophilic portion, or the like is used.

Incidentally, JP2014-170189A describes a colored photosensitive composition containing a resin whose solubility in an alkaline developer is improved by the action of an acid, a pigment, a compound which generates an acid by being irradiated with actinic rays or radiation, and a solvent, in which a ratio of the pigment to the total solid content in the colored photosensitive composition is equal to or higher than 20% by mass. According to paragraph "0010" in JP2014-170189A, in a case where the above constitution is adopted, even though the pigment concentration in the colored photosensitive composition is increased, it is possible to improve developability while maintaining high sensitivity.

SUMMARY OF THE INVENTION

The dispersant needs to stably disperse the particles in the composition. Therefore, as the dispersant, conventionally, a resin, which is stable against an external stimulus such as heat, light, an acid, and a base and hardly deteriorates the particle dispersibility even under the external stimulus, or the like has been used. Furthermore, from the viewpoint of the stability of the composition, it is desirable to use particles having a small particle diameter.

In recent years, a film having a high color valency has been required. For example, in a case where a white pigment is used as particles, a film having high whiteness is required. However, in a case where particles having a small particle diameter are used, it is difficult to manufacture a film having a high color valency.

The invention disclosed in JP2014-170189A aims to improve alkali developability but does not aim to manufacture a film having a high color valency while improving the particle dispersibility.

Therefore, an object of the present invention is to provide a dispersion liquid and a composition which have excellent particle dispersibility and make it possible to manufacture a film having a high color valency. Another object of the present invention is to provide a film, a manufacturing method of a film, and a dispersant.

Based on the circumstances described above, the inventors of the present invention conducted an intensive examination. As a result, the inventors considered that in a case where it is possible to inhibit a dispersant from functioning at the time of forming a film, particles may be easily aggregated at the time of forming a film, the size of the particles in the film could be increased, and hence a film having a high color valency could be manufactured.

Based on this idea, the inventors have accomplished the present invention. The present invention provides the following.

<1> A dispersion liquid comprising particles, a solvent, and a dispersant, in which the dispersant has a particle adsorption portion and a solvophilic portion, and the solvophilic portion has a moiety which is decomposed or denatured by an external stimulus.

<2> The dispersion liquid described in <1>, in which a solubility parameter of the dispersant changes by 0.5 $MPa^{0.5}$ or more by an external stimulus.

<3> The dispersion liquid described in <1> or <2>, in which the solvophilic portion includes a moiety which is decomposed or denatured by the action of heat, light, an acid, or an alkali.

<4> The dispersion liquid described in <1> or <2>, in which the solvophilic portion includes a moiety which is decomposed or denatured by the action of heat.

<5> The dispersion liquid described in any one of <1> to <4>, in which the particle adsorption portion contains at least one kind of group selected from an acid group, a colorant structure, a heterocyclic group, or an acyclic heteroatom-containing group.

<6> The dispersion liquid described in any one of <1> to <5>, in which an absolute value of a difference between a solubility parameter of the solvophilic portion and a solubility parameter of the solvent is equal to or smaller than 2.5 $MPa^{0.5}$.

<7> The dispersion liquid described in any one of <1> to <6>, in which the particles are a white pigment.

<8> The dispersion liquid described in any one of <1> to <7>, in which the particles are titanium oxide.

<9> The dispersion liquid described in any one of <1> to <8>, in which the dispersant is a dendrimer having a particle adsorption portion and a solvophilic portion.

<10> A composition comprising the dispersion liquid described in any one of <1> to <9> and a binder.

<11> The composition described in <10> further comprising an acid generator or a base generator.

<12> The composition described in <10> or <11> further comprising a curable compound.

<13> A film formed of the composition described in any one of <10> to <12>.

<14> A manufacturing method of a film using the composition described in any one of <10> to <12>.

<15> A dispersant comprising a particle adsorption portion and a solvophilic portion, in which the solvophilic portion includes a moiety which is decomposed or denatured by an external stimulus.

According to the present invention, it is possible to provide a dispersion liquid and a composition, which have excellent particle dispersibility and make it possible to manufacture a film having a high color valency, a film, a manufacturing method of a film, and a dispersant.

DESCRIPTION OF THE PREFERRED EMBODIMENTS

Hereinafter, details of the present invention will be specifically described.

In the following section, constituents will be described based on typical embodiments of the present invention in some cases, but the present invention is not limited to the embodiments.

In the present specification, a range of numerical values described using "to" means a range which includes the numerical values listed before and after "to" as a lower limit and an upper limit.

In the present specification, in a case where there is no description regarding whether a group (atomic group) is substituted or unsubstituted, the group includes both a group (atomic group) which does not have a substituent and a group (atomic group) which has a substituent. For example, "alkyl group" includes not only an alkyl group which does not have a substituent (unsubstituted alkyl group) but also an alkyl group which has a substituent (substituted alkyl group).

In the present specification, "(meth)acrylate" represents acrylate and methacrylate, "(meth)acryl" represents acryl and methacryl, and "(methacryloyl)" represents acryloyl and methacryloyl.

In chemical formulae in the present specification, Me represents a methyl group, Et represents an ethyl group, Pr represents a propyl group, Bu represents a butyl group, and Ph represents a phenyl group.

In the present specification, unless otherwise specified, "exposure" includes not only the exposure using light but also lithography using particle beams such as electron beams and ion beams. Examples of the light used in the exposure include actinic rays or radiation such as a bright line spectrum of a mercury lamp, far ultraviolet rays represented by an excimer laser, extreme ultraviolet radiation (EUV rays), X-rays, electron beams, and the like.

In the present specification, a weight-average molecular weight and a number-average molecular weight are defined as a value which is measured by gel permeation chromatography (GPC) and expressed in terms of polystyrene. In the present specification, a weight-average molecular weight (Mw) and a number-average molecular weight (Mn) can be determined, for example, by using HLC-8220GPC (manufactured by Tosoh Corporation), a column obtained by connecting Tosoh TSKgel Super HZM-H, TOSOH TSKgel Super HZ4000, and TOSOH TSKgel Super HZ2000, and tetrahydrofuran as a developing solvent.

<Dispersion Liquid>

The dispersion liquid according to the embodiment of the present invention contains particles, a solvent, and a dispersant, in which the dispersant has a particle adsorption portion and a solvophilic portion, and the solvophilic portion includes a moiety which is decomposed or denatured by an external stimulus.

According to the present invention, because the dispersant has a particle adsorption portion and a solvophilic portion, particles can be stably dispersed in the dispersion liquid. Furthermore, because the solvophilic portion of the dispersant has a moiety which is decomposed or denatured by an external stimulus, by providing an external stimulus to the dispersant at the time of manufacturing a film by using a composition containing the dispersion liquid, it is possible to inhibit the dispersant from functioning. Accordingly, the particles can be appropriately aggregated at the time of forming a film, and a film having a high color valency can be manufactured. Particularly, according to the present invention, even in a case where particles having a small average primary particle diameter are used, a film having a high color valency can be manufactured. Hereinafter, each of the components of the dispersion liquid according to the embodiment of the present invention will be described.

<<Dispersant>>

The composition according to the embodiment of the present invention contains a dispersant having a particle adsorption portion and a solvophilic portion, in which the solvophilic portion includes a moiety which is decomposed or denatured by an external stimulus. This dispersant is also the dispersant according to the embodiment of the present invention. In the present invention, the particle adsorption portion means a moiety having a group or a structure which has a function of intimately attaching the dispersant and particles to each other by using Van der Waals interaction force, electrostatic interaction force, covalent bonding force, ion bonding force, or coordinate bonding force. In addition, the solvophilic portion means a moiety which exhibits affinity to a solvent.

The dispersant has a particle adsorption portion. It is preferable that the particle adsorption portion has at least one kind of group selected from an acid group, a colorant structure, a heterocyclic group, or an acyclic hetero atom-containing group (these will be collectively referred to as particle adsorption group as well). As the particle adsorption group, an acid group, a heterocyclic structure, and an acyclic hetero atom-containing group are preferable, and an acid group is more preferable.

Examples of the particle adsorption portion include a monovalent substituent containing one or more particle adsorption groups described above, a repeating unit containing one or more particle adsorption groups, and the like. Examples of the aspect in which the monovalent substituent contains two or more particle adsorption groups include an aspect in which two or more particle adsorption groups are bonded to each other through a chain-like saturated hydrocarbon group (may be linear or branched, preferably having 1 to 10 carbon atoms), a cyclic saturated hydrocarbon group (preferably having 3 to 10 carbon atoms), an aromatic group (preferably having 5 to 10 carbon atoms, for example, a phenylene group), or the like such that a monovalent substituent is formed, and the like. In a case where a particle adsorption group constitutes the monovalent substituent, the particle adsorption group itself may be a monovalent substituent (particle adsorption portion).

Examples of the repeating unit containing one or more particle adsorption groups include a structure in which a monovalent substituent containing one or more particle adsorption groups is bonded to a side chain of the repeating unit.

Examples of the acid group include a carboxyl group, a sulfo group, and a phosphoric acid group. Among these, a carboxyl group is preferable. Examples of the colorant structure include colorant structures derived from colorants based on phthalocyanine, azo, azo lake, anthraquinone, quinacridone, dioxazine, diketopyrrolopyrrole, anthanthrone, Indanthrone, flavanthrone, perinone, perylene, thioindigo, pyrazolone, benzimidazolone, quinoxaline, azomethine, quinophthalone, isoindolinone, isoindoline, anthraquinone, and the like. Examples of the heterocyclic group include a thiophene ring group, a furan ring group, a xanthene ring group, a pyrrole ring group, a pyrroline ring group, a pyrrolidine ring group, a dioxolane ring group, a pyrazole ring group, a pyrazoline ring group, a pyrazolidine ring group, an imidazole ring group, an oxazole ring group, a thiazole ring group, an oxadiazole ring group, a triazole ring group, a thiadiazole ring group, a pyran ring group, a pyridine ring group, a piperidine ring group, a dioxane ring group, a morpholine ring group, a pyridazine ring group, a pyrimidine ring group, a piperazine ring group, a triazine ring group, a trithiane ring group, an isoindoline ring group, an isoindolinone ring group, a benzimidazolone ring group, a benzimidazole ring group, a benzothiazole ring group, a succinimide ring group, a phthalimide ring group, a naphthalimide ring group, a hydantoin ring group, an indole ring group, a quinoline ring group, a carbazole ring group, an acridine ring group, an acridone ring group, and an anthraquinone ring group. Examples of the acyclic heteroatom-containing group include acyclic groups having a nitrogen atom, such as a urea group, an imide group, an amide group, and a sulfonamide group. Examples of the urea group include —NR$^{100}$CONR$^{101}$R$^{102}$. R$^{100}$, R$^{101}$, and R$^{102}$ each independently represent a hydrogen atom, an alkyl group, or an aryl group. The number of carbon atoms in the alkyl group is preferably 1 to 30, and more preferably 1 to 20. The alkyl group may be any of a linear, branched, or cyclic alkyl group. The number of carbon atoms in the aryl group is preferably 6 to 30, and more preferably 6 to 20. As R$^{100}$ and R$^{101}$, a hydrogen atom is preferable. As R$^{102}$, an alkyl group or an aryl group is preferable, and an aryl group is more preferable.

The content of the particle adsorption portion contained in the dispersant is preferably 1% to 80% by mass, more preferably 3% to 60% by mass, and even more preferably 3% to 50% by mass.

Furthermore, the number of particle adsorption groups contained in the dispersant is preferably 1 to 100, more preferably 1 to 80, and even more preferably 1 to 50.

The dispersant has a solvophilic portion. The solvophilic portion includes a moiety which is decomposed or denatured by an external stimulus.

It is preferable that the solubility parameter of the solvophilic portion is close to the solubility parameter of the solvent contained in the dispersion liquid. The absolute value of a difference between the solubility parameter of the solvophilic portion and the solubility parameter of the solvent contained in the dispersion liquid is more preferably equal to or smaller than 2.5 MPa$^{0.5}$, even more preferably equal to or smaller than 1.5 MPa$^{0.5}$, and particularly preferably equal to or smaller than 1 MPa$^{0.5}$. The solubility parameter of the solvophilic portion is preferably 16 to 26 MPa$^{0.5}$, more preferably 17 to 25 MPa$^{0.5}$, and even more preferably 17 to 23 MPa$^{0.5}$.

In the present invention, a value determined by the Okitsu method is used as a value of a solubility parameter. As documents disclosing the Okitsu method, Toshinao Okitsu, The Journal of The Adhesion Society of Japan, vol. 29, No. 5, 204-211 (1993) or SP Value, Fundamentals-Applications and Calculation Method (Yamamoto, JOHOKIKO, CO., LTD., 2005) can be referred to. Here, in a case where the value of a solubility parameter cannot be measured by the methods described in these documents for special circumstances, the value of a solubility parameter may be measured by other methods.

The solvophilic portion includes a moiety which is decomposed or denatured by an external stimulus. It is preferable that the solvophilic portion contains a repeating unit including a moiety which is decomposed or denatured by an external stimulus. Examples of the external stimulus include heat, light, an acid, an alkali, ultrasonic waves, and the like. Among these, heat, light, an acid, or an alkali is preferable, heat or light is more preferable, and heat is particularly preferable. That is, in the present invention, the solvophilic portion in the dispersant preferably includes a moiety which is decomposed or denatured by the action of heat, light, an acid, or an alkali, more preferably includes a moiety which is decomposed or denatured by the action of heat or light, and even more preferably includes a moiety which is decomposed or denatured by the action of heat. According to this aspect, particles are easily aggregated at the time of forming a film. Particularly, in a case where a dispersant having a solvophilic portion including a moiety which is decomposed or denatured by the action of heat is used, it is expected that an effect will be obtained which makes it easy to achieve both the optical patterning properties (pattern forming properties by a photolithography method) and the particle aggregating properties at the time of forming a film.

Examples of the moiety, which is decomposed or denatured by heat, in the solvophilic portion in the dispersant according to the embodiment of the present invention include a tertiary ester of a carboxylic acid, acetal of a carboxylic acid, a sulfonic acid ester, and the like. Specifically, examples of the moiety include the following structures.

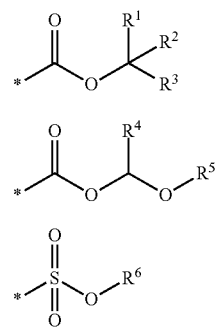

In the formulae, R$^1$ to R$^6$ each independently represent an alkyl group or an aryl group. * represents a bond. R$^1$ and R$^2$ may form an aliphatic ring by being bonded to each other. R$^4$ and R$^5$ may form a cyclic ether by being bonded to each other. The number of carbon atoms in the alkyl group is preferably 1 to 10, and more preferably 1 to 4. The number of carbon atoms in the aryl group is preferably 6 to 20, and more preferably 6 to 10.

Examples of the moiety, which is decomposed or denatured by light, in the solvophilic portion in the dispersant according to the embodiment of the present invention include structures represented by Formulae a-11 to a-15.

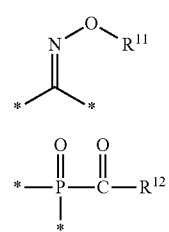

-continued

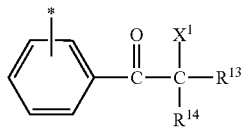
a-13

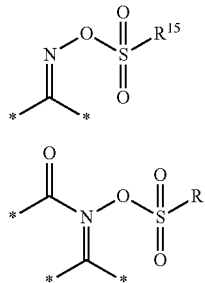
a-14 a-15

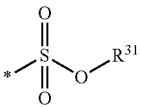
a-31

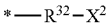
a-32

In the formulae, $R^{31}$ represents an alkyl group or an aryl group. The number of carbon atoms in the alkyl group is preferably 1 to 10, and more preferably 1 to 4. The number of carbon atoms in the aryl group is preferably 6 to 20, and more preferably 6 to 10. $R^{32}$ represents an alkylene group. The number of carbon atoms in the alkylene group is preferably 1 to 10, and more preferably 1 to 4. $X^2$ represents a halogen atom. Examples of the halogen atom include a chlorine atom, a bromine atom, and an iodine atom. * represents a bond.

In the formulae, $R^{11}$ to $R^{16}$ each independently represent an alkyl group or an aryl group. $X^1$ represents $OR^{x1}$, $NR^{x2}R^{x3}$, or $SR^{x4}$. $R^{x1}$ to $R^{x4}$ each independently represent an alkyl group or an aryl group. * represents a bond. The number of carbon atoms in the alkyl group is preferably 1 to 10, and more preferably 1 to 4. The number of carbon atoms in the aryl group is preferably 6 to 20, and more preferably 6 to 10.

Examples of the moiety, which is decomposed or denatured by an acid, in the solvophilic portion in the dispersant according to the embodiment of the present invention include a tertiary ester of a carboxylic acid, acetal of a carboxylic acid, acetal of an alcohol, and the like. Specific examples of the moiety include the following structures.

The solvophilic portion in the dispersant is preferably a group represented by Formula (P-1). In a case where q in Formula (P-1) is an integer equal to or greater than 1, the repeating unit having $R^{13}$ on a side chain and the repeating unit having $R^{14}$ on a side chain are not limited to an aspect in which the repeating units are linked to each other in the order shown in the following structural formula such that a block of the repeating unit having $R^{13}$ on a side chain and a block of the repeating unit having $R^{14}$ on a side chain are formed. The repeating unit having $R^{13}$ on a side chain and the repeating unit having $R^{14}$ on a side chain may be randomly bonded to each other. That is, the group represented by Formula (P-1) may be a random copolymer or a block copolymer of the repeating unit having $R^{13}$ on a side chain and the repeating unit having $R^{14}$ on a side chain.

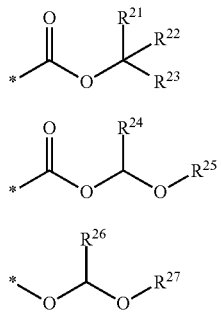
a-21 a-22 a-23

(P-1)

In Formula (P-1), * represents a bond, $R^{11}$ and $R^{12}$ each independently represent a hydrogen atom or an alkyl group, $L^2$ and $L^3$ each independently represent a single bond or a divalent linking group, $Z^1$ represents a hydrogen atom or a substituent, $R^{13}$ is a substituent including a moiety, which is decomposed or denatured by an external stimulus, or forms a substituent including a moiety which is decomposed or denatured by an external stimulus in the form of "-$L^2$-$R^{13}$", $R^{14}$ represents a hydrogen atom or a substituent, p represents an integer equal to or greater than 2, and q represents an integer equal to or greater than 0. In a case where p is equal to or greater than 2, a plurality of $R^{11}$'s, $R^{13}$'s and $L^2$'s may be the same as or different from each other. In a case where q is equal to or greater than 2, a plurality of $R^{12}$'s, $R^{14}$'S, and $L^3$'s may be the same as or different from each other.

Each of $R^{11}$ and $R^{12}$ is preferably a hydrogen atom or an alkyl group having 1 to 12 carbon atoms, and more preferably a hydrogen atom or a methyl group.

$L^2$ and $L^3$ each independently represent a single bond or a divalent linking group. Examples of the divalent linking group include an alkylene group (preferably an alkylene group having 1 to 10 carbon atoms), an alkenylene group In the formulae, $R^{21}$ to $R^{27}$ each independently represent an alkyl group or an aryl group. * represents a bond. $R^{21}$ and $R^{22}$ may form an aliphatic ring by being bonded to each other. $R^{24}$ and $R^{25}$ may form a cyclic ether by being bonded to each other. $R^{26}$ and $R^{27}$ may form a cyclic ether by being bonded to each other. The number of carbon atoms in the alkyl group is preferably 1 to 10, and more preferably 1 to 4. The number of carbon atoms in the aryl group is preferably 6 to 20, and more preferably 6 to 10.

Examples of the moiety, which is decomposed or denatured by an alkali, in the solvophilic portion in the dispersant according to the embodiment of the present invention include a sulfonic acid ester, halogenated alkyl, and the like. Specifically, examples of the moiety include the following structures.

(preferably an alkenylene group having 2 to 10 carbon atoms), —NH—, —SO—, —SO$_2$—, —CO—, —O—, —COO—, OCO—, —S—, and a group obtained by combining two or more of these.

$R^{13}$ is a substituent including a moiety, which is decomposed or denatured by an external stimulus, or forms a substituent including a moiety which is decomposed or denatured by an external stimulus in the form of "-L$^2$-R$^{13}$". Examples of the substituent including a moiety which is decomposed or denatured by an external stimulus include substituents including a moiety which is decomposed or denatured by the action of heat, light, an acid, or an alkali described above. Specifically, examples of the moiety which is decomposed or denatured by heat include the structures represented by a-1 to a-3 described above. In addition, examples of the moiety which is decomposed or denatured by light include the structures represented by a-11 to a-15 described above. In addition, examples of the moiety which is decomposed or denatured by an acid include the structures represented by a-21 to a-23 described above. In addition, examples of the moiety which is decomposed or denatured by an alkali include the structure represented by a-31 and a-32 described above. For example, in a case where "-L$^2$-R$^{13}$" forms the substituent including a moiety which is decomposed or denatured by an external stimulus, examples of the combination of L$^2$ and R$^{13}$ include a combination in which L$^2$ is —OCO— and R$^{13}$ is a tertiary alkyl group, and the like.

$R^{14}$ represents a hydrogen atom or an substituent. Examples of the substituent include an alkyl group, an aryl group, an alkoxy group, an acyl group, an acyloxy group, and the like.

$Z^1$ represents a hydrogen atom or a substituent. Examples of the substituent include an alkyl group, an alkoxy group, and the like.

p represents an integer equal to or greater than 2. p is preferably 2 to 100, and more preferably 2 to 50. p/(p+q) preferably equals 0.1 to 1, more preferably equals 0.2 to 1, and even more preferably equals 0.3 to 1.

The content of the solvophilic portion contained in the dispersant is preferably 10% to 98% by mass, more preferably 20% to 95% by mass, and even more preferably 30% to 90% by mass.

The content of the repeating unit including the moiety, which is decomposed or denatured by an external stimulus, contained in the dispersant is preferably 3% to 90% by mass, more preferably 10% to 90% by mass, and even more preferably 20% to 90% by mass.

The solubility parameter of the dispersant according to the embodiment of the present invention preferably changes by 0.5 MPa$^{0.5}$ or more by an external stimulus, more preferably changes by 0.65 MPa$^{0.5}$ or more by an external stimulus, and even more preferably changes by 0.8 MPa$^{0.5}$ or more by an external stimulus.

For example, in a case where heat is used as an external stimulus, and the dispersant is heated for 1 to 60 minutes at any temperature within a range of 80° C. to 160° C., the solubility parameter of the dispersant preferably changes such that a difference with the solubility parameter of the dispersant before heating becomes equal to or greater than 0.5 MPa$^{0.5}$, more preferably changes such that a difference with the solubility parameter of the dispersant before heating becomes equal to or greater than 0.65 MPa$^{0.5}$, and even more preferably changes such that a difference with the solubility parameter of the dispersant before heating becomes equal to or greater than 0.8 MPa$^{0.5}$.

Furthermore, in a case where light is used as an external stimulus, and the dispersant is irradiated with light (preferably an i-line) in any exposure amount within a range of 10 to 1,000 mJ/cm$^2$, the solubility parameter of the dispersant preferably changes such that a difference with the solubility parameter of the dispersant before light irradiation becomes equal to or greater than 0.5 MPa$^{0.5}$, more preferably changes such that a difference with the solubility parameter of the dispersant before light irradiation becomes equal to or greater than 0.65 MPa$^{0.5}$, and even more preferably changes such that a difference with the solubility parameter of the dispersant before light irradiation becomes equal to or greater than 0.8 MPa$^{0.5}$.

In addition, in a case where an acid is used as an external stimulus, and the dispersant is brought into contact with the acid having any pKa within a range of −10 to 4 for 1 to 60 minutes, the solubility parameter of the dispersant preferably changes such that a difference with the solubility parameter of the dispersant before contact with the acid becomes equal to or greater than 0.5 MPa$^{0.5}$, more preferably changes such that a difference with the solubility parameter of the dispersant before contact with the acid becomes equal to or greater than 0.65 MPa$^{0.5}$, and even more preferably changes such that a difference with the solubility parameter of the dispersant contact with the acid becomes equal to or greater than 0.8 MPa$^{0.5}$. Herein, pKa is the negative logarithm of an acid dissociation constant.

Moreover, in a case where an alkali is used as an external stimulus, and the dispersant is brought into contact with an alkali whose conjugate acid has any pKa within a range of 4 to 20 for 1 to 60 minutes, the solubility parameter of the dispersant preferably changes such that a difference with the solubility parameter of the dispersant before contact with the alkali becomes equal to or greater than 0.5 MPa$^{0.5}$, more preferably changes such that a difference with the solubility parameter of the dispersant before contact with the alkali becomes equal to or greater than 0.65 MPa$^{0.5}$, and even more preferably changes such that a difference with the solubility parameter of the dispersant contact with the alkali becomes equal to or greater than 0.8 MPa$^{0.5}$.

As the dispersant according to the embodiment of the present invention, any compound can be preferably used as long as the compound has the particle adsorption portion and the solvophilic portion described above. Examples of the compound include a linear polymer, a graft polymer, a dendrimer, and the like. Among these, a graft polymer and a dendrimer are preferable, and a dendrimer is more preferable. In a case where a dendrimer is used, particle dispersibility and particle aggregating properties at the time of forming a film are particularly improved. Presumably, this is because the dendrimer could distribute the particle adsorption portion or the solvophilic portion in a narrow range in a molecule for its structure.

In the present invention, a graft polymer refers to a polymer having a graft chain. The graft chain refers to a portion from the base of a main chain of a polymer to the terminal of a group branched off from the main chain.

The linear polymer refers to a polymer without a graft chain.

The dendrimer refers to a compound having a chemical structure constituting a core (hereinafter, referred to as "core portion" as well) and repeating chemical structures branched off from the core portion to the outside. In the present invention, the dendrimer includes not only a multibranched polymer having regularly branched structures but also a multibranched polymer having irregularly branched structures. The multibranched polymer having irregularly branched structures is also referred to as hyperbranched polymer or star polymer.

(Dendrimer)

In the dispersant according to the embodiment of the present invention, the dendrimer is preferably a compound represented by Formula (100)

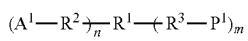

In Formula (100), $R^1$ represents an (m+n)-valent linking group, and $R^2$ and $R_3$ each independently represent a single bond or a divalent linking group. $A^1$ represents a particle adsorption portion, and $P^1$ represents a solvophilic portion including a moiety which is decomposed or denatured by an external stimulus, m represents 1 to 20, n represents 1 to 20, and m+n equals 2 to 21. n pieces of $A^1$ and $R^2$ may be the same as or different from each other, m pieces of $P^1$ and $R^3$ may be the same as or different from each other.

In Formula (100), $A^1$ represents a particle adsorption portion. Examples of the particle adsorption portion include a monovalent substituent having one or more particle adsorption groups described above. As the particle adsorption groups, acid groups are preferable. The particle adsorption portion represented by $A^1$ may contain two or more particle adsorption groups. Examples of the aspect in which one $A^1$ contains two or more particle adsorption groups include an aspect two or more particle adsorption groups are bonded to each other through a chain-like saturated hydrocarbon group (may be linear or branched, preferably having 1 to 10 carbon atoms), a cyclic saturated hydrocarbon group (preferably having 3 to 10 carbon atoms), an aromatic group (preferably having 5 to 10 carbon atoms, for example, a phenylene group) or the like such that a monovalent substituent is formed, and the like. Among these, an aspect is preferable in which two or more particle adsorption groups are bonded to each other through a chain-like saturated hydrocarbon group such that a monovalent substituent is formed. In a case where a particle adsorption group constitutes the monovalent substituent, the particle adsorption group itself may be the monovalent substituent represented by $A^1$.

In Formula (100), $R^1$ represents an (m+n)-valent linking group. Examples of the (m+n)-valent linking group include a group formed of 1 to 100 carbon atoms, 0 to 10 nitrogen atoms, 0 to 50 oxygen atoms, 1 to 200 hydrogen atoms, and 0 to 20 sulfur atoms. The (m+n)-valent linking group is preferably a group represented by any of the following formulae.

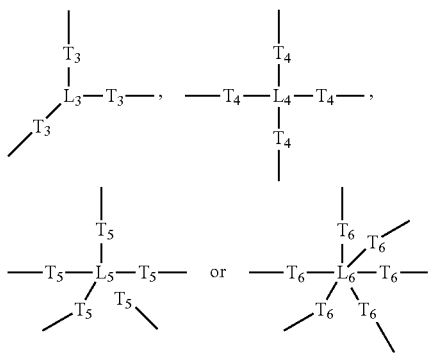

$L_3$ represents a trivalent group. $T_3$ represents a single bond or a divalent linking group, and three $T_3$'s may be the same as or different from each other.

$L_4$ represents a tetravalent group. $T_4$ represents a single bond or a divalent linking group, and four $T_4$'s may be the same as or different from each other.

$L_5$ represents a pentavalent group. $T_5$ represents a single bond or a divalent linking group, and five $T_5$'s may be the same as or different from each other.

$L_6$ represents a hexavalent group. $T_6$ represents a single bond or a divalent linking group, and six $T_6$'s may be the same as or different from each other.

Specifically, examples of the (m+n)-valent linking group include the following structural units and a group (may form a ring structure) constituted with a combination of two or more structural units shown below. For details of the (m+n)-valent linking group, paragraphs "0043" to "0055" in JP2014-177613A can be referred to, and the contents thereof are incorporated into the present specification.

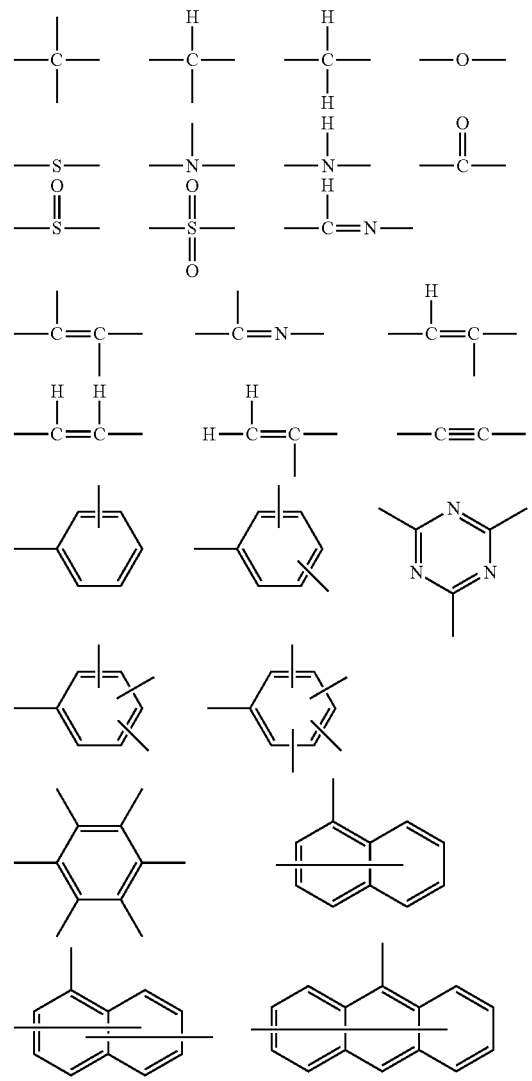

In Formula (100), $P^1$ represents a solvophilic portion including a moiety which is decomposed or denatured by an external stimulus. It is preferable that the solubility parameter of $P^1$ is close to the solubility parameter of the solvent contained in the dispersion liquid. The absolute value of a difference between the solubility parameter of $P^1$ and the solubility parameter of the solvent contained in the dispersion liquid is more preferably equal to or smaller than 2.5 MPa$^{0.5}$, even more preferably equal to or smaller than 1.5 MPa$^{0.5}$, and particularly preferably equal to or smaller than 1 MPa$^{0.5}$. Furthermore, the solubility parameter of $P^1$ is preferably 16 to 26 MPa$^{0.5}$, more preferably 17 to 25 MPa$^{0.5}$, and even more preferably 17 to 23 MPa$^{0.5}$. Examples of $P^1$ include the group represented by Formula (P-1) described above.

In Formula (100), $R^2$ and $R^3$ each independently represent a single bond or a divalent linking group. Examples of the divalent linking group include a group formed of 1 to 100 carbon atoms, 0 to 10 nitrogen atoms, 0 to 50 oxygen atoms, 1 to 200 hydrogen atoms, and 0 to 20 sulfur atoms. The aforementioned group may be unsubstituted or may further have a substituent. Specific examples of the divalent linking group include the following structural units and a group constituted with a combination of two or more structural units shown below. For details of the divalent linking group, paragraphs "0071" to "0075" in JP2007-277514A can be referred to, and the contents thereof are incorporated into the present specification.

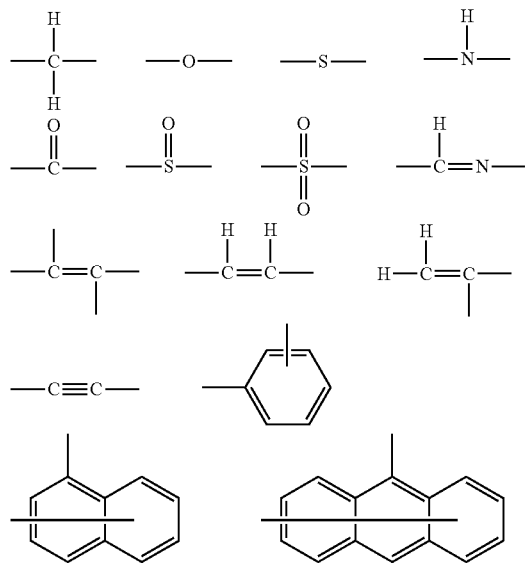

In Formula (100), m represents 1 to 20. m is preferably 1 to 18, more preferably 1 to 15, and particularly preferably 2 to 15.

In Formula (100), n represents 1 to 20. n is preferably 1 to 18, more preferably 1 to 15, and particularly preferably 2 to 15.

The weight-average molecular weight of the dendrimer is preferably 2,000 to 200,000, more preferably 2,000 to 100,000, and even more preferably 3,000 to 50,000. The number-average molecular weight (Mn) of the dendrimer is preferably 1,500 to 180,000, more preferably 1,500 to 90,000, and even more preferably 2,000 to 45,000. The acid value of the dendrimer is preferably 10 to 250 mgKOH/g, more preferably 20 to 230 mgKOH/g, and even more preferably 30 to 200 mgKOH/g.

Specific examples of the dendrimer include the following polymers. In the following structural formulae, the numerical value attached to the repeating unit in [ ]n represents the number of repeating units. The repeating unit in [ ]n is not limited to the aspect in which the repeating units are linked to each other in the order shown in the following structural formulae so as to form a block of each repeating unit. The repeating units may be randomly bonded to each other.

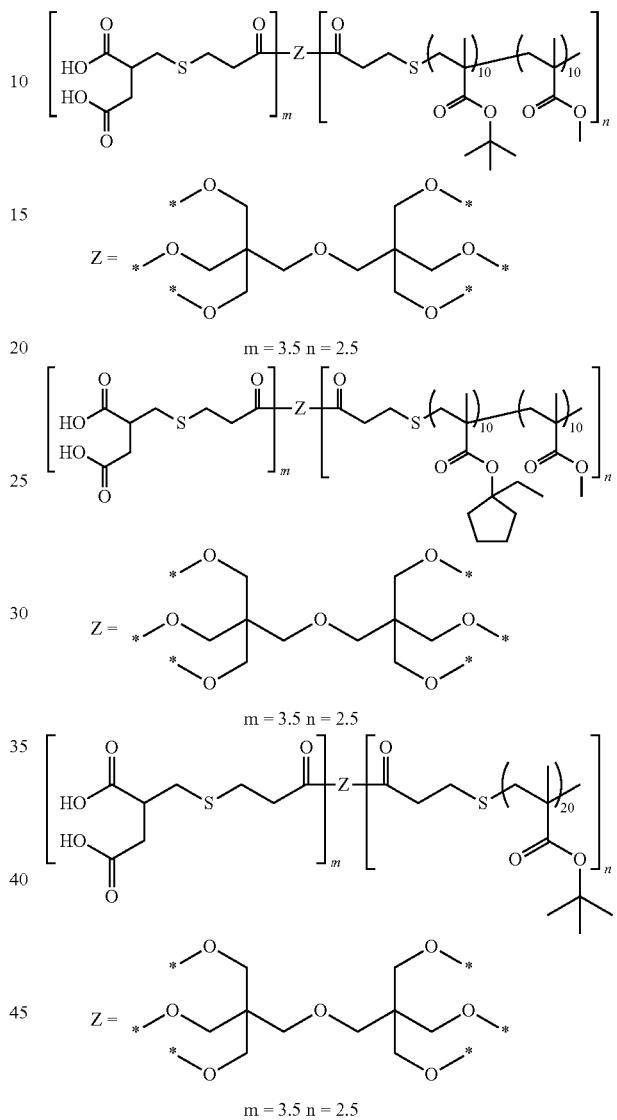

(Graft Polymer)

In the dispersant according to the embodiment of the present invention, the graft polymer is preferably a polymer having a graft chain in which the number of atoms except for hydrogen atoms is within a range of 40 to 10,000. In one graft chain, the number of atoms except for hydrogen atoms is more preferably 50 to 2,000, and even more preferably 60 to 500.

Examples of the main chain structure of the graft polymer include a (meth)acrylic main chain structure, a polyester-based main chain structure, a polyurethane-based main chain structure, a polyurea-based main chain structure, a polyamide-based main chain structure, a polyether-based main chain structure, and the like. Among these, a (meth)acrylic main chain structure is preferable.

The weight-average molecular weight (Mw) of the graft polymer is preferably 2,000 to 200,000, more preferably 3,000 to 100,000, and even more preferably 5,000 to 100,000. The number-average molecular weight (Mn) of the graft polymer is preferably 1,000 to 100,000, more preferably 1,500 to 50,000, and even more preferably 2,500 to 50,000. The acid value of the graft polymer is preferably 10 to 250 mgKOH/g, more preferably 20 to 230 mgKOH/g, and even more preferably 30 to 200 mgKOH/g.

Examples of the graft polymer include a polymer containing a repeating unit represented by Formula (110).

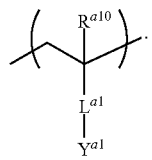
(110)

In Formula (110), $R^{a10}$ represents a hydrogen atom or an alkyl group, $L^{a1}$ represents a single bond or a divalent linking group, and $Y^{a1}$ represents a graft chain.

In Formula (110), $Ra^{10}$ is preferably a hydrogen atom or an alkyl group having 1 to 12 carbon atoms, and more preferably a hydrogen atom or a methyl group.

In Formula (110), $L^{a1}$ represents a single bond or a divalent linking group. Examples of the divalent linking group include an alkylene group (preferably an alkylene group having 1 to 10 carbon atoms), an alkenylene group (preferably an alkenylene group having 2 to 10 carbon atoms), —NH—, —SO—, —SO$_2$—, —CO—, —O—, —COO—, OCO—, —S—, and a group obtained by combining two or more of these.

In Formula (110), $Y^{a1}$ represents a graft chain. In the graft chain, the number of atoms except for hydrogen atoms is preferably 40 to 10,000, more preferably 50 to 2,000, and even more preferably 60 to 500. It is preferable that the graft chain is a solvophilic portion. Furthermore, it is preferable that the graft chain includes a moiety which is decomposed or denatured by an external stimulus. In addition, it is preferable that the solubility parameter of the graft chain is close to the solubility parameter of the solvent contained in the dispersion liquid. The absolute value of a difference between the solubility parameter of the graft chain and the solubility parameter of the solvent contained in the dispersion liquid is more preferably equal to or smaller than 2.5 MPa$^{0.5}$, even more preferably equal to or smaller than 1.5 MPa$^{0.5}$, and particularly preferably equal to or smaller than 1 MPa$^{0.5}$. The solubility parameter of the graft chain is preferably 16 to 26 MPa$^{0.5}$, more preferably 17 to 25 MPa$^{0.5}$, and even more preferably 17 to 23 MPa$^{0.5}$. $Y^{a1}$ is preferably a group (graft chain) represented by Formula (Y-1). In a case where q in Formula (Y-1) represents an integer equal to or greater than 1, the repeating unit having $R^{a13}$ on a side chain and the repeating unit having $R^{a14}$ on a side chain are not limited to an aspect in which the repeating units are linked to each other in the order shown in the following structural formula such that a block of the repeating unit having $R^{a13}$ on a side chain and a block of the repeating unit having $R^{a14}$ on a side chain are formed. The repeating unit having $R^{a13}$ on a side chain and the repeating unit having $R^{a14}$ on a side chain may be randomly bonded to each other. That is, the group represented by Formula (Y-1) may be a random copolymer or a block copolymer of the repeating unit having $R^{a13}$ on a side chain and the repeating unit having $R^{a14}$ on a side chain.

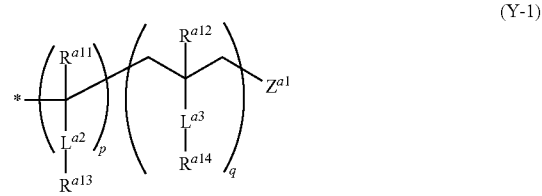
(Y-1)

In Formula (Y-1), * represents a bond, $R^{a11}$ and $R^{a12}$ each independently represent a hydrogen atom or an alkyl group, $L^{a2}$ and $L^{a3}$ each independently represent a single bond or a divalent linking group, $Z^{a1}$ represents a hydrogen atom or a substituent, $R^{a13}$ is a substituent including a moiety, which is decomposed or denatured by an external stimulus, or forms a substituent including a moiety which is decomposed or denatured by external stimulus in the form of "-$L^{a2}$-$R^{a13}$", $R^{a14}$ represents a hydrogen atom or a substituent, p represents an integer equal to or greater than 2, and q represents an integer equal to or greater than 0. In a case where p is equal to or greater than 2, a plurality of $R^{a11}$'s, $R^{a13}$'s, and $L^{a2}$'s may be the same as or different from each other. In a case where q is equal to or greater than 2, a plurality of $R^{a12}$'s, $R^{a14}$'s, and $k^{a3}$'s may be the same as or different from each other.

Each of $R^{a11}$ and $R^{a12}$ is preferably a hydrogen atom or an alkyl group having 1 to 12 carbon atoms, and more preferably a hydrogen atom or a methyl group.

$L^{a2}$ and $L^{a3}$ each independently represent a single bond or a divalent linking group. Examples of the divalent linking group include an alkylene group (preferably an alkylene group having 1 to 10 carbon atoms), an alkenylene group (preferably an alkenylene group having 2 to 10 carbon atoms), —NH—, —SO—, —SO$_2$—, —CO—, —O—, —COO—, OCO—, —S—, and a group obtained by combining two or more of these.

$R^{a13}$ is a substituent including a moiety, which is decomposed or denatured by an external stimulus, or forms a substituent including a moiety which is decomposed or denatured by an external stimulus in the form of "-$L^{a2}$-$R^{a13}$". Examples of the substituent including a moiety which is decomposed or denatured by an external stimulus include a substituent including a moiety which is decomposed or denatured by the action of heat, light, an acid, or an alkali described above.

$R^{a14}$ represents a hydrogen atom or a substituent. Examples of the substituent include an alkyl group, an aryl group, an alkoxy group, an acyl group, an acyloxy group, and the like.

$Z^{a1}$ represents a hydrogen atom or a substituent. Examples of the substituent include an alkyl group, an alkoxy group, and the like. $Z^{a1}$ is preferably a hydrogen atom. p represents an integer equal to or greater than 2. p is preferably 2 to 100, and more preferably 2 to 50. p/(p+q) preferably equals 0.1 to 1, more preferably equals 0.2 to 1, and even more preferably equals 0.3 to 1.

As the graft polymer, a polymer containing a repeating unit represented by Formula (111) is preferable, and a polymer containing a repeating unit represented by Formula (111) and a repeating unit represented by Formula (112) is more preferable. In a case where q in Formula (111) is an integer equal to or greater than 1, the repeating unit having $R^{a13}$ on a side chain and the repeating unit having $R^{a14}$ on a side chain are not limited to an aspect in which the repeating units are linked to each other in this order such that a block of the repeating unit having $R^{a13}$ on a side chain and a block of the repeating unit having $R^{a14}$ on a side chain are formed. The repeating unit having $R^{a13}$ on a side chain and the repeating unit having $R^{a14}$ on a side chain may be randomly bonded to each other.

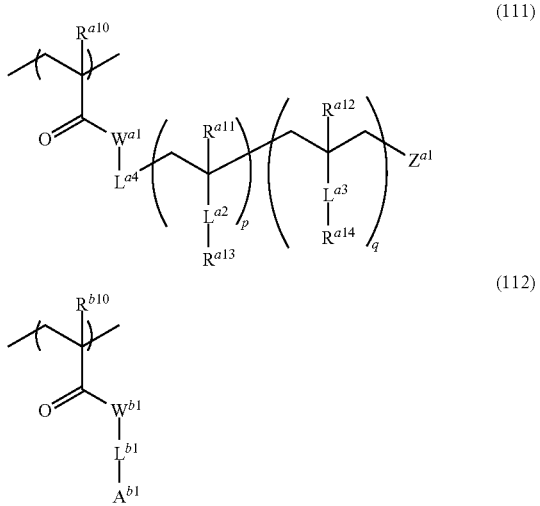

In Formula (111), $W^{a1}$ represents an oxygen atom or NH, $R^{a10}$ to $R^{a12}$ each independently represent a hydrogen atom or an alkyl group, $L^{a2}$ to $L^{a4}$ each independently represent a single bond or a divalent linking group, $Z^{a1}$ represents a hydrogen atom or a substituent, $R^{a13}$ represents a substituent including a moiety, which is decomposed or denatured by an external stimulus, or forms a substituent including a moiety which is decomposed or denatured by an external stimulus in the form of "-$L^{a2}$-$R^{a13}$", $R^{a14}$ represents a substituent, p represents an integer equal to or greater than 2, and q represents 0 or an integer equal to or greater than 1. In a case where p is equal to or greater than 2, a plurality of $R^{a11}$'s, $R^{a13}$'s, and $L^{a2}$'s may be the same as or different from each other. In a case where q is equal to or greater than 2, a plurality of $R^{a12}$'s, $R^{a14}$'s, and $L^{a3}$'s may be the same as or different from each other.

In Formula (112), $W^{b1}$ represents an oxygen atom or NH, $R^{b10}$ represents a hydrogen atom or an alkyl group, $L^{b1}$ represents a single bond or a divalent linking group, and $A^{b1}$ represents a particle adsorption group.

In Formula (111), $L^{a2}$, $L^{a3}$, $R^{a10}$ to $R^{a14}$, and $Z^{a1}$ have the same definition as the groups described in Formula (110) and Formula (Y-1), and the preferable range thereof is also the same.

In Formula (111), $W^{a1}$ is preferably an oxygen atom.

In Formula (111), $L^{a4}$ represents a single bond or a divalent linking group. Examples of the divalent linking group include the groups described above regarding $L^{32}$ and $L^{a3}$.

In Formula (112), $R^{b10}$ represents a hydrogen atom or an alkyl group. $R^{b10}$ is preferably a hydrogen atom or an alkyl group having 1 to 12 carbon atoms, and more preferably a hydrogen atom or a methyl group.

In Formula (112), $W^{b1}$ is preferably an oxygen atom.

In Formula (112), $L^{b1}$ represents a single bond or a divalent linking group. Examples of the divalent linking group include the groups described above regarding $L^{a2}$ and $L^{a3}$.

In Formula (112), $A^{b1}$ represents a particle adsorption group. Examples of the particle adsorption group include an acid group, a colorant structure, a heterocyclic group, and an acyclic heteroatom-containing group. $A^{b1}$ is preferably an acid group.

In the graft polymer, the content of the repeating unit represented by Formula (111) with respect to all the repeating units is preferably 3 to 95 mol %, and more preferably 5 to 90 mol %. Furthermore, the content of the repeating unit represented by Formula (112) with respect to all the repeating units is preferably 5 to 97 mol %, and more preferably 10 to 95 mol %. A molar ratio between the repeating unit represented by Formula (111) and the repeating unit represented by Formula (112) that is expressed as repeating unit represented by Formula (111): repeating unit represented by Formula (112) is preferably 3:97 to 95:5, and more preferably 5:95 to 90:10.

In the present invention, as the graft polymer, it is possible to use an oligoimine-based graft polymer containing a nitrogen atom on at least either a main chain or a side chain. Examples of the oligoimine-based graft polymer include a polymer having at least one kind of repeating unit having a basic nitrogen atom selected from a poly(lower alkylene imine)-based repeating unit, a polyallylamine-based repeating unit, a polydiallylamine-based repeating unit, a m-xylenediamine-epichlorohydrin polycondensate-based repeating unit, and a polyvinylamine-based repeating unit.

Examples of the oligoimine-based graft polymer include a polymer containing a repeating unit represented by Formula (I-1) and a repeating unit represented by Formula (I-2).

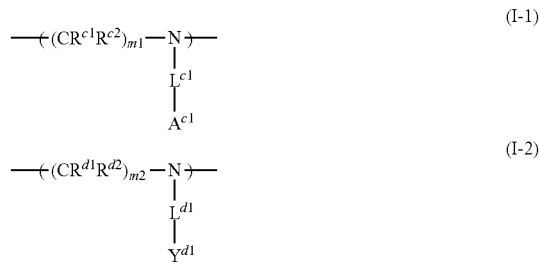

$R^{c1}$, $R^{c2}$, $R^{d1}$, and $R^{d2}$ each independently represent a hydrogen atom or an alkyl group, m1 and m2 each independently represent an integer of 1 to 5, $L^{c1}$ and $L^{d1}$ each independently represent a single bond or a divalent linking group, $A^{c1}$ represents a group containing a particle adsorption group, and $Y^{d1}$ represents a graft chain.

$R^{c1}$, $R^{c2}$, $R^{d1}$, and $R^{d2}$ preferably each independently represent a hydrogen atom or an alkyl group having 1 to 12 carbon atoms, and more preferably each independently represent a hydrogen atom or a methyl group.

$L^{c1}$ and $L^{d1}$ each independently represent a single bond or a divalent linking group. Examples of the divalent linking group include the groups described above regarding $L^{a2}$ and $L^{a3}$.

$A^{c1}$ represents a particle adsorption group. Examples of the particle adsorption group include an acid group, a colorant structure, a heterocyclic group, and an acyclic heteroatom-containing group. Among these, an acid group is preferable.

$Y^{d1}$ represents a graft chain. Examples of the graft chain include the graft chain described above regarding $Y^{a1}$ in Formula (110), and the preferable range thereof is also the same.

In the oligoimine-based graft polymer, the content of the repeating unit represented by Formula (I-1) with respect to all the repeating units is preferably 5 to 97 mol %, and more preferably 10 to 95 mol %. Furthermore, the content of the repeating unit represented by Formula (I-2) with respect to all the repeating units is preferably 3 to 95 mol %, and more preferably 5 to 90 mol %. A molar ratio between the repeating unit represented by Formula (1-1) and the repeating unit represented by Formula (1-2) that is expressed as repeating unit represented by Formula (I-1): repeating unit represented by Formula (I-2) is preferably 5:95 to 97:3, and more preferably 10:90 to 95:5.

It is preferable that the oligoimine-based graft polymer further contains a repeating unit represented by Formula (I-3). According to this aspect, the particle dispersion performance is further improved. The content of the repeating unit represented by Formula (I-3) with respect to all the repeating units is preferably 0.5 to 20 mol %, and more preferably 1 to 10 mol %.

as the range described above regarding Formula (I-1) and Formula (1-2), and the preferable range thereof is also the same. Examples of the anion group represented by $D^{e1}$ include $-SO_3^-$, $-COO^-$, $-PO_4^-$, $-PO_4H^-$, and the like.

Specific examples of the graft polymer include the following polymers. In the following structural formulae, the numerical value attached to a main chain of a repeating unit represents a molar ratio, and the numerical value attached to the side chain is the number of repeating units. Furthermore, the repeating units on side chains are not limited to an aspect in which the repeating units are linked to each other in the order shown in the following structural formulae such that a block of each repeating unit is formed. The repeating units may be randomly bonded to each other.

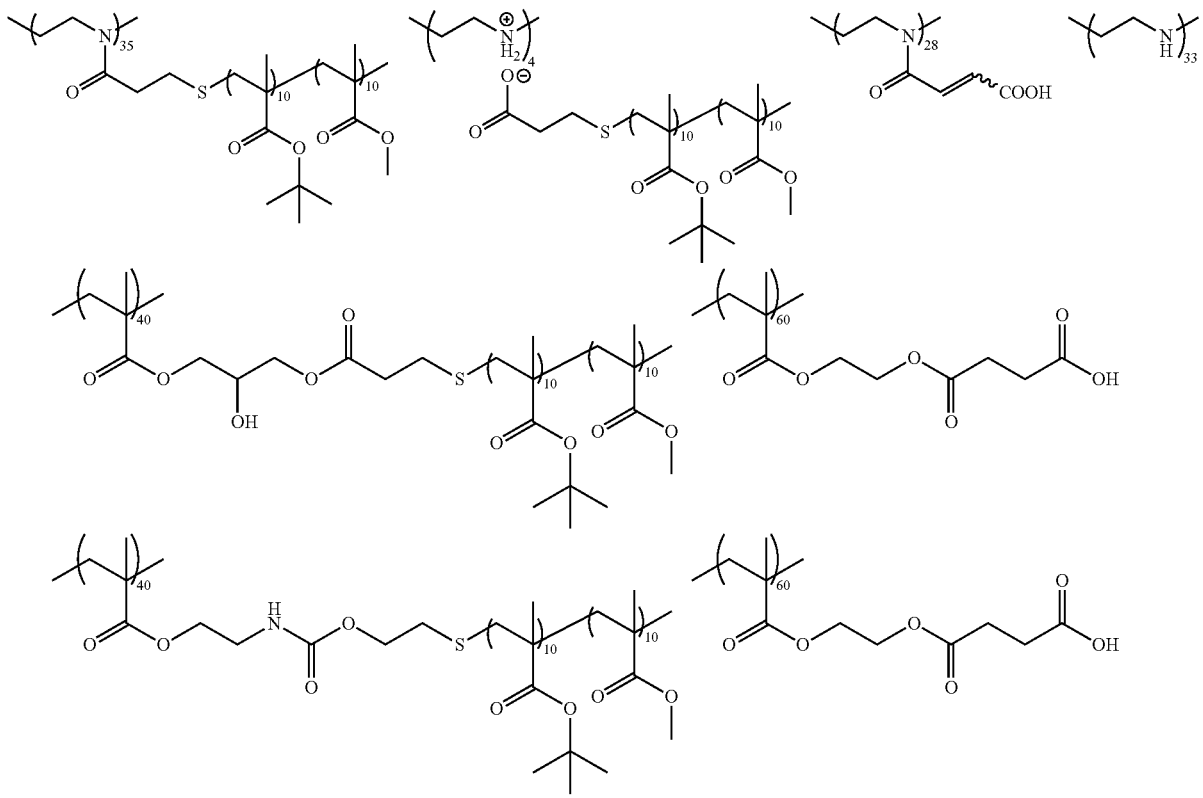

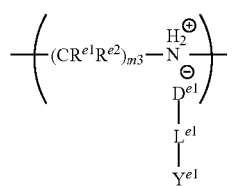
(I-3)

$R^{e1}$ and $R^{e2}$ each independently represent a hydrogen atom or an alkyl group, m3 represents an integer of 1 to 5, $D^{e1}$ represents an anion group, $L^{e1}$ represents a single bond or a divalent linking group, and $Y^{e1}$ represents a graft chain. The range of each of $R^{e1}$, $R^{e2}$, m3, $L^{e1}$, and $Y^{e1}$ is the same In the dispersion liquid according to the embodiment of the present invention, the content of the dispersant with respect to the total solid content in the dispersion liquid is preferably equal to or greater than 2% by mass, more preferably equal to or greater than 3% by mass, and even more preferably equal to or greater than 5% by mass. The upper limit of the content is not particularly limited, but is preferably equal to or smaller than 90% by mass, more preferably equal to or smaller than 70% by mass, and even more preferably equal to or smaller than 50% by mass, with respect to the total solid content in the dispersion liquid.

Furthermore, in the dispersion liquid according to the embodiment of the present invention, the content of the dispersant with respect to 100 parts by mass of the particles is preferably 1 to 100 parts by mass. The upper limit of the content is preferably equal to or smaller than 80 parts by mass, and more preferably equal to or smaller than 60 parts by mass. The lower limit of the content is preferably equal to or greater than 2.5 parts by mass, and more preferably equal to or greater than 5 parts by mass.

<<Dispersion Aid>>

The dispersion liquid according to the embodiment of the present invention can further contain a dispersion aid. Examples of the dispersion aid include a compound having an acid group and a crosslinking group. Examples of the acid group include a sulfo group, a phosphoric acid group, a phosphonic acid group, a carboxyl group, a phenolic hydroxyl group, and the like. Among these, a sulfo group, a phosphoric acid group, and a carboxyl group are preferable. The pH of the acid group is preferably −3 to 4. Examples of the crosslinking group include a group having an ethylenically unsaturated bond, an epoxy group, a mercapto group, and the like. Among these, a group having an ethylenically unsaturated bond is preferable. Examples of the group having an ethylenically unsaturated bond include a vinyl group, a (methallyl group, a (meth)acryloyl group, and a (methacryloyloxy group. As the dispersion aid, a compound represented by the following formula is preferable. In a case where the following compound is used, particle dispersibility, lithography characteristics, and precipitation characteristics are improved.

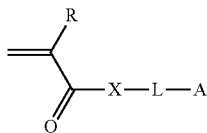

In the formula, R represents a hydrogen atom or an alkyl group, X represents —O—, —S—, or —NR$^1$—, A represents an acid group, and R$^1$ represents a hydrogen atom or a substituent.

Examples of commercial products of the dispersion aid include LIGHT ESTER P-1M, LIGHT ESTER P-2M, LIGHT ESTER HO-MS, LIGHT ESTER HO-HH (manufactured by KYOEISHA CHEMICAL Co., LTD), PHOSMER M, PHOSMER PE, PHOSMER MH, PHOSMER CL, and PHOSMER PP (manufactured by Uni-Chemical Co., Ltd.), TBAS-Q and TBAS-R (manufactured by MRC UNITEC Co., Ltd.), and the like.

In the dispersion liquid according to the embodiment of the present invention, from the viewpoint of the dispersion stability of particles, the content of the dispersion aid with respect to 100 parts by mass of the dispersant is preferably 1 to 100 parts by mass. The upper limit of the content is preferably equal to or smaller than 80 parts by mass, and more preferably equal to or smaller than 30 parts by mass. The lower limit of the content is preferably equal to or greater than 1 part by mass, and more preferably equal to or greater than 5 parts by mass.

<<Particles>>

The dispersion liquid according to the embodiment of the present invention contains particles. Examples of the particles include a pigment, a ceramic material, a magnetic material, other particles, and the like. Among these, a pigment is preferable. Examples of the pigment include a white pigment, a black pigment, and a chromatic pigment. Among these, a white pigment is preferable. In a case where a white pigment used as particles, a film having high whiteness can be manufactured. In the present invention, the white pigment includes not only a pure white pigment but also a pigment of bright gray (for example, grayish white, light gray, or the like) close to white, and the like.

In the dispersion liquid according to the embodiment of the present invention, the content of the particles with respect to the total solid content in the dispersion liquid is preferably equal to or greater than 10% by mass, more preferably equal to or greater than 30% by mass, and even more preferably equal to or greater than 50% by mass. The upper limit of the content is not particularly limited, but is preferably equal to or smaller than 98% by mass, more preferably equal to or smaller than 97% by mass, and even more preferably equal to or smaller than 95% by mass, with respect to the total solid content in the dispersion liquid.

In the dispersion liquid according to the embodiment of the present invention, the content of the white pigment with respect to the total solid content in the dispersion liquid is preferably equal to or greater than 10% by mass, more preferably equal to or greater than 30% by mass, and even more preferably equal to or greater than 50% by mass. The upper limit of the content is not particularly limited, but is preferably equal to or smaller than 98% by mass, more preferably equal to or smaller than 97% by mass, and even more preferably equal to or smaller than 95% by mass, with respect to the total solid content in the dispersion liquid.

In the dispersion liquid according to the embodiment of the present invention, the proportion of the white pigment in the total amount of the particles is preferably 30% to 100% by mass, more preferably 40% to 100% by mass, and even more preferably 50% to 100% by mass. Furthermore, it is preferable that the particles are substantially constituted only with the white pigment. "Particles are substantially constituted only with the white pigment" preferably means that the proportion of the white pigment in the total amount of the particles is equal to or higher than 99% by mass, more preferably means that the proportion is equal to or higher than 99.9% by mass, and even more preferably means that the particles are constituted only with the white pigment.

(White Pigment)

In the present invention, the white pigment is preferably particles having a refractive index equal to or higher than 2.10 for light having a wavelength of 589 nm. The refractive index is preferably 2.10 to 3.00, and more preferably 2.50 to 2.75. It is preferable that the refractive index of the particles is equal to or higher than 2.10 for light having a wavelength of 589 nm, because then L* in the CIE1976 L*a*b* color space can be increased in a case where a film having a thickness of 3.0 μm is formed.

The refractive index of particles can be measured as below. First, by using particles, a resin (dispersant) whose refractive index is known, and propylene glycol monomethyl ether acetate, a dispersion liquid is prepared. Then, the prepared dispersion liquid and the resin whose refractive index is known are mixed together, thereby preparing coating solutions in which the concentration of the particles in the total solid content in the coating solutions is 10% by mass, 20% by mass, 30% by mass, and 40% by mass. By using each of these coating solutions, a film having a thickness of 300 nm is formed on a silicon wafer, and then the refractive index of the obtained film is measured using ellipsometry (LAMBDA ACE RE-3300 (trade name), manufactured by DAINIPPON SCREEN MFC. CO., LTD.). Thereafter, the concentration of the particles and the refractive index are plotted on a graph so as to elicit the refractive index of the particles.

Furthermore, particles can be extracted from a dispersion liquid, a composition, or a film by the following method, and then the refractive index of the particles can be measured by the same method as described above. In a case where the refractive index of particles extracted from a film or a cured film is measured, the particles can be extracted from the film by, for example, a method of adding a 2 to 6 mol/L basic solution to a film (in a case where a dispersion liquid or a composition is used, the film is formed by coating) in an amount of 10% to 30% by mass with respect to the mass of the film, performing heating under reflux for 12 hours, and then performing filtering and rinsing so as to extract the particles.

The refractive index of particles can also be measured by the method described in "AIST bulletin of metrology Vol. 6, No. 1 (p. 11); Measurement Technologies for Refractive Index of Solid and Research on Establishment of Technological Standards".

The average primary particle diameter of the white pigment is preferably 50 to 300 nm, more preferably 60 to 200 nm from the viewpoint of concentration unevenness after the elapse of one month, and particularly preferably 70 to 150 nm from the viewpoint of L*. As a white pigment having an average primary particle diameter of 50 to 300 nm, spherical particles are preferable.

The higher the proportion of particles having an average primary particle diameter of 50 to 300 nm in the white pigment, the more preferable. Specifically, the proportion of particles having an average primary particle diameter of 50 to 300 nm contained in the white pigment is preferably equal to or greater than 30% by mass, and more preferably equal to or greater than 50% by mass. Provided that the proportion of the particles having an average primary particle diameter of 50 to 300 nm is equal to or greater than 30% by mass, L* in the CIE1976 L*a*b* color space can be easily controlled within a range of 35 to 85 in a case where a film having a thickness of 3.0 μm is formed, and a dispersion liquid or a composition having excellent temporal stability of solution is easily provided.

In the present invention, the primary particle diameter of particles can be determined by observing the particles by using a transmission electron microscope (TEM) and check the portions in which the particles are not aggregated. In the present invention, the particle size distribution of particles is determined by capturing a transmission electron micrograph of primary particles by using a transmission electron microscope and then measuring the particle size distribution with an image processing device by using the micrograph. In the present invention, a number-based arithmetic mean diameter calculated from the particle size distribution is adopted as the average primary particle diameter of particles. In the present specification, an electron microscope (H-7000) manufactured by Hitachi, Ltd. is used as a transmission electron microscope, and LUZEX AP manufactured by NIRECO. is used as an image processing device.

The white pigment may be particles having an average major axis length of 50 to 150 nm. It is preferable that the particles having an average major axis length of 50 to 150 nm are particles having a major axis and a minor axis. The average major axis length of the particles is preferably 60 to 140 nm, and more preferably 80 to 130 nm. Furthermore, the average short axis length of the particles is preferably 5 to 50 nm, more preferably 10 to 30 nm, and even more preferably 10 to 20 nm. In the particles, the average major axis length is preferably greater than the average short axis length by a factor of 2 to 10, more preferably greater than the average short axis length by a factor of 3 to 6, and even more preferably greater than the average short axis length by a factor of 4 to 5. In the present specification, the major axis of a particle refers to the longest diameter of the particle in a transmission electron micrograph obtained by imaging the particle. Furthermore, the minor axis of a particle refers to the shortest diameter of the particle in a transmission electron micrograph obtained by imaging the particle. A particle having a major axis and a minor axis is referred to as rod-like particle or elliptical particle in some cases.

In the present invention, a proportion of particles having a major axis length of 50 to 150 nm (preferably particles having a major axis length of 60 to 140 nm and more preferably particles having a major axis length of 80 to 130 nm) contained in the particles having an average major axis length of 50 to 150 nm is preferably 30% to 60% by mass, and more preferably 35% to 50% by mass. According to this aspect, L* in the CIE1976 L*a*b* color space is easily controlled within a range of 35 to 75 in a case where a film having a thickness of 3.0 μm is formed, and a dispersion liquid or a composition having excellent temporal stability of solution is easily provided.

In the present invention, the major axis and the minor axis of a particle can be determined by observing a powder particle by using a transmission electron microscope (TEM) and check the portions in which particles are not aggregated. In the present invention, the particle size distribution of particles is determined by capturing a transmission electron micrograph of powder particles, which are primary particles, by using a transmission electron microscope and then measuring the particle size distribution of the major axis length and the minor axis length of the particles with an image processing device by using the micrograph. In the present invention, the average major axis length and the average minor axis length of the particles are determined based on a number-based arithmetic mean diameter calculated from the particle size distribution.

The density of the white pigment is preferably 1.0 to 6.0 g/cm$^3$. The lower limit of the density is more preferably equal to or higher than 2.5 g/cm$^3$, and even more preferably equal to or higher than 3.0 g/cm$^3$. The upper limit of the density is more preferably equal to or lower than 4.5 g/cm$^3$. In a case where the density of the white pigment is lower than the upper limit of a preferable range, the particles are not easily precipitated in the dispersion liquid or the composition, and the concentration unevenness after the elapse of one month and the pattern shape can be more effectively improved. The proportion of the particles having density equal to or higher than 2.5 g/cm$^3$ (preferably equal to or higher than 3.0 g/cm$^3$) in the total amount of the particles is preferably equal to or higher than 5% by mass, and more preferably equal to or higher than 10% by mass. The upper limit of the proportion can be 100% by mass or equal to or lower than 99% by mass.

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, zinc sulfide, and the like. As the white pigment, particles having titanium atoms are preferable, and titanium oxide is more preferable.

The content (purity) of titanium dioxide ($TiO_2$) in titanium oxide is preferably equal to or greater than 70% by mass, more preferably equal to or greater than 80% by mass, and even more preferably equal to or greater than 85% by mass. The content of lower titanium oxide represented by $Ti_nO_{2n-1}$ (n represents an integer of 2 to 4), titanium oxynitride, and the like in titanium oxide is preferably equal to or smaller than 30% by mass, more preferably equal to or smaller than 20% by mass, and even more preferably equal to or smaller than 15% by mass.

Titanium oxide may be rutile type titanium oxide or anatase type titanium oxide. From the viewpoint of colorability and temporal stability of the dispersion liquid or the composition, rutile type titanium oxide is preferable. Particularly, the rutile type titanium oxide undergoes only a small change in a color difference even being heated and has excellent colorability. A rutilation rate of titanium oxide is preferably equal to or higher than 95%, and more preferably equal to or higher than 99%.

As the rutile type titanium oxide, known ones can be used. There are two types of manufacturing methods of the rutile type titanium oxide, which are a sulfuric acid method and a chlorine method. In the present invention, titanium oxide manufactured by any of these methods can be suitably used. The sulfuric acid method refers to a manufacturing method in which ilmenite ore or titanium slag is used as a raw material and dissolved in concentrated sulfuric acid so as to separate iron as iron sulfate, the separated solution is hydrolyzed so as to obtain a precipitate of hydroxide, and the precipitate is baked at a high temperature so as to extract rutile type titanium oxide. The chlorine method refers to a manufacturing method in which synthetic rutile or natural rutile is used as a raw material and reacted with chlorine gas and carbon at a high temperature of about 1,000° C. so as to synthesize titanium tetrachloride, the titanium tetrachloride is oxidized so as to extract rutile type titanium oxide. As the rutile type titanium oxide, rutile type titanium oxide obtained by the chlorine method is preferable.

The specific surface area of titanium oxide measured by a Brunauer, Emmett, Teller (BET) method is preferably 10 to 400 $m^2/g$, more preferably 10 to 200 $m^2/g$, even more preferably 10 to 150 $m^2/g$, particularly preferably 10 to 40 $m^2/g$, and most preferably 10 to 20 $m^2/g$.

The pH of titanium oxide is preferably 6 to 8.

The oil absorption amount of titanium oxide is preferably 10 to 60 (g/100 g), and more preferably 10 to 40 (g/100 g).

The total amount of $Fe_2O_3$, $Al_2O_3$, $SiO_2$, $Nb_2O_5$, and $Na_2O$ in titanium oxide is preferably equal to or smaller than 0.1% by mass, more preferably equal to or smaller than 0.05% by mass, and even more preferably equal to or smaller than 0.02% by mass. It is particularly preferable that titanium oxide substantially does not contain the above compounds.

The shape of titanium oxide is not particularly limited. For example, titanium oxide has an isotropic shape (for example, a spherical shape, a polyhedral shape, or the like), an anisotropic shape (for example, a needle shape, a rod shape, a plate shape, or the like), an amorphous shape, and the like. The hardness (Mohs' hardness) of titanium oxide is preferably 5 to 8, and more preferably 7 to 7.5. The true specific gravity (density) of titanium oxide is preferably 1.0 to 6.0 $g/cm^3$, and more preferably 3.9 to 4.5 $g/cm^3$. The bulk specific gravity of titanium oxide is preferably 0.1 $g/cm^3$ to 1.0 $g/cm^3$, and more preferably 0.2 $g/cm^3$ to 0.4 $g/cm^3$.

The white pigment such as titanium oxide may be a material having undergone a surface treatment using a surface treatment agent such as an organic compound. Examples of the surface treatment agent used for performing a surface treatment on the white pigment include a polyol, aluminum oxide, aluminum hydroxide, silica (silicon oxide), hydrous silica, alkanolamine, stearic acid, organosiloxane, zirconium oxide, hydrogen dimethicone, a silane coupling agent, a titanate coupling agent, and the like. Among these, a silane coupling agent is preferable. Furthermore, it is preferable that the white pigment such as titanium oxide is a material treated with a surface treatment agent of aluminum (Al), silicon (Si), and an organic substance. The surface treatment may be performed using one kind of surface treatment agent singly or using two or more kinds of surface treatment agents in combination. In addition, it is preferable that the surface of the white pigment such as titanium oxide is coated with an oxide such as aluminum oxide, silica, or zirconium oxide. In a case where the surface of the white pigment is coated with an oxide, light fastness and dispersibility are further improved.

It is also preferable that the white pigment such as titanium oxide is coated with a basic metal oxide or a basic metal hydroxide. Examples of the basic metal oxide or the basic metal hydroxide include metal compounds containing magnesium, zirconium, cerium, strontium, antimony, barium, calcium, and the like.

The white pigment coated with the basic metal oxide or the basic metal hydroxide can be obtained as below, for example.

A white pigment is dispersed in water or in a liquid containing water as a main component, thereby obtaining a slurry. If necessary, the white pigment is ground using a sand mill, a ball mill, or the like. Then, the pH of the slurry is made neutral or alkaline or made acidic in some cases. Thereafter, a water-soluble salt which is a raw material of a coating material is added to the slurry, and the surface of the white pigment is coated.

Subsequently, the slurry is neutralized, and the white pigment is collected. The collected white pigment may be dried or dry-milled.

The white pigment such as titanium oxide may be a material which is obtained by treating the surfaces of inorganic particles each having an acidic moiety with a compound which can react with the acidic moiety. Examples of the compound which can react with the acidic moiety include a polyhydric alcohol such as trimethylolpropane, trimethylolethane, ditrimethylolpropane, trimethylolpropane ethoxylate, or pentaerythritol, alkanolamine such as monoethanolamine, monopropanolamine, diethanolamine, dipropanolamine, triethanolamine, or dipropanolamine, chlorosilane, alkoxysilane, and the like. Examples of the method of treating the surfaces of inorganic particles each having an acidic moiety with a compound which can react with the acidic moiety include (1) method of putting the compound and the inorganic particles into a dry mill such as a fluid energy mill or an impact mill and grinding the inorganic particles, (2) method of stirring and mixing together the compound and the dry-milled inorganic particles by using a high-speed stirrer such as a Henschel mixer or a super mixer, (3) method of adding the aforementioned compound to the aqueous slurry of the inorganic particles and stirring the mixture, and the like.

As titanium oxide, the titanium oxide described in "Titanium Oxide, Physical Properties and Applied Technologies, Manabu Seino, pp. 13-45, Jun. 25, 1991, GIHODO SHUPPAN Co., Ltd." can also be suitably used.

As the white pigment, commercial products can also be preferably used. The commercial products may be used as they are or used after being subjected to a classification treatment. Examples of commercial products of titanium oxide include TIPAQUE (trade name) R-550, R-580, R-630, R-670, R-680, R-780, R-780-2, R-820, R-830, R-850, R-855, R-930, R-980, CR-50, CR-50-2, CR-57, CR-58, CR-58-2, CR-60, CR-60-2, CR-63, CR-67, CR-Super70, CR-80, CR-85, CR-90, CR-90-2, CR-93, CR-95, CR-953, CR-97, PF-736, PF-737, PF-742, PF-690, PF-691, PF-711, PF-739, PF-740, PC-3, S-305, CR-EL, PT-301, PT-401M, PT-401L, PT-501A, PT-501R, UT771, TTO-51C, TTO-80A, TTO-S-2, A-220, MPT-136, MPT-140, and MPT-141 manufactured by ISHIHARA SANGYO KAISHA, LTD.;

R-3L, R-5N, R-7E, R-11P, R-21, R-25, R-32, R-42, R-44, R-45M, R-62N, R-310, R-650, SR-1, D-918, GTR-100, FTR-700, TCR-52, A-110, A-190, SA-1, SA-1L, STR-100A-LP, STR-100C-LP, and TCA-123E (trade names) manufactured by SAKAI CHEMICAL INDUSTRY CO., LTD.;

JR, JRNC, JR-301, JR-403, JR-405, JR-600A, JR-600E, JR-603, JR-605, JR-701, JR-800, JR-805, JR-806, JR-1000, MT-01, MT-05, MT-10EX, MT-100S, MT-100TV, MT-100Z, MT-100AQ, MT-100WP, MT-100SA, MT-100HD, MT-150EX, MT-150W, MT-300HD, MT-500B, MT-500SA, MT-500HD, MT-600B, MT-600SA, MT-700B, MT-700BS, MT-700HD, and MT-700Z (trade names) manufactured by TAYCA CORPORATION;

KR-310, KR-380, KR-380N, and ST-485SA15 (trade names) manufactured by Titan Kogyo, Ltd.;

TR-600, TR-700, TR-750, TR-840, and TR-900 (trade names) manufactured by FUJI TITANIUM INDUSTRY CO., LTD.;

Brilliant 1500 (trade name) manufactured by SHIRAISHI CALCIUM KAISHA, LTD.; and the like.

Furthermore, the titanium oxide described in paragraphs "0025" to "0027" in JP2015-067794A can also be used.

Examples of commercial products of strontium titanate include SW-100 (manufactured by Titan Kogyo, Ltd.) and the like. Examples of commercial products of barium sulfate include BF-1L (manufactured by SAKAI CHEMICAL INDUSTRY CO., LTD.) and the like. Examples of commercial products of zinc oxide include Zincox Super F-1(manufactured by Hakusuitech Co., Ltd.) and the like. Examples of commercial products of zirconium oxide include Z-NX (manufactured by TAIYO KOKO CO., LTD.) and the like.

In the present invention, as the white pigment, not only particles formed of a single inorganic substance but also particles combined with other materials may also be used. For example, it is preferable to use particles having holes or other materials in the interior thereof, particles constituted with core particles to which a number of inorganic particles are attached, and core-shell composite particles constituted with core particles formed of polymer particles and shell layers formed of inorganic nanoparticles. Regarding the core-shell composite particles constituted with core particles formed of polymer particles and shell layers formed of inorganic nanoparticles, the description in paragraphs "0012" to "0042" in JP2015-047520A can be referred to, and the contents thereof are incorporated into the present specification.

In the present invention, as the white pigment, inorganic hollow particles can also be used. The inorganic hollow particles refer to inorganic particles of a structure having cavities in the interior thereof, in which each of the cavities is surrounded with an outer shell. As the inorganic hollow particles, it is possible to use the inorganic hollow particles described in JP2011-075786A, WO2013/061621A, JP2015-164881A, and the like, and the contents thereof are incorporated into the present specification.

The diameter of the hollow portion in the inorganic hollow particles is not particularly limited, but is preferably 5 to 900 nm, more preferably 20 to 800 nm, and particularly preferably 50 to 500 nm.

As the material of the outer shell of the inorganic hollow particles, that is, as the material surrounding the hollow portion of the inorganic hollow particles, various inorganic substances are used without particular limitation. Examples of the material include zinc sulfide, barium sulfate, lead carbonate, lead oxide, antimony oxide, potassium titanate, barium titanate, zinc oxide, zirconium oxide, cerium oxide, lanthanum oxide, titanium oxide, and the like. Among these, titanium oxide is preferable.

The average particle diameter (preferably the average secondary particle diameter) of the inorganic hollow particles is preferably 100 to 1,000 nm, more preferably 150 to 600 nm, and particularly preferably 200 to 500 nm.

The void volume of the inorganic hollow particles is preferably 5% to 90% by volume, more preferably 10% to 80% by volume, and particularly preferably 30 to 70% by volume. The void volume of the inorganic hollow particles is the total volume (%) of the hollow portions of the inorganic hollow particles that is obtained in a case where the total volume of the inorganic hollow particles is regarded as 100% by volume. The void volume of the inorganic hollow particles can be determined by means of calculation by using theoretical values of the refractive index of the inorganic hollow particles and the refractive index calculated from the material of the inorganic hollow particles. In addition, the void volume of the inorganic hollow particles can also be determined by, for example, cutting a layer (white layer) containing the inorganic hollow particles, observing the shape and size of a number of inorganic hollow particles shown in the cut surface and observing the shape and size of the hollow portions of the inorganic hollow particles, and calculating the total volume of the inorganic hollow particles and the total volume of the hollow portions of the inorganic hollow particles.

In a case where the white layer contains the inorganic hollow particles as a white pigment, the proportion of the inorganic hollow particles having an average particle diameter of 100 to 1,000 nm contained in the white layer is more preferably 35% to 50% by mass, with respect to the total solid content in the white layer. According to this aspect, a white layer having excellent whiteness is easily formed.

(Black Pigment)

In the present invention, a black pigment can also be used as particles. As the black pigment, known black pigments can be used without particular limitation. Examples thereof include carbon black, titanium black, graphite, and the like. Among these, carbon black and titanium black are preferable, and titanium black is more preferable. Titanium black is black particles containing titanium atoms, and preferably lower titanium oxide or titanium oxynitride. If necessary, for the purpose of improving dispersibility, suppressing aggregating properties, and the like, the surface of titanium black can be modified. For example, the surface of titanium black can be coated with silicon oxide, titanium oxide, germanium oxide, aluminum oxide, magnesium oxide, or zirconium oxide. Furthermore, the surface of titanium black can also be treated with a water-repellent substance described in JP2007-302836A. Specifically, examples of the black pigment include Color Index (C. I.) Pigment Black 1, 7, and the like.

It is preferable that both the primary particle diameter and the average primary particle diameter of each of the titanium black particles are small. Specifically, the average primary particle diameter is preferably within a range of 10 nm to 45 nm.

The specific surface area of titanium black is not particularly limited. However, the specific surface area measured by a Brunauer, Emmett, Teller (BET) method is preferably equal to or greater than 5 $m^2/g$ and equal to or smaller than 150 $m^2/g$, and more preferably equal to or greater than 20 $m^2/g$ and equal to or smaller than 120 $m^2/g$. Examples of commercial products of titanium black include TITANIUM BLACK 10S, 12S, 13R, 13M, 13M-C, 13R-N, and 13M-T (trade names: manufactured by Mitsubishi Materials Corporation), Tilack D (trade name: manufactured by AKO KASEI CO., LTD.), and the like.

Titanium black can also be used as a dispersion. Examples thereof include a dispersion containing titanium black particles and silica particles, in which a content ratio between Si atoms and Ti atoms in the dispersion is adjusted to be in a range of 0.20 to 0.50. Regarding this dispersion, the description in paragraphs "0020" to "0105" in JP2012-169556A can be referred to, and the contents thereof are incorporated into the present specification.

(Chromatic Pigment)

In the present invention, a chromatic pigment can also be used as particles. As the chromatic pigment, known chromatic pigments can be used without particular limitation.

Examples thereof include a yellow pigment, an orange pigment, a red pigment, a green pigment, a violet pigment, a blue pigment, and the like. Specific examples of these include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (yellow pigments), C. I. Pigment Orange 2, 5, 13, 16, 17:1, 31, 34, 36, 38, 43, 46, 48, 49, 51, 52, 55, 59, 60, 61, 62, 64, 71, 73, and the like (orange pigments), C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like (red pigments), C. I. Pigment Green 7, 10, 36, 37, 58, 59, and the like (green pigments), C. I. Pigment Violet 1, 19, 23, 27, 32, 37, 42, and the like (violet pigments), and C. I. Pigment Blue 1, 2, 15, 15:1, 15:2, 15:3, 15:4, 15:6, 16, 22, 60, 64, 66, 79, 80, and the like (blue pigments)

<<Solvent>>

The dispersion liquid according to the embodiment of the present invention contains a solvent. The solvent can be constituted with various organic solvents. Examples of the organic solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, butyl diglycol acetate, 3-methoxybutyl acetate, and the like. These organic solvents can be used singly or used by being mixed together.

In the present invention, the boiling point of the solvent is preferably equal to or higher than 140° C., more preferably equal to or higher than 200° C., and even more preferably equal to or higher than 250° C. The upper limit of the boiling point is preferably equal to or lower than 500° C., for example. In a case where the boiling point of the solvent is equal to or higher than 140° C., at the time of manufacturing a film by using the composition containing the dispersion liquid, it is possible to inhibit the dispersant from functioning by providing a stimulus to the composition layer, with which a support or the like is coated, in a state where an appropriate amount of solvent remains. In a case where the dispersant is inhibited from functioning in a state where an appropriate amount of solvent remains in the composition layer, particles easily move in the composition and are easily aggregated to an appropriate degree. Accordingly, it is easy to effectively manufacture a film having excellent color valency or the like.

In the present invention, as a solvent, it is preferable to use a solvent with a small metal content. The metal content in the solvent is preferably equal to or smaller than 10 mass parts per billion (ppb), for example. If necessary, a solvent with a metal content at a level of mass parts per trillion (ppt) may be used, and such a high-purity solvent is provided from Toyo Gosei Co., Ltd., for example (Chemical Daily, Nov. 13, 2015).

An impurity such as a metal can be removed from the solvent by, for example, distillation (molecular distillation, thin film distillation, or the like) or filtering using a filter. The pore size of the filter used in filtering is preferably equal to or smaller than 10 nm, more preferably equal to or smaller than 5 nm, and even more preferably equal to or smaller than 3 nm. As the filter, a filter made of polytetrafluoroethylene, polyethylene, or nylon is preferable.

The solvent may contain isomers (compounds which have the same number of atoms but have different structures). The solvent may contain only one kind of isomer or a plurality of kinds of isomers.

The content of the solvent preferably equals an amount by which the concentration of solid contents in the dispersion liquid becomes 3% to 40% by mass, and more preferably equals an amount by which the concentration of solid contents in the dispersion liquid becomes 5% to 30% by mass.

<<Pigment Derivative>>

The dispersion liquid according to the embodiment of the present invention may further contain a pigment derivative and the like. Examples of the pigment derivative include a compound having a structure established by substituting a portion of a chromophore with an acidic group, a basic group, or a methyl phthalimide group. Examples of the acid group include a sulfo group, a carboxyl group, a quaternary ammonium salt group, and the like.

Examples of the basic group include an amino group and the like. For details of the pigment derivative, the description in paragraphs "0162" to "0183" in JP2011-252065A can be referred to, and the contents thereof are incorporated into the present specification. The content of the pigment derivative with respect to the total mass of the particles is preferably 1% to 30% by mass, and more preferably 3% to 20% by mass. Only one kind of pigment derivative may be used, or two or more kinds of pigment derivatives may be used in combination.

<Composition>

Next, the composition according to the embodiment of the present invention will be described. The composition according to the embodiment of the present invention contains the aforementioned dispersion liquid according to the embodiment of the present invention and a binder.

In the composition according to the embodiment of the present invention, the content of particles with respect to the total solid content in the composition is preferably equal to or greater than 1% by mass, more preferably equal to or greater than 15% by mass, and particularly preferably equal to or greater than 30% by mass. The upper limit of the content is not particularly limited, but is more preferably equal to or smaller than 70% by mass, even more preferably equal to or smaller than 60% by mass, and most preferably equal to or smaller than 55% by mass, with respect to the total solid content in the composition.

In the composition according to the embodiment of the present invention, the content of the white pigment with respect to the total solid content in the composition is preferably equal to or greater than 1% by mass, more preferably equal to or greater than 15% by mass, and particularly preferably equal to or greater than 30% by mass. The upper limit of the content is not particularly limited, but is more preferably equal to or smaller than 70% by mass, even more preferably equal to or smaller than 60% by mass, and most preferably equal to or smaller than 55% by mass, with respect to the total solid content in the composition.

<Binder>

The composition according to the embodiment of the present invention contains a binder. In a case where the composition contains a binder, the film characteristics are improved. As the binder, any of known resins can be used. Examples of the resins include a (meth)acryl resin, a (meth)acrylamide resin, an epoxy resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, a styrene resin, a siloxane resin, and the like. Among these, one kind of resins may be used singly, or two or more kinds of resins may be used by being mixed together. As the cyclic olefin resin, from the viewpoint of improving heat resistance, a norbornene resin can be preferably used. Examples of commercial products of the norbornene resin include an ARTON series (for example, ARTON F4520) manufactured by JSR Corporation, and the like. As the epoxy resin, MARPROOF G-0150M, G-0105SA, G-0130SP, G-0250SP, G-1005S, G-1005SA, G-1010S, G-2050M, G-01100, and G-01758 (manufactured by NOT CORPORATION, epoxy group-containing polymers) can be used. The weight-average molecular weight (Mw) of the resin is preferably 1,000 to 200,000, and more preferably 2,000 to 100,000.

In the present invention, in a case where a white pigment is used as particles, it is preferable to use a resin having a refractive index equal to or lower than 1.5 for light having a wavelength of 589 nm as a binder. According to this aspect, it is easy to manufacture a film having excellent whiteness. Examples of such a resin include a fluorine-based resin, a polysiloxane-based resin, and the like. Among these, a polysiloxane-based resin (preferably containing polysiloxane as a main skeleton) is preferable. As the polysiloxane-based resin, it is possible to use a polysiloxane-based resin which is obtained by hydrolyzing and condensing a compound represented by Formula (1) alone or a polysiloxane-based resin which is obtained by hydrolyzing and condensing a compound represented by Formula (1) and another silane compound. For details of the polysiloxane-based resin, the description in paragraphs "0014" to "0035" in JP2014-066988A can be referred to, and the contents thereof are incorporated into the present specification. As the polysiloxane-based resin, from the viewpoint of improving solvent resistance, it is preferable to use a polysiloxane-based resin which is obtained by hydrolyzing and condensing a compound represented by Formula (1) and an alkoxysilane compound containing a compound represented by Formula (2). Furthermore, as the polysiloxane-based resin, from the viewpoint of increasing the acid value of the polysiloxane-based resin and improving the pattern shape, it is preferable to use a polysiloxane-based resin which is obtained by hydrolyzing and condensing a compound represented by Formula (1) and an alkoxysilane compound containing a compound represented by Formula (3). The polysiloxane-based resin obtained by hydrolyzing and condensing the alkoxysilane compound containing a compound represented by Formula (3) can also be used as an alkali-soluble resin. The content of the resin having a refractive index equal to or lower than 1.5 for light having a wavelength of 589 nm with respect to the total mass (including the dispersant) of the resin in the composition is preferably equal to or greater than 5% by mass, more preferably equal to or greater than 30% by mass, particularly preferably equal to or greater than 50% by mass, and more particularly preferably equal to or greater than 90% by mass.

$$R^1{}_2Si(OR^2)_2 \qquad \text{Formula (1)}$$

In Formula (1), $R^1$ each independently represents an alkyl group or a phenyl group, and $R^2$ each independently represents a hydrogen atom or an alkyl group.

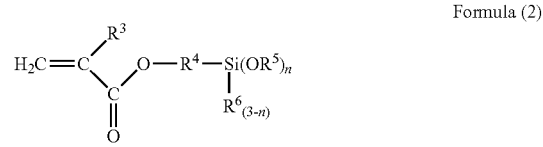

Formula (2)

In Formula (2), $R^3$ represents a methyl group or a hydrogen atom, $R^4$ represents an alkylene group having 1 to 4 carbon atoms, $R^5$ each independently represents a hydrogen atom or an alkyl group having 1 to 4 carbon atoms, $R^6$ each independently represents an alkyl group having 1 to 6 carbon atoms, and n represents an integer of 1 to 3.

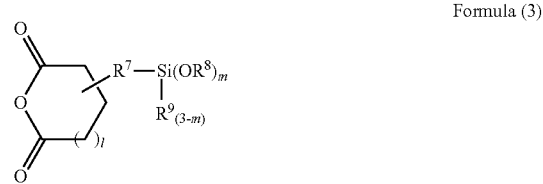

Formula (3)

In Formula (3), l represents an integer of 0 to 2, m represents an integer of 0 to 2, $R^7$ represents an alkylene group having 1 to 4 carbon atoms, $R^8$ each independently represents a hydrogen atom or an alkyl group having 1 to 4 carbon atoms, and $R^9$ each independently represents an alkyl group having 1 to 6 carbon atoms.

In the present invention, an alkali-soluble resin can also be used as a binder. In a case where the alkali-soluble resin is used, it is possible to obtain a composition which can be developed using an alkali. Examples of the alkali-soluble resin include resins having an acid group. Examples of the acid group include a carboxyl group, a phosphoric acid group, a sulfo group, a phenolic hydroxyl group, and the like. Among these, a carboxyl group is preferable. The resin may have only kind of these acid groups or two or more kinds of these acid groups.

The acid value of the alkali-soluble resin is preferably 30 to 500 mgKOH/g. The lower limit of the acid value is more preferably equal to or higher than 50 mgKOH/g, and even more preferably equal to or higher than 70 mgKOH/g. The upper limit of the acid value is more preferably equal to or lower than 400 mgKOH/g, even more preferably equal to or lower than 200 mgKOH/g, particularly preferably equal to or lower than 150 mgKOH/g, and most preferably equal to or lower than 120 mgKOH/g.

As the alkali-soluble resin, a polymer having a carboxyl group on a side chain is preferable. Specific examples thereof include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin, an acidic cellulose derivative having a carboxyl group on a side chain, and a resin obtained by adding an acid anhydride to a polymer having a hydroxyl group. Particularly, a copolymer of a (meth)acrylic acid and another monomer which can be copolymerized with the (meth)acrylic acid is suitable as the alkali-soluble resin. Examples of another monomer which can be copolymerized with the (methacrylic acid include alkyl (meth)acrylate, aryl (meth)acrylate, a vinyl compound, and the like. Examples of the alkyl (methacrylate and the aryl (meth)acrylate include methyl (meth)acrylate, ethyl (meth)acrylate, propyl (meth)acrylate, butyl (methacrylate, isobutyl (methacrylate, pentyl (methacrylate, hexyl (methacrylate, octyl (methacrylate, phenyl (methacrylate, benzyl (methacrylate, tolyl (methacrylate, naphthyl (methacrylate, cyclohexyl (methacrylate, and the like. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, a polymethyl methacrylate macromonomer, and the like. As another monomer, it is possible to use the N position-substituted maleimide monomer described in JP1998-300922A (JP-H10-300922A), such as N-phenylmaleimide or N-cyclohexylmaleimide. As another monomer described above which can be copolymerized with a (meth)acrylic acid, one kind of monomer or two or more kinds of monomers may be used.

As the alkali-soluble resin, a benzyl (meth)acrylate/(meth)acrylic acid copolymer, a benzyl (meth)acrylate/(meth)acrylic acid/2-hydroxyethyl (methacrylate copolymer, or a multicomponent copolymer formed of benzyl (meth)acrylate/(meth)acrylic acid/other monomers can be preferably used. Furthermore, a resin obtained by copolymerizing 2-hydroxyethyl (methacrylate, the copolymers described in JP1995-140654A (JP-H07-140654A) such as a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonoer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer, and the like can also be preferably used.

As the alkali-soluble resin, an alkali-soluble resin having a polymerizable group may also be used. According to this aspect, the solvent resistance of the obtained film tends to be improved. Examples of the polymerizable group include a (meth)allyl group, a (methacryloyl group, and the like. As the alkali-soluble resin having a polymerizable group, an alkali-soluble resin having a polymerizable group on a side chain or the like is useful. Examples of the alkali-soluble resin having a polymerizable group include a DIANAL NR series (manufactured by Mitsubishi Rayon Co., Ltd.), Photomer 6173 (COOH-containing polyurethane acrylic oligomer, manufactured by Diamond Shamrock Co., Ltd.), VISCOAT R-264 and KS RESIST 106 (manufactured by OSAKA ORGANIC CHEMICAL INDUSTRY LTD), a CYCLOMER P series (for example, ACA230AA) and a PLACCEL CF 200 series (manufactured by Daicel Corporation), Ebecryl 3800 (manufactured by Daical-Allnex Ltd.), ACRYCURE RD-F8 (manufactured by NIPPON SHOKUBAI CO., LTD.), and the like.

It is also preferable that the alkali-soluble resin contains a polymer obtained by polymerizing a monomer component containing a compound represented by Formula (ED1) and/or a compound represented by Formula (ED2) (hereinafter, these compounds will be referred to as "ether dimer" in some cases). For details of the polymer obtained by polymerizing the monomer component containing the ether dimer, paragraphs "0022" to "0031" in JP2015-034961A can be referred to, and the contents thereof are incorporated into the present specification.

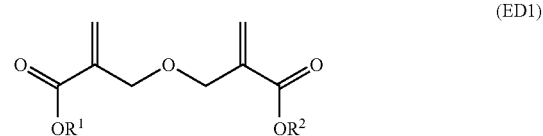

(ED1)

In Formula (ED1), $R^1$ and $R^2$ each independently represent a hydrogen atom or a hydrocarbon group having 1 to 25 carbon atoms that may have a substituent.

(ED2)

In Formula (ED2), R represents a hydrogen atom or an organic group having 1 to 30 carbon atoms. Regarding specific examples of Formula (ED2), the description in JP2010-168539A can be referred to.

Regarding specific examples of the ether dimer, for example, paragraph "0317" in JP2013-029760A can be referred to, and the contents thereof are incorporated into the present specification. One kind of ether dimer or two or more kinds of ether dimers may be used.

The alkali-soluble resin may contain a repeating unit derived from a compound represented by Formula (X).

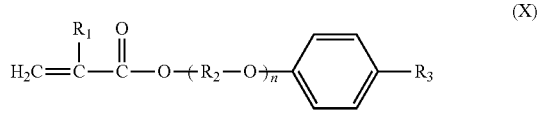

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms that may contain a benzene ring, n represents an integer of 1 to 15.

Regarding the alkali-soluble resin, the description in paragraphs "0558" to "0571" in JP2012-208494A (paragraphs "0685" to "0700" in US2012/0235099A corresponding to JP2012-208494A) and the description in paragraphs "0076" to "0099" in JP2012-198408A can be referred to, and the contents thereof are incorporated into the present specification.

Specific examples of the alkali-soluble resin include the following resins.

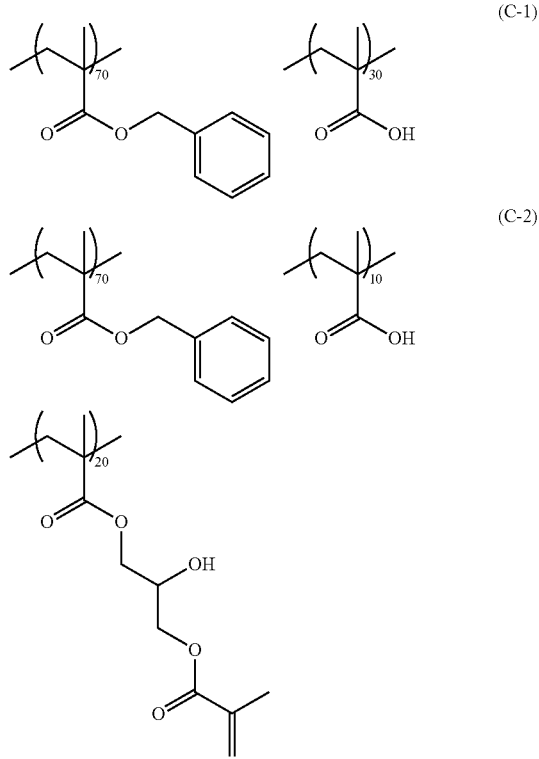

The content of the binder with respect to the total solid content in the composition is preferably 0.1% to 60% by mass. The lower limit of the content is preferably equal to or greater than 1% by mass, and more preferably equal to or greater than 5% by mass. The upper limit of the content is preferably equal to or smaller than 50% by mass, and more preferably equal to or smaller than 45% by mass. The composition according to the embodiment of the present invention may contain only one kind of binder or two or more kinds of binders. In a case where the composition contains two or more kinds of binders, the total amount thereof is preferably within the above range.

<<Solvent>>

The composition according to the embodiment of the present invention contains a solvent. Examples of the solvent include the solvents described above regarding the dispersion liquid. In the composition according to the embodiment of the present invention, the content of the solvent preferably equals an amount by which the concentration of solid contents in the composition becomes 25% to 70% by mass, and more preferably equals an amount by which the concentration of solid contents in the composition becomes 30% to 60% by mass.

<<Curable Compound>>

It is preferable that the composition according to the embodiment of the present invention contains a curable compound. As the curable compound, it is possible to use a compound which can undergo crosslinking (including polymerization and condensation) by a radical, an acid, and heat. Examples of the curable compound used in the present invention include a compound containing a group having an ethylenically unsaturated bond, a compound having an epoxy group, a compound having a methylol group, and the like. Among these, a compound containing a group having an ethylenically unsaturated bond is preferable.

Examples of the group having an ethylenically unsaturated bond include a vinyl group, a (meth)allyl group, a (meth)acryloyl group, and a (meth)acryloyloxy group. Among these, a (meth)acryloyl group and a (meth)acryloyloxy group are preferable. In the present invention, as the curable compound, a radically polymerizable compound is preferable. Examples of the radically polymerizable compound include a compound containing a group having an ethylenically unsaturated bond, and the like. Hereinafter, unless otherwise specified, a polymerizable compound refers to a radically polymerizable compound.

The content of the curable compound with respect to the total solid content in the composition is preferably 1% to 70% by mass. The lower limit of the content is preferably equal to or greater than 3% by mass, more preferably equal to or greater than 5% by mass, and particularly preferably equal to or greater than 9% by mass. The upper limit of the content is preferably equal to or smaller than 60% by mass, more preferably equal to or smaller than 50% by mass, and particularly preferably equal to or smaller than 30% by mass. From the viewpoint of pattern shape, heat resistance, and the like, it is preferable that the content of the curable compound is within the above range. In the composition, only one kind of curable compound or two or more kinds of curable compounds may be used. In a case where two or more kinds of curable compounds are used, the total amount thereof is preferably within the above range.

In a case where a polymerizable compound is used as the curable compound, the content of the polymerizable compound with respect to the total solid content in the composition is preferably 1% to 70% by mass. The lower limit of the content is preferably equal to or greater than 3% by mass, and more preferably equal to or greater than 5% by mass. The upper limit of the content is preferably equal to or smaller than 60% by mass, and more preferably equal to or smaller than 50% by mass. In the composition, only one kind of polymerizable compound or two or more kinds of polymerizable compounds may be used.

In a case where two or more kinds of polymerizable compounds are used, the total amount thereof is preferably within the above range. Furthermore, the content of the polymerizable compound with respect to the total mass of the curable compound is preferably 10% to 100% by mass, and more preferably 30% to 100% by mass.

(Polymerizable compound) As the polymerizable compound, a compound containing at least one group having an ethylenically unsaturated bond is preferable, and a compound containing at least one (preferably two or more) group terminated with an ethylenically unsaturated bond is more preferable. Furthermore, as the polymerizable compound, a compound containing 1 to 8 groups having an ethylenically unsaturated bond is preferable, a compound containing 2 to 6 groups having an ethylenically unsaturated bond is more preferable, and a compound containing 3 or 4 groups having an ethylenically unsaturated bond is even more preferable. As the group having an ethylenically unsaturated bond, a (meth)acryloyl group and a (meth)acryloyloxy group are preferable.

The polymerizable compound may be in the form of a monomer or a polymer, but is preferably in the form of a monomer. The monomer-type polymerizable compound preferably has a molecular weight of 100 to 3,000. The upper limit of the molecular weight is preferably equal to or smaller than 2,000, and more preferably equal to or smaller than 1,500. The lower limit of the molecular weight is preferably equal to or greater than 150, and more preferably equal to or greater than 250.

The polymerizable compound is preferably a (methacrylate compound having 1 to 8 functional groups, more preferably a (meth)acrylate compound having 2 to 6 functional groups, and even more preferably a (meth)acrylate compound having 3 or 4 functional groups. According to this aspect, the solvent resistance of the obtained film or the adhesiveness of the obtained film with respect to a substrate can be improved.

As the polymerizable compound, a compound is also preferable which contains at least one addition-polymerizable ethylene group, has a boiling point equal to or higher than 100° C. under normal pressure, and contains a group having an ethylenically unsaturated bond. Examples of such a compound include polyfunctional acrylate or methacrylate such as polyethylene glycol mono(meth)acrylate, polypropylene glycol mono(meth)acrylate, or phenoxyethyl (meth)acrylate; polyethylene glycol di(meth)acrylate, trimethylolethane tri(meth)acrylate, neopentyl glycol di(meth)acrylate, pentaerythritol tri(meth)acrylate, pentaerythritol tetramethacrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, and a mixture of these. Among these, pentaerythritol tetra(meth)acrylate is preferable.

As the polymerizable compound, polymerizable compounds represented by Formulae (MO-1) to (MO-5) can also be suitably used. In a case where T in the following formulae is an oxyalkylene group, the terminal on the carbon atom side is bonded to R.

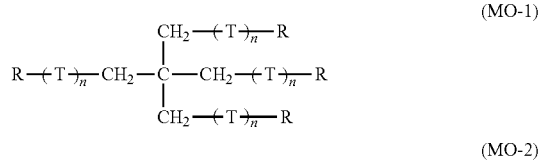

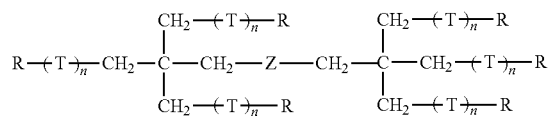

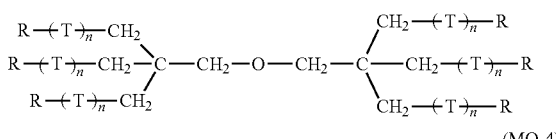

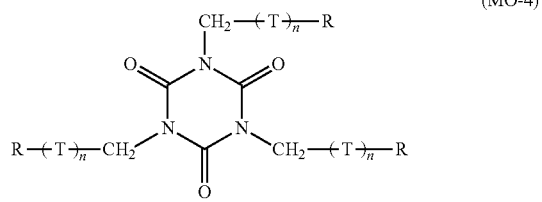

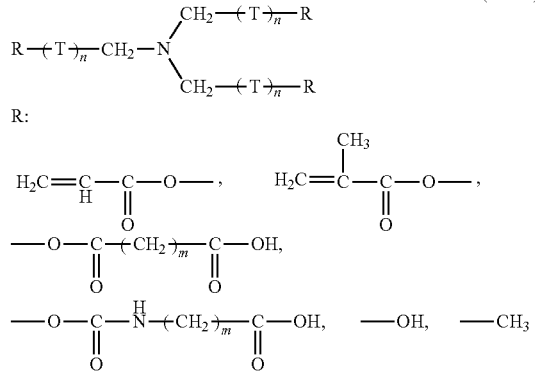

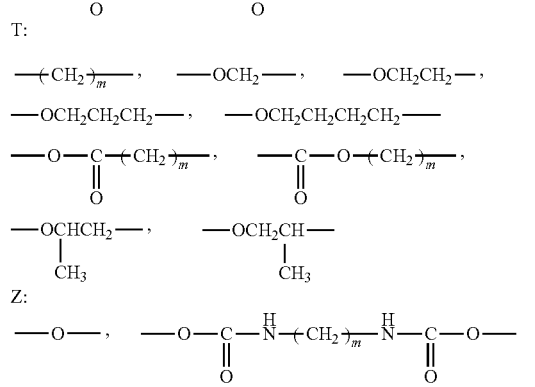

In the above formulae, n is 0 to 14, and m is 1 to 8. A plurality of R's and T's in the same molecule may be the same as or different from each other.

In each of the polymerizable compounds represented by Formulae (MO-1) to (MO-5), at least one the plurality of R's represents a group represented by —OC(=O)CH=CH$_2$ or —OC(=O)C(CH$_3$)=CH$_2$.

Specific examples of the polymerizable compounds represented by Formulae (MO-1) to (MO-5) include the compounds described in paragraphs "0248" to "0251" in JP2007-269779A.

Furthermore, the compound described in JP1998-062986A (JP-H10-062986A), which is obtained by adding ethylene oxide or propylene oxide to a polyfunctional alcohol and then (meth)acrylating the resultant, can also be used as the polymerizable compound.

As the polymerizable compound, pentaerythritol tetraacrylate (as a commercial product, NK ESTER A-TMMT; manufactured by SHIN-NAKAMURA CHEMICAL CO., LTD.), dipentaerythritol triacrylate (as a commercial product, KAYARAD D-330; manufactured by Nippon Kayaku Co., Ltd.), dipentaerythritol tetraacrylate (as a commercial product, KAYARAD D-320; manufactured by Nippon Kayaku Co., Ltd.), dipentaerythritol penta(meth)acrylate (as a commercial product, KAYARAD D-310; manufactured by Nippon Kayaku Co., Ltd.), and dipentaerythritol hexa(meth) acrylate (as a commercial product, KAYARAD DPHA; manufactured by Nippon Kayaku Co., Ltd.) are preferable. From the viewpoint of pattern shape, pentaerythritol tetraacrylate is more preferable.

The polymerizable compound may have an acid group such as a carboxy group, a sulfo group, or a phosphoric acid group. The polymerizable compound having an acid group is obtained by a method of (meth)acrylating some of hydroxy groups in a polyfunctional alcohol and causing an addition reaction between the remaining hydroxy groups and an acid anhydride such that hydroxy groups become carboxy groups, and the like. Examples of the polymerizable compound having an acid group include an ester of an aliphatic polyhydroxy compound and an unsaturated carboxylic acid, and the like. As the polymerizable compound having an acid group, a compound is preferable which is obtained by reacting a nonaromatic carboxylic acid anhydride with an unreacted hydroxy group in an aliphatic polyhydroxy compound such that the compound obtains an acid group. Particularly, the ester obtained as above is preferable in which the aliphatic polyhydroxy compound is at least either pentaerythritol or dipentaerythritol. Examples of commercial products thereof include polybasic acid-modified acryl oligomers manufactured by TOAGOSEI CO., LTD., such as M-305, M-510, and M-520 in an Aronix series. The acid value of the polymerizable compound having an acid group is preferably 0.1 to 200 mgKOH/g. The lower limit of the acid value is preferably equal to or higher than 5 mgKOH/g. The upper limit of the acid value is preferably equal to or lower than 100 mgKOH/g.

Regarding these polymerizable compounds, details of how to use the compounds, such as the structures thereof, whether the polymerizable compounds are used singly or used in combination, and the amount thereof to be added, can be arbitrarily set according to the performance of the composition designed to be finally obtained. For example, from the viewpoint of sensitivity, a structure in which one molecule contains a large amount of unsaturated groups is preferable. In many cases, a compound having 2 or more functional groups is preferable. Furthermore, from the viewpoint of increasing the hardness of the cured film, a compound having 3 or more functional groups is preferable. In addition, a method is also effective in which compounds different from each other in terms of at least either the number of functional groups or the type of polymerizable group are used in combination so as to control both the sensitivity and the hardness. Moreover, it is also preferable to use polymerizable compounds in combination which are compounds having 3 or more functional groups and having different ethylene oxide chain lengths. According to this aspect, the developability of the composition can be controlled, and an excellent pattern shape is obtained. At least either the type of the polymerizable compound to be selected or how to use the polymerizable compound acts as an important factor on at least either the compatibility of the polymerizable compound with other components (for example, a photopolymerization initiator, a resin, and the like) contained in the composition or the dispersibility. For example, in a case where a low-purity compound is used or two or more kinds of polymerizable compounds are used in combination, the compatibility and the like can be improved.

(Compound Having Epoxy Group)

In the composition according to the embodiment of the present invention, a compound having an epoxy group (referred to as epoxy compound as well) can also be used as a curable compound. According to this aspect, the solvent resistance of the obtained film can be improved. Examples of the epoxy compound include a monofunctional or polyfunctional glycidyl ether compound, a polyfunctional aliphatic glycidyl ether compound, and the like. Furthermore, a compound having an alicyclic epoxy group can also be used.

Examples of the epoxy compound include a compound having one or more epoxy groups in one molecule. The number of epoxy groups in one molecule of the epoxy compound is preferably 1 to 100. The upper limit of the number can be equal to or smaller than 10 or equal to or smaller than 5, for example. The lower limit of the number is preferably equal to or greater than 2.

The epoxy equivalent (=molecular weight of compound having epoxy group/number of epoxy groups) of the epoxy compound is preferably equal to or lower than 500 g/equivalent, more preferably 100 to 400 g/equivalent, and even more preferably 100 to 300 g/equivalent.

The epoxy compound may be a low-molecular weight compound (for example, a compound having a molecular weight less than 1,000) or a high-molecular weight compound (macromolecule) (for example, a compound having a molecular weight equal to or greater than 1,000; in the case of polymer, the weight-average molecular weight thereof is equal to or greater than 1,000). The weight-average molecular weight of the compound having an epoxy group is preferably 200 to 100,000, and more preferably 500 to 50,000. The upper limit of the weight-average molecular weight is preferably equal to or smaller than 10,000, more preferably equal to or smaller than 5,000, and even more preferably equal to or smaller than 3,000. From the viewpoint of solvent resistance, it is preferable that the epoxy compound is an aliphatic epoxy resin.

Examples of commercial products of the epoxy compound include EHPE 3150 (manufactured by Daicel Corporation), EPICLON N-695 (manufactured by DIC Corporation), and the like. Furthermore, as the epoxy compound, it is possible to use the compounds described in paragraphs "0034" to "0036" in JP2013-011869A, paragraphs "0147" to "0156" in JP2014-043556A, and paragraphs "0085" to "0092" in JP2014-089408A. The contents of these are incorporated into the present specification.

<<Polymerization Initiator>>

It is preferable that the composition according to the embodiment of the present invention contains a polymerization initiator. As the polymerization initiator, a photopolymerization initiator or a thermal polymerization initiator is preferable. Among these, a photopolymerization initiator is more preferable. As the thermal polymerization initiator, known compounds can be used without particular limitation. From the viewpoint of solvent resistance and colorability, the content of the polymerization initiator with respect to the total solid content in the composition is preferably 0.1% to 50% by mass, more preferably 0.5% to 30% by mass, and even more preferably 1% to 10% by mass. The composition may contain only one kind of polymerization initiator or two or more kinds of polymerization initiators. In a case where the composition contains two or more kinds of polymerization initiators, the total amount thereof is preferably within the above range.

(Photopolymerization Initiator)

The composition according to the embodiment of the present invention can contain a photopolymerization initiator. Particularly, in a case where the composition contains a polymerizable compound, it is preferable that the composition contains a photopolymerization initiator. The photopolymerization initiator is not particularly limited, and can be appropriately selected from known photopolymerization initiators. For example, a compound exhibiting photosensitivity with respect to light rays in the ultraviolet range to the visible range is preferable. As the photopolymerization initiator, a photo-radical polymerization initiator is preferable.

Examples of the photopolymerization initiator include a halogenated hydrocarbon derivative (for example, halogenated hydrocarbon derivatives having a triazine skeleton, an oxadiazole skeleton, and the like), an acyl phosphine compound such as acyl phosphine oxide, hexaarylbiimidazole, an oxime compound such as an oxime derivative, an organic peroxide, a thio compound, a ketone compound, an aromatic onium salt, a ketoxime ether, an aminoacetophenone compound, hydroxyacetophenone, and the like. Examples of the halogenated hydrocarbon compound having a triazine skeleton include the compound described in Wakabayashi et al., Bull. Chem. Soc. Japan, 42, 2924 (1969), the compound described in UK1388492B, the compound described in JP1978-133428A (JP-S53-133428A), the compound described in DE3337024B, the compound described in F. C. Schaefer et al., J. Org. Chem, 29.; 1527 (1964), the compound described in JP1987-058241A (JP-S62-058241A), the compound described in JP1993-281728A (JP-H05-281728A), the compound described in JP1993-034920A (JP-H05-034920A), the compound described in U.S. Pat. No. 4,212,976A, and the like.

From the viewpoint of exposure sensitivity, a compound selected from the group consisting of a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triaryl imidazole dimer, an onium compound, a benzothiazole compound, a benzophenone compound, an acetophenone compound and a derivative thereof, a cyclopentadiene-benzene-iron complex and a salt thereof, a halomethyl oxadiazole compound, and a 3-aryl-substituted coumarin compound is preferable.

As the photopolymerization initiator, a hydroxyacetophenone compound, an aminoacetophenone compound, and an acyl phosphine compound can also be suitably used.

More specifically, for example, it is possible to use the aminoacetophenone-based initiator described in JP1998-291969A (JP-H10-291969A) and the acyl phosphine-based initiator described in JP4225898B. As the hydroxyacetophenone-based initiator, it is possible to use IRGACURE 184, DAROCUR 1173, IRGACURE 500, IRGACURE 2959, and IRGACURE 127 (trade names, manufactured by BASF SE). As the aminoacetophenone-based initiator, it is possible to use commercial products such as IRGACURE 907, IRGACURE 369, IRGACURE 379, and IRGACURE 379EG (trade names: manufactured by BASF SE). As the aminoacetophenone-based initiator, the compounds described in JP2009-191179A can be used.

As the acyl phosphine-based initiator, commercial products such as IRGACURE 819 or IRGACURE TPO (trade names: manufactured by BASF SE) can be used.

From the viewpoint of colorability, an oxime compound, an aminoacetophenone-based initiator, or an acyl phosphine-based initiator is preferable.

As the photopolymerization initiator, KAYACURE DETX-S (manufactured by Nippon Kayaku Co., Ltd.) can also be used.

As the photopolymerization initiator, an oxime compound can also be preferably used. As the oxime compound, an oxime ester compound is more preferable. Specifically, as the oxime compound, for example, it is possible to use the compounds described in JP2001-233842A, the compounds described in JP2000-080068A, the compounds described in JP2006-342166A, and the compounds described in JP2016-021012A.

Examples of the oxime compound which can be suitably used in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one, and the like. Examples of the oxime compound also include the compounds described in J. C. S. Perkin II (1979, PP. 1653-1660), J. C. S. Perkin II (1979, pp. 156-162), Journal of Photopolymer Science and Technology (1995, pp. 202-232), JP2000-066385A, JP2000-080068A, JP2004-534797A, JP2006-342166A, and the like. Commercial products such as IRGACURE OXE01, IRGACURE OXE02, IRGACURE-OXE03, and IRGACURE-OXE04 (manufactured by BASF SE) are also suitably used. Furthermore, TR-PBG-304 (manufactured by TRONLY), ADEKA ARKLS NCI-930 (manufactured by ADEKA CORPORATION), and ADEKA OPTOMER N-1919 (manufactured by ADEKA CORPORATION, photopolymerization initiator 2 described in JP2012-014052A) can also be used.

As oxime compounds other than the above compounds, the compound described in JP2009-519904A in which oxime is linked to the N-position of a carbazole ring, the compound described in U.S. Pat. No. 7,626,957B in which a hetero substituent is introduced into a benzophenone moiety, the compound described in JP2010-015025A and US2009/292039A in which a nitro group is introduced into a colorant moiety, the ketoxime compound described in WO2009/131189A, the compound described in U.S. Pat. No. 7,556,910B that contains a triazine skeleton and an oxime skeleton in the same molecule, the compound described in JP2009-221114A that has maximum absorption wavelength at 405 nm and exhibits excellent sensitivity to a g-line light source, the compounds described in paragraphs "0076" to "0079" in JP2014-137466A, and the like may also be used.

Furthermore, as the oxime compound, a compound represented by Formula (OX-1) is preferable. The oxime compound may be an oxime compound in which the N-0 bond of oxime is an (E) isomer, an oxime compound in which the N-0 bond of oxime is a (Z) isomer, or a mixture of the (E) isomer and the (Z) isomer.

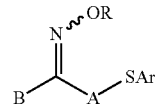

(OX-1)

In Formula (OX-1), R and B each independently represent a monovalent substituent, A represents a divalent organic group, and Ar represents an aryl group. For details of Formula (OX-1), the description in paragraphs "0276" to "0304" in JP2013-029760A can be referred to, and the contents thereof are incorporated into the present specification.

In the present invention, as a photopolymerization initiator, an oxime compound having a fluorene ring can also be used. Specific examples of the oxime compound having a fluorene ring include the compounds described in JP2014-137466A, and the contents thereof are incorporated into the present specification.

In the present invention, as a photopolymerization initiator, an oxime compound having a fluorine atom can also be used. Specific examples of the oxime compound having a fluorine atom include the compounds described in JP2010-262028A, the compounds 24 and 36 to 40 described in JP2014-500852A, the compound (C-3) described in JP2013-164471A, and the like, and the contents thereof are incorporated into the present specification.

In the present invention, as a photopolymerization initiator, an oxime compound having a nitro group can be used. It is also preferable that the oxime compound having a nitro group is a dimer. Specific examples of the oxime compound having a nitro group include the compounds described in paragraphs "0031" to "0047" in JP2013-114249A and paragraphs "0008" to "0012" and "0070" to "0079" in JP2014-137466A, the compounds described in paragraphs "0007" to "0025" in JP4223071B, and ADEKA ARKLS NCI-831 (manufactured by ADEKA CORPORATION).

As a photopolymerization initiator, an oxime compound having a benzofuran skeleton can also be used. Specific examples thereof include OE-01 to OE-75 described in WO2015/036910A.

Specific examples of the oxime compounds preferably used in the present invention will be shown below, but the present invention is not limited thereto.

(C-1)

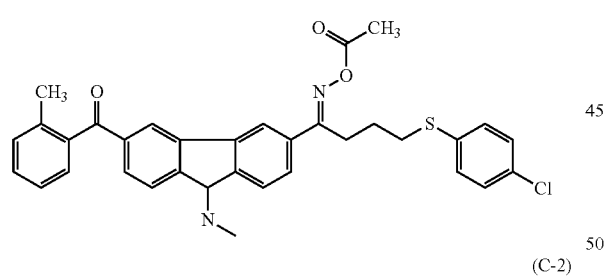

(C-2)

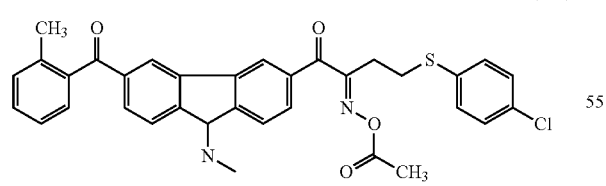

(C-3)

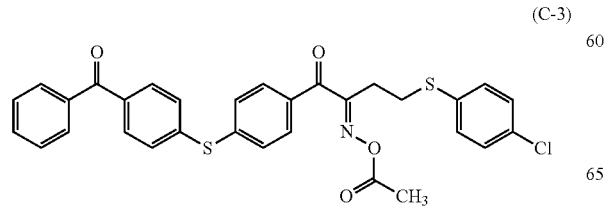

(C-4)

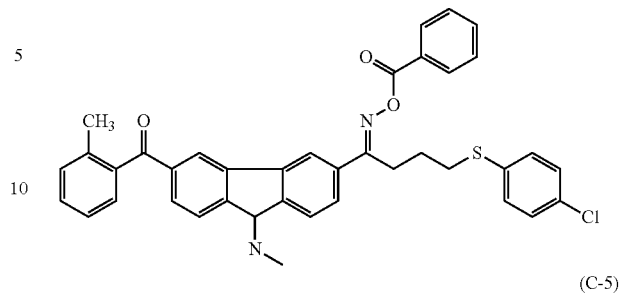

(C-5)

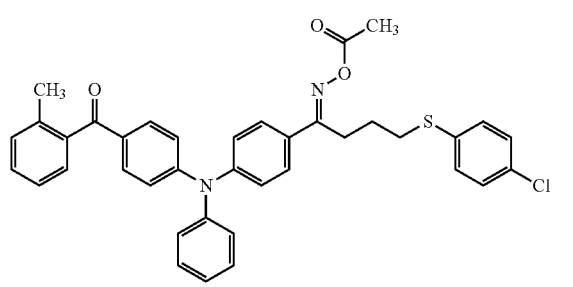

(C-6)

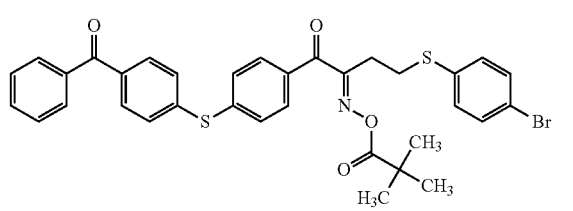

(C-7)

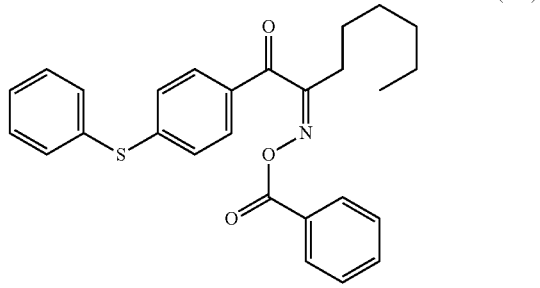

(C-8)

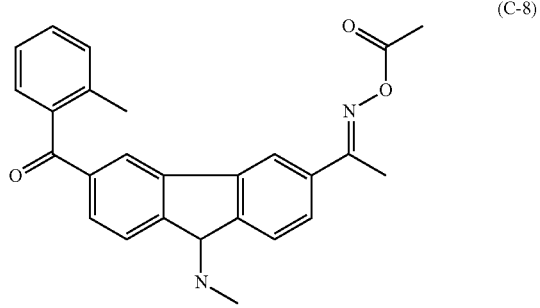

(C-9)

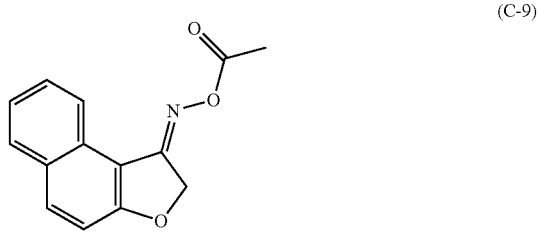

(C-10)
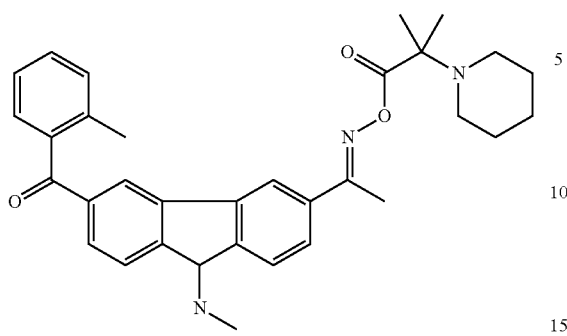

(C-11)
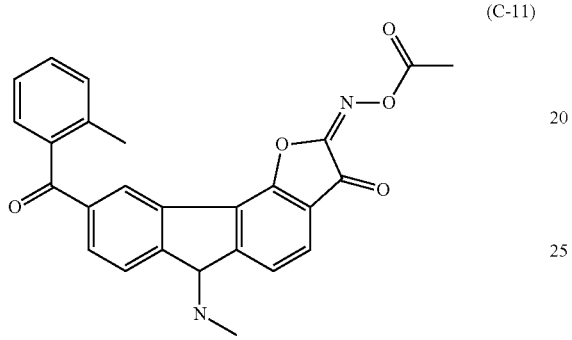

(C-12)
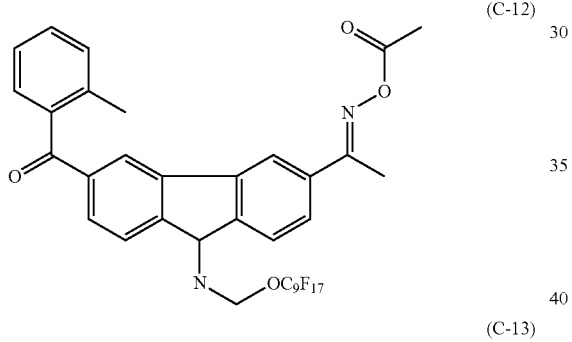

(C-13)
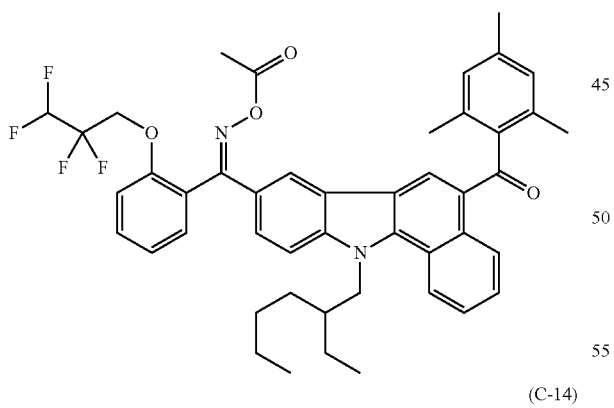

(C-14)
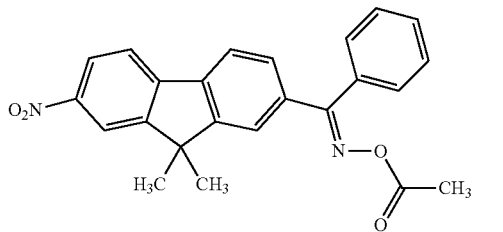

(C-15)
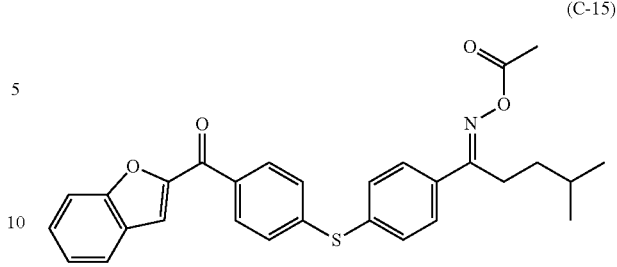

As the oxime compound, a compound having a maximum absorption wavelength in a wavelength range of 350 nm to 500 nm is preferable, a compound having a maximum absorption wavelength in a wavelength range of 360 nm to 480 nm is more preferable, and a compound having a high absorbance at 365 nm and 405 nm is particularly preferable.

From the viewpoint of sensitivity, a molar light absorption coefficient of the oxime compound at 365 nm or 405 nm is preferably 1,000 to 300,000, more preferably 2,000 to 300,000, and particularly preferably 5,000 to 200,000. The molar light absorption coefficient of a compound can be measured using a known method. For example, it is preferable to measure the molar light absorption coefficient by using an ultraviolet-visible spectrophotometer (manufactured by Varian, Inc., Cary-5 spectrophotometer) and ethyl acetate at a concentration of 0.01 g/L.

In the present invention, it is also preferable to use two or more kinds of photopolymerization initiators in combination. For example, it is preferable to use a photopolymerization initiator which has a light absorption coefficient equal to or higher than $1.0 \times 10^3$ mL/gcm at 365 nm in methanol and a photopolymerization initiator which has a light absorption coefficient equal to or lower than $1.0 \times 10^2$ mL/gcm at 365 nm and a light absorption coefficient equal to or higher than $1.0 \times 10^3$ mL/gcm at 254 nm in methanol in combination. Specifically, for example, an aminoacetophenone compound and an oxime compound are used in combination. According to this aspect, even under a low-temperature condition, a film having excellent curing properties can be manufactured. For example, in a pattern forming step, in a case where the composition is exposed in two stages such as exposure before a development step and exposure after a development step, it is possible to appropriately cure the composition by the first exposure and to cure substantially the entirety of the composition by the second exposure. Accordingly, even under a low-temperature condition, the curing properties of the composition can be improved.

<<Acid Generator and Base Generator>>

The composition according to the embodiment of the present invention can further contain an acid generator or a base generator. In a case where the composition according to the embodiment of the present invention contains these additives, by an acid or a base generated at the time of irradiating the composition with light or heating the composition, the solvophilic portion in the dispersant can be decomposed or denatured. Accordingly, at the time of manufacturing a film by using the composition, it is possible to effectively inhibit the dispersant from functioning. As a result, it is possible to more effectively aggregate the particles at the time of forming a film and to manufacture a film having a higher color valency.

(Acid Generator)

Examples of the acid generator include a compound generating an acid by being decomposed by light irradiation or heat. Examples of the photoacid generator include an onium salt compound such as a diazonium salt, a phosphonium salt, a sulfonium salt, or an iodonium salt, a sulfonate compound such as imide sulfonate, oxime sulfonate, diazodisulfone, disulfone, or o-nitrobenzylsulfonate, and the like. For details of the photoacid generator, the description in paragraphs "0139" to "0214" in JP2009-258603A, paragraphs "0108" to "0133" in JP2014-238438A, and paragraphs "0092" to "0098" in JP2016-154230A can be referred to, and the contents thereof are incorporated into the present specification.

Examples of the thermal acid generator include an organic halogen compound, a disulfonic acid compound, an oxime ester compound, a sulfonic acid ester compound, a phosphoric acid ester compound, a phosphonic acid ester compound, an onium salt compound such as sulfonium, iodonium, diazonium, pyridinium, or ammonium, and the like. For details of the thermal acid generator, paragraphs "0078" to "0096" in JP2016-047879A can be referred to, and the contents thereof are incorporated into the present specification.

Examples of commercial products of the acid generator include SAN-AID SI-60L (manufactured by SANSHIN CHEMICAL INDUSTRY CO., LTD.), CPI-200K (manufactured by San-Apro Ltd.), and the like.

The content of the acid generator with respect to the total solid content in the composition is preferably 0.1% to 20% by mass, more preferably 0.3% to 15% by mass, and even more preferably 0.5% to 10% by mass. The composition according to the embodiment of the present invention may contain only one kind of acid generator or two or more kinds of acid generators. In a case where the composition contains two or more kinds of acid generators, the total amount thereof is preferably within the above range.

(Base Generator)

Examples of the base generator include a compound generating a base by being decomposed by light irradiation or heat. Examples of the compound generating a base by heat (thermal base generator) include an acid salt of a base. Examples of the compound generating a base by light irradiation (photobase generator) include a quaternary ammonium salt and the like. For details of the base generator, paragraphs "0054" to "0071" in JP2008-081720A and paragraphs "0207" to "0236" in JP2015-087612A can be referred to, and the contents thereof are incorporated into the present specification.

The content of the base generator with respect to the total solid content in the composition is preferably 0.1% to 20% by mass, more preferably 0.3% to 15% by mass, and even more preferably 0.5% to 10% by mass. The composition according to the embodiment of the present invention may contain only one kind of base generator or two or more kinds of base generators. In a case where the composition contains two or more kinds of base generators, the total amount thereof is preferably within the above range.

<<Anti-Coloring Agent>>

It is preferable that the composition according to the embodiment of the present invention contains an anti-coloring agent. The anti-coloring agent described in the present specification can also be used as a polymerization inhibitor. Examples of the anti-coloring agent include a phenol compound, a phosphorus acid ester compound, a thioether compound, and the like. Among these, a phenol compound having a molecular weight equal to or greater than 500, a phosphorus acid ester compound having a molecular weight equal to or greater than 500, or a thioether compound having a molecular weight equal to or greater than 500 is more preferable. As the anti-coloring agent, a phenol compound is preferable, and a phenol compound having a molecular weight equal to or greater than 500 is more preferable.

As the phenol compound, any phenol compound known as a phenol-based anti-coloring agent can be used. Examples of preferable phenol compounds include a hindered phenol compound. Particularly, a compound having a substituent in a moiety (ortho-position) adjacent to a phenolic hydroxyl group is preferable. As the substituent, a substituted or unsubstituted alkyl group having 1 to 22 carbon atoms is preferable, and a methyl group, an ethyl group, a propionyl group, an isopropionyl group, a butyl group, an isobutyl group, a t-butyl group, a pentyl group, an isopentyl group, a t-pentyl group, a hexyl group, an octyl group, an isooctyl group, and a 2-ethylhexyl group are more preferable. Furthermore, a compound having a phenol group and a phosphorus acid ester group in the same molecule is also preferable.

As phenol-based hydroxyl group-containing compounds, particularly, polysubstituted phenol-based compounds are suitably used.

The polysubstituted phenol-based compounds are classified into three types different from each other in terms of the substitution position and the structure (a hindered type represented by Formula (A), a semi-hindered type represented by Formula (B), and a less-hindered type represented by Formula (C)), according to the reactivity with a peroxy radical to be trapped that results from the generation of a stable phenoxy radical.

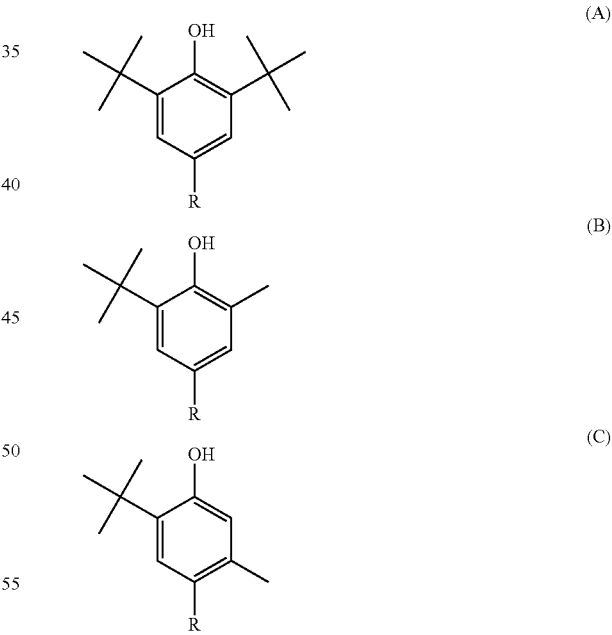

In Formulae (A) to (C), R represents a hydrogen atom or a substituent. As R, a hydrogen atom, a halogen atom, an amino group which may have a substituent, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, and an arylsulfonyl group which may have a substituent are preferable, and an amino group which may have a substituent, an alkyl group which may have a substituent, an aryl group which may have a substituent, an alkoxy group which may have a substituent, an aryloxy group which may have a substituent, an alkylamino group which may have a substituent, and an arylamino group which may have a substituent are more preferable.

A composite anti-coloring agent having a plurality of structures, which are represented by Formulae (A) to (C) and perform an anti-coloring function, in the same molecule is a more preferable aspect. Specifically, a compound having 2 to 4 structures, which are represented by Formulae (A) to (C) and perform an anti-coloring function, in the same molecule is preferable. Among these, from the viewpoint of colorability, the semi-hindered type represented by Formula (B) is preferable.

Examples of the phenol-based hydroxyl group-containing compound include a compound selected from the group consisting of p-methoxyphenol, di-t-butyl-p-cresol, pyrogallol, t-butyl catechol, 4,4'-thiobis(3-methyl-6-t-butylphenol), 2,2'-methylenebis(4-methyl-6-t-butylphenol), phenol resins, and cresol resins, and the like.

Typical examples of (A) available as commercial products include Sumilizer BHT (manufactured by Sumitomo Chemical Co., Ltd.), Irganox 1010 and 1222 (manufactured by BASF SE), ADEKA STAB AO-20, AO-50, and AO-60 (manufactured by ADEKA CORPORATION), and the like. Typical examples of (B) include Sumilizer BBM-S (manufactured by Sumitomo Chemical Co., Ltd.), Irganox 245 (manufactured by BASF SE), ADEKA STAB AO-80 (manufactured by ADEKA CORPORATION), and the like. Typical examples of (C) include ADEKA STAB AO-30 and AO-40 (manufactured by ADEKA CORPORATION), and the like.

Examples of the phosphorus acid ester compound include at least one kind of compound selected from the group consisting of tris[2-[[2,4,8,10-tetrakis(1, 1-dimethylethyl)dibenzo[d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl phosphite bis (2,4-di-tert-butyl-6-methylphenyl).

Typical examples of the phosphorus acid ester compound available as commercial products include ADEKA STAB PEP-36A (manufactured by ADEKA CORPORATION).

As the thioether compound, for example, dialkyl thiodipropionates such as dilauryl thiodipropionate, dimyristyl thiodipropionate, or distearyl thiodipropionate and pentaerythritol tetra(β-alkylthiopropionic acid)esters; pentaerythritol tetrakis(3-laurylthiopropionate), dilauryl-3,3'-thiodipropionate, dimyristyl-3,3'-thiodipropionate, distearyl-3,3'-thiodipropionate, and the like; tetrakis[methylene-3-(laurylthio)propionate]methane, bis(methyl-4-[3-n-alkyl(C12/C14)thiopropionyloxy]5-t-butylphenyl)sulfide, ditridecyl-3,3'-thiodipropionate, lauryl/stearyl thiodipropionate, 4,4'-thiobis(6-t-butyl-m-cresol), 2,2'-thiobis(6-t-butyl-p-cresol), and distearyl-disulfide are preferable.

Typical examples of the thioether compound available as commercial products include ADEKA STAB AO-412S (CAS: 29598-76-3, manufactured by ADEKA CORPORATION), ADEKA STAB AO-503 (CAS: 10595-72-9, manufactured by ADEKA CORPORATION), and KEMINOX PLS (CAS: 29598-76-3, manufactured by CHEMIPRO KASEI).

Examples of commercial products of the anti-coloring agent include, in addition to the above typical examples, ADEKA STAB AO-50F, ADEKA STAB AO-60G, and ADEKA STAB AO-330 (manufactured by ADEKA CORPORATION), and the like.

Furthermore, as the anti-coloring agent, it is possible to use N-oxide compounds such as 5,5-dimethyl-1-pyrrloline N-oxide, 4-methylmorpholine N-oxide, pyridine N-oxide, 4-nitropyridine N-oxide, 3-hydroxypyridine N-oxide, picolinic acid N-oxide, nicotinic acid N-oxide, and isonicotinic acid N-oxide; piperidine 1-oxyl free radical compounds such as a piperidine 1-oxyl free radical, a 2,2,6,6-tetramethylpiperidine 1-oxyl free radical, a 4-oxo-2,2,6,6-tetramethylpiperidine 1-oxyl free radical, a 4-hydroxy-2,2,6,6-tetramethylpiperidine 1-oxyl free radical, a 4-acetamido-2,2,6,6-tetramethylpiperidine 1-oxyl free radical, a 4-maleimido-2, 2,6,6-tetramethylpiperidine 1-oxyl free radical, and a 4-phosphonoxy-2,2,6,6-tetramethylpiperidine 1-oxyl free radical; pyrrolidine 1-oxyl free radical compounds such as a 3-carboxyproxyl free radical and a 3-carboxy-2,2,5,5-tetramethylpyrrolidine 1-oxyl free radical; N-nitrosophenyl hydroxyamines such as a N-nitrosophenylhydroxyamine cerium (I) salt and a N-nitrosophenylhydroxyamine aluminum salt; diazonium compounds such as bisulfate of 4-diazophenyldimethylamine, tetrafluoroborate of 4-diazodiphenylamine, and hexafluorophosphate of 3-methoxy-4-diazodiphenylamine; a cation colorant; nitro group-containing compounds; and transition metal compounds such as $FeCl_3$ and $CuCl_2$. Specific examples of these include the compounds described in paragraphs "0211" to "0223" in JP2015-034961A, and the contents thereof are incorporated into the present specification.

The content of the anti-coloring agent with respect to the total solid content in the composition is preferably 0.01% to 20% by mass from the viewpoint of colorability and solvent resistance, more preferably 0.1% to 15% by mass, and particularly preferably 0.3% to 5% by mass. The composition may contain only one kind of anti-coloring agent or two or more kinds of anti-coloring agents. In a case where the composition contains two or more kinds of anti-coloring agents, the total amount thereof is preferably within the above range.

<<Ultraviolet Absorber>>

The composition according to the embodiment of the present invention may contain an ultraviolet absorber. As the ultraviolet absorber, a conjugated diene-based compound is preferable, and a compound represented by Formula (I) is more preferable.

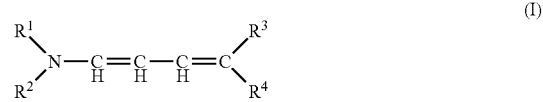

In Formula (I), $R^1$ and $R^2$ each independently represent a hydrogen atom, an alkyl group having 1 to 20 carbon atoms, or an aryl group having 6 to 20 carbon atoms. $R^1$ and $R^2$ may be the same as or different from each other, but do not simultaneously represent a hydrogen atom.

For explaining the substituent in Formula (I), the description in paragraphs "0024" to "0033" in WO2009/123109 (paragraphs "0040" to "0059" in US2011/0039195A corresponding to WO2009/123109) can be referred to, and the contents thereof are incorporated into the present specification. Regarding specific preferable examples of the compound represented by Formula (I), the description of the example compounds (1) to (14) in paragraphs "0034" to "0037" in WO2009/123109 (paragraph "0060" in US2011/0039195A corresponding to WO2009/123109) can be referred to, and the contents thereof are incorporated into the present specification. Specific examples of the ultraviolet absorber represented by Formula (I) include the following compound.

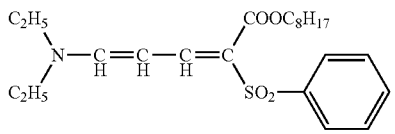

The content of the ultraviolet absorber with respect to the total solid content in the composition is preferably 0.1% to 10% by mass from the viewpoint of pattern shape and solvent resistance, more preferably 0.1% to 7% by mass, even more preferably 0.1% to 5% by mass, and particularly preferably 0.1% to 3% by mass. In the present invention, the composition may contain only one kind of ultraviolet absorber or two or more kinds of ultraviolet absorbers. In a case where the composition contains two or more kinds of ultraviolet absorbers, the total amount thereof is preferably within the above range.

<<Adhesion Agent>>

It is preferable that the composition according to the embodiment of the present invention further contains an adhesion agent. As the adhesion agent, known adhesion agents can be used without particular limitation. Examples of the adhesion agent include a silane coupling agent. According to this aspect, the adhesiveness of the film with respect to a substrate can be improved.

In the present invention, a silane coupling agent means a silane compound having a hydrolyzable group and another functional group. Furthermore, the hydrolyzable group refers to a substituent which is directly bonded to a silicon atom and can generate a siloxane bond by at least either a hydrolysis reaction or a condensation reaction. Examples of the hydrolyzable group include a halogen atom, an alkoxy group, an acyloxy group, and the like. Among these, an alkoxy group is preferable. That is, as the silane coupling agent, a compound having an alkoxysilyl group is preferable. In addition, it is preferable that the functional group other than the hydrolyzable group has a group which exhibits affinity to a resin by interacting or forming a bond with the resin. Examples of the functional group include a (meth)acryloyl group, a phenyl group, a mercapto group, an epoxy group, and an oxetanyl group. Among these, a (meth)acryloyl group and an epoxy group are preferable. That is, as the silane coupling agent, a compound is preferable which has an alkoxysilyl group and at least either a (meth)acryloyl group or an epoxy group. The number of carbon atoms in the alkoxy group in the alkoxysilyl group is preferably 1 to 5, more preferably 1 to 3, and particularly preferably 1 or 2. The silane coupling agent preferably has two or more alkoxysilyl groups in the same molecule, and more preferably has two or three alkoxysilyl groups in the same molecule. As the silane coupling agent, a silane compound is preferable which contains a silicon atom, a nitrogen atom, and a polymerizable group in a molecule.

Specific examples of the silane coupling agent include 3-methacryloxypropyltrimethoxysilane, 3-methacryloxypropyltriethoxysilane, 3-acryloxypropyltrimethoxysilane, 3-acryloxypropyltriethoxysilane, 3-mercaptopropyltrimethoxysilane, 3-aminopropyltriethoxysilane, phenyltrimethoxysilane, methyltrimethoxysilane, dimethyldimethoxysilane, methyltriethoxysilane, dimethyldiethoxysilane, phenyltriethoxysilane, n-propyltrimethoxysilane, n-propyltriethoxysilane, hexyltrimethoxysilane, hexyltriethoxysilane, octyltriethoxysilane, decyltrimethoxysilane, 1,6-bis(trimethoxysilyl)hexane, trifluoropropyltrimethoxysilane, hexamethyldisilazane, vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropylmethyldiethoxysilane, N-2-(aminomethylethyl)-3-aminopropylmethyldimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-triethoxysilyl-N-(1,3-dimethyl-butylidene)propylamine, N-phenyl-3-aminopropyltrimethoxysilane, hydrochloride of N-(vinylbenzyl)-2-aminoethyl-3-aminopropyltrimethoxysilane, tris-(trimethoxysilylpropyl)isocyanurate, 3-ureidopropyltriethoxysilane, 3-mercaptopropylmethyldimethoxysilane, bis(triethoxysilylpropyl)tetrasulfide, 3-isocyanatopropyltriethoxysilane, and the like. In addition to these, alkoxy oligomers can also be used. Furthermore, the following compounds can also be used. In the following structural formulae, Me represents a methyl group, and Et represents an ethyl group.

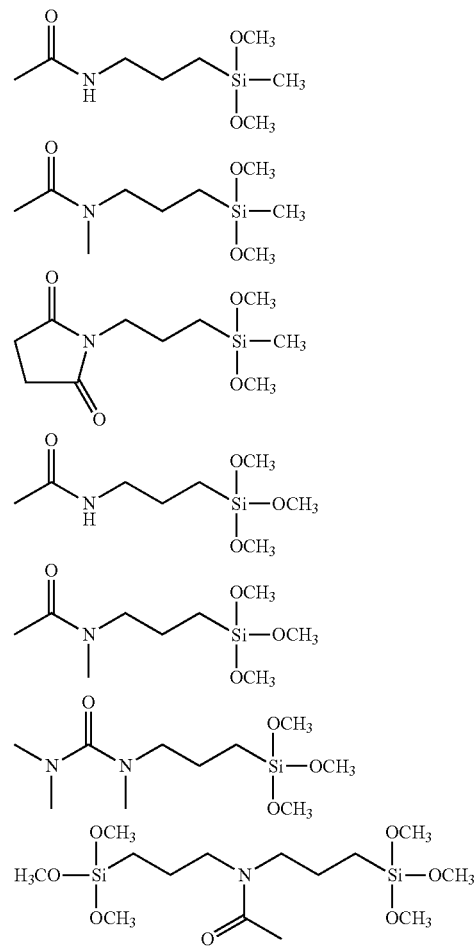

-continued

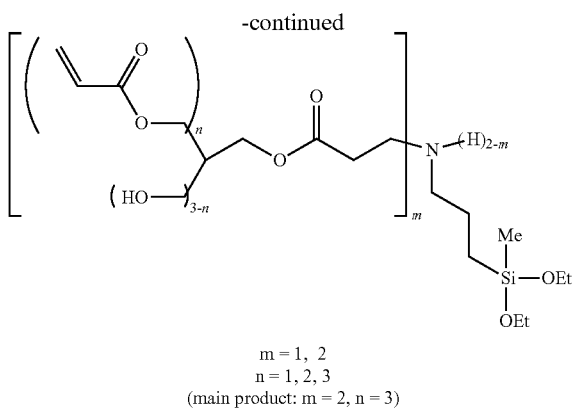

m = 1, 2
n = 1, 2, 3
(main product: m = 2, n = 3)

Examples of commercial products of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-89S, KR-500, KR-516, KR-517, X-40-9296, X-40-9225, X-40-9246, X-40-9250, KR-401N, X-40-9227, X-40-9247, KR-510, KR-9218, KR-213, X-40-2308, and X-40-9238 manufactured by Shin-Etsu Silicones, and the like. Furthermore, examples of the silane coupling agent include the compounds described in paragraphs "0018" to "0036" in JP2009-288703A and the compounds described in paragraphs "0056" to "0066" in JP2009-242604A, and the contents thereof incorporated into the present specification.

As the compound having an alkoxysilyl group, a polymer having an alkoxysilyl group on a side chain can also be used. As the silane coupling agent, specific silane compounds described in paragraphs "0011" to "0037" in JP2009-288703A can be referred to and used, and the contents thereof are incorporated into the present specification.

The content of the adhesion agent with respect to the total solid content in the composition is preferably 0.01% to 10% by mass, more preferably 0.1% to 7% by mass, and particularly preferably 1% to 5% by mass. From the viewpoint of adhesiveness and concentration unevenness after the elapse of one month, it is preferable that the content is within the above range. The composition according to the embodiment of the present invention may contain only one kind of adhesion agent or two or more kinds of adhesion agents. In a case where the composition contains two or more kinds of adhesion agents, the total amount thereof is preferably within the above range.

<<Chain Transfer Agent>>

It is preferable that the composition according to the embodiment of the present invention contains a chain transfer agent. According to this aspect, curing of the film surface can be accelerated by exposure at the time of forming a pattern. As a result, it is possible to inhibit the reduction in the film thickness at the time of exposure, and it is easy to form a pattern having better rectangularity and adhesiveness.

Examples of the chain transfer agent include a N,N-dialkylaminobenzoic acid alkyl ester, a thiol compound, and the like. Among these, a thiol compound is preferable. As the thiol compound, a compound having two or more mercapto groups (preferably 2 to 8 mercapto groups and more preferably 3 to 6 mercapto groups) in a molecule is preferable. Specific examples of the thiol compound include a thiol compound having a heterocyclic ring such as 2-mercaptobenzothiazole, 2-mercaptobenzoxazole, 2-mercaptobenzimidazole, N-phenylmercaptobenzimidazole, or 1,3,5-tris(3-mercaptobutyloxyethyl)-1,3,5-triazine-2,4,6(1H,3H,5H)-trione, an aliphatic thiol compound such as pentaerythritol tetrakis(3-mercaptobutyrate) or 1,4-bis(3-mercaptobutyryloxy)butane, and the like. Examples of commercial products of the chain transfer agent include PEMP (manufactured by SC Organic Chemical Co., Ltd., thiol compound), SANSERA M (manufactured by SANSHIN CHEMICAL INDUSTRY CO., LTD., thiol compound), KARENZ MT BD1 (manufactured by SHOWA DENKO K.K., thiol compound), and the like. Furthermore, the following compounds are also preferably used.

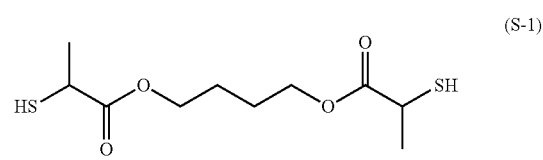
(S-1)

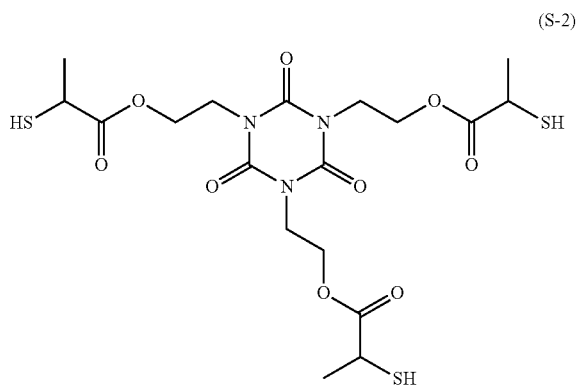
(S-2)

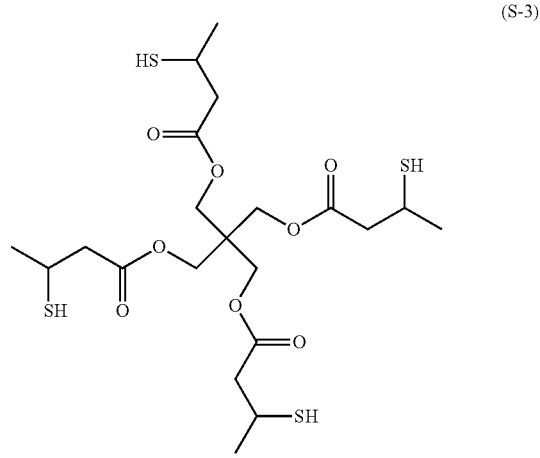
(S-3)

(S-4)

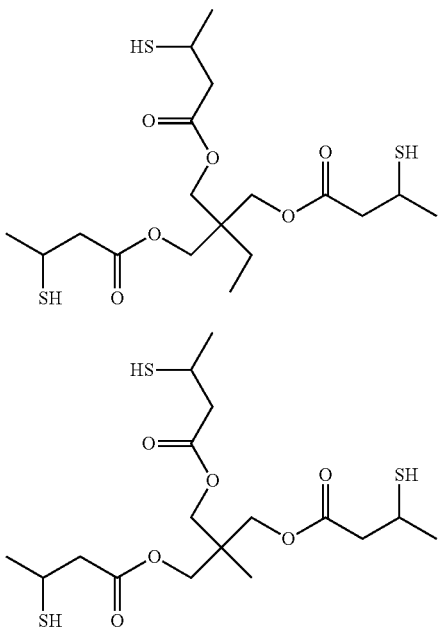

(S-5)

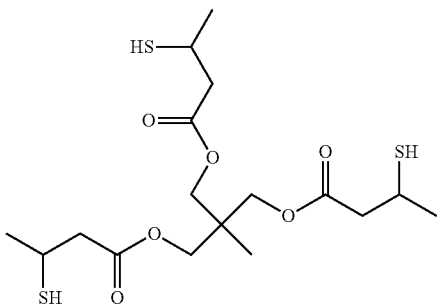

The content of the chain transfer agent with respect to the total solid content in the composition is preferably 0.2% to 5.0% by mass, and more preferably 0.4% to 3.0% by mass. Furthermore, the content of the chain transfer agent with respect to 100 parts by mass of the polymerizable compound is preferably 1 to 40 parts by mass, and more preferably 2 to 20 parts by mass. The composition contains only one kind of chain transfer agent or two or more kinds of chain transfer agents. In a case where the composition contains two or more kinds of chain transfer agents, the total amount thereof is preferably within the above range.

<<Sensitizer>>

For the purpose of improving the radical generating efficiency of the photopolymerization initiator and increasing the photosensitive wavelength, the composition according to the embodiment of the present invention may contain a sensitizer. As the sensitizer, a substance which increases sensitivity of a photopolymerization initiator by an electron transfer mechanism or an energy transfer mechanism is preferable. Examples of the sensitizer include substances having absorption in a range of 300 to 450 nm. Specifically, the description in paragraphs "0231" to "0253" in JP2010-106268A (paragraphs "0256" to "0273" in US2011/0124824A corresponding to JP2010-106268A) can be referred to, and the contents thereof are incorporated into the present specification.

The content of the sensitizer with respect to the total solid content in the composition is preferably 0.1% to 20% by mass, and more preferably 0.5% to 15% by mass. The composition may contain only one kind of sensitizer or two or more kinds of sensitizers. In a case where the composition contains two or more kinds of sensitizers, the total amount thereof is preferably within the above range.

<<Co-Sensitizer>>

It is also preferable that the composition according to the embodiment of the present invention further contains a co-sensitizer. The co-sensitizer has a function of further improving the sensitivity of a photopolymerization initiator or a sensitizer to actinic radiation or a function of inhibiting oxygen from hindering the polymerization of a polymerizable compound. Specifically, regarding the co-sensitizer, the description in paragraphs "0254" to "0257" in JP2010-106268A (paragraphs "0277" to "0279" in US2011/0124824A corresponding to JP2010-106268A) can be referred to, and the contents thereof are incorporated into the present specification.

From the viewpoint of improving a polymerization growth speed and a curing speed, the content of the co-sensitizer with respect to the total solid content in the composition is preferably 0.1% to 30% by mass, more preferably 1% to 25% by mass, and even more preferably 1.5% to 20% by mass. The composition may contain only one kind of co-sensitizer or two or more kinds of sensitizers. In a case where the composition contains two or co-sensitizers, the total amount thereof is preferably within the above range.

<<Surfactant>>

From the viewpoint of further improving coating suitability, the composition according to the embodiment of the present invention may contain various surfactants. As the surfactants, it is possible to use various surfactants such as a fluorine-based surfactant, a nonionic surfactant, a cationic surfactant, an anionic surfactant, and a silicone-based surfactant.

In a case where the composition contains a fluorine-based surfactant, liquid characteristics (particularly, fluidity) can be further improved in a case where the composition is prepared as a coating solution, coating thickness uniformity can be further improved, and the solution can be further saved. That is, in a case where a film is formed of a coating solution in which the composition containing a fluorine-based surfactant is used, the interfacial tension between a surface to be coated and the coating solution is reduced, the wettability for the surface to be coated is improved, and the coating suitability for the surface to be coated is improved. Accordingly, it is possible to more suitably form a film having a uniform thickness in which thickness unevenness occurs less.

A suitable fluorine content rate in the fluorine-based surfactant is 3% to 40% by mass. The fluorine content rate is more preferably 5% to 30% by mass, and particularly preferably 7% to 25% by mass. The fluorine-based surfactant in which the fluorine content rate is within the above range is effective in view of thickness uniformity of the coating film or saving the solution, and exhibits excellent solubility in the composition.

Specifically, examples of the fluorine-based surfactant include the surfactants described in paragraphs "0060" to "0064" in JP2014-041318A (paragraphs "0060" to "0064" in WO2014/017669A corresponding to JP2014-041318A) and the surfactants described in paragraphs "0117" to "0132" in JP2011-132503A, and the contents thereof are incorporated into the present specification. Examples of commercial products of the fluorine-based surfactant include MEGAFACE F171, F172, F173, F176, F177, F141, F142, F143, F144, R30, F437, F475, F479, F482, F554, and F780 (manufactured by DIC Corporation), FLUORAD FC430, FC431, and FC171 (manufactured by Sumitomo 3M Ltd.), SURFLON S-382, SC-101, SC-103, SC-104, SC-105, SC-1068, SC-381, SC-383, SC-393, and KH-40 (manufactured by ACG Inc.), PolyFox PF636, PF656, PF6320, PF6520, and PF7002 (manufactured by OMNOVA Solutions Inc.), and the like.

As the fluorine-based surfactant, an acrylic compound can also be suitably used which has a molecular structure having a functional group containing a fluorine atom and in which the portion of the functional group containing a fluorine atom is cleaved in a case where the compound is heated and hence the fluorine atom is volatilized. Examples of such a fluorine-based surfactant include a MEGAFACE DS series manufactured by DIC Corporation (Chemical Daily, Feb. 22, 2016) (Nikkei Industrial Journal, Feb. 23, 2016) such as MEGAFACE DS-21, and this compound can be used.

As the fluorine-based surfactant, a block polymer can also be used. Examples thereof include the compounds described in JP2011-089090A. As the fluorine-based surfactant, it is possible to preferably use a fluorine-containing polymer compound having a repeating unit which is derived from a (meth)acrylate compound having a fluorine atom and a repeating unit which is derived from a (meth)acrylate compound having two or more (preferably five or more) alkylene oxide groups (preferably ethyleneoxy groups or propyleneoxy groups). Examples of the fluorine-based surfactant used in the present invention also include the following compounds.

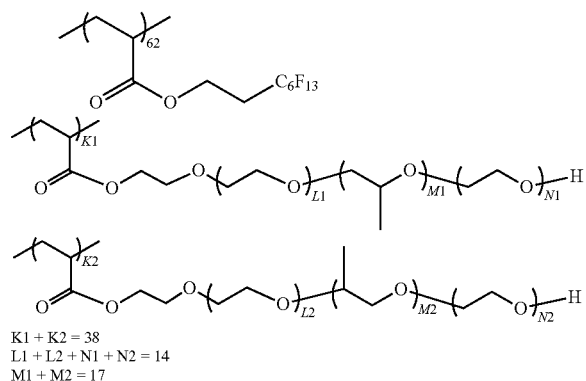

K1 + K2 = 38
L1 + L2 + N1 + N2 = 14
M1 + M2 = 17

The weight-average molecular weight of the above compounds is preferably 3,000 to 50,000. For example, the weight-average molecular weight is 14,000.

Furthermore, as the fluorine-based surfactant, it is also possible to use a fluorine-containing polymer having a group, which has an ethylenically unsaturated bond, on a side chain. Specific examples thereof include the compounds described in paragraphs "0050" to "0090" and paragraphs "0289" to "0295" in JP2010-164965A, such as MEGAFACE RS-101, RS-102, RS-718K, and RS-72-K manufactured by DIC Corporation. As the fluorine-based surfactant, the compounds described in paragraphs "0015" to "0158" in JP2015-117327A can also be used.

In addition, as the fluorine-based surfactant, it is also possible to use a fluorine-containing polymer having a group, which has an ethylenically unsaturated bond, on a side chain. Specific examples thereof include the compounds described in paragraphs "0050" to "0090" and paragraphs "0289" to "0295" in JP2010-164965A, such as MEGAFACE RS-101, RS-102, RS-718K, and RS-72-K manufactured by DIC Corporation. As the fluorine-based surfactant, the compounds described in paragraphs "0015" to "0158" in JP2015-117327A can also be used.

Examples of the silicone-based surfactant include TORAY SILICONE DC-3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (manufactured by Dow Corning Toray Co., Ltd.), TSF-4440, TSF-4300, TSF-4445, TSF-4460, and TSF-4452 (manufactured by Momentive Performance Materials Inc.), KP341, KF6001, and KF6002 (manufactured by Shin-Etsu Silicones), BYK307, BYK323, and BYK330 (manufactured by BYK Additives & Instruments), and the like.

The content of the surfactant with respect to the total solid content in the composition is preferably 0.001% to 2.0% by mass, and more preferably 0.005% to 1.0% by mass. Only one kind of surfactant may be used, or two or more kinds of surfactants may be used in combination.

<<Other Additives>>

In order to improve the physical properties of a film or a cured film, known additives such as a plasticizer and a sensitizer may be added to the composition. Examples of the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerin, and the like. The content of the plasticizer with respect to the total mass of the polymerizable compound and the resin is preferably equal to or smaller than 10% by mass.

<Preparation Method of Composition>

The composition can be prepared by mixing together the components described above.

At the time of preparing the composition, the components may be mixed together at once. Alternatively, each of the components may be subjected to at least either dissolution or dispersion in a solvent, and then the components were sequentially mixed together. At the time of mixing, the order of components mixed in or the operation condition is not particularly limited.

Furthermore, the preparation of the composition preferably includes a process of dispersing particles. Examples of mechanical force used for dispersing particles in the process of dispersing particles include compression, pressing, impact, shearing, cavitation, and the like. Specific examples of these processes include a beads mill, a sand mill, a roll mill, a ball mill, a paint shaker, a microfluidizer, a high-speed impeller, a sand grinder, a flow jet mixer, high-pressure wet atomization, ultrasonic dispersion, and the like. At the time of grinding particles in a sand mill (beads mill), it is preferable to treat the particles under the conditions in which the grinding efficiency is increased by using beads having a small diameter, increasing a filling rate of beads, and the like. Furthermore, after the grinding treatment, it is preferable to remove coarse particles by filtering, centrifugation, and the like. In addition, as the process and the dispersion machine for dispersing particles, it is possible to suitably use the process and the dispersion machine described in "Compendium of Dispersion Technology, JOHOKIKO, CO., LTD., Jul. 15, 2005", "Dispersion Technology Focused on Suspension (Solid/Liquid Dispersion System) and Practice of Industrial Application, Comprehensive Data, Publishing Department of Keiei Kaihatsu Center, Oct. 10, 1978", and paragraph "0022" in JP2015-157893A. Moreover, in the process of dispersing particles, the particles may be treated to be micronized by a salt milling step. Regarding the materials, instruments, treatment conditions, and the like used in the salt milling step, for example, the description in JP2015-194521A and JP2012-046629A can be referred to.

At the time of preparing the composition, for the purpose of removing foreign substance, reducing defects, and the like, it is preferable to performing filtering by using a filter. As the filter, filters used in the related art for filtering and the like can be used without particular limitation. Examples of the filter include filters using materials including a fluororesin such as polytetrafluoroethylene (PTFE), a polyamide-based resin such as nylon (for example, nylon-6 or nylon-6,6), and a polyolefin resin (including a polyolefin resin having high density and ultrahigh-molecular weight) such as polyethylene or polypropylene (PP). Among these materials, polypropylene (including high-density polypropylene) and nylon are preferable.

An appropriate pore size of the filter is about 0.01 to 10.0 µm. The pore size is preferably about 0.05 to 3.0 µm, and more preferably about 0.5 to 2.0 µm. In a case where the pore size is within the above range, fine foreign substances can be reliably removed. It is also preferable to use a fibrous filter, and examples of the filter include polypropylene fiber, nylon fiber, glass fiber, and the like. Specifically, it is possible to use filter cartridges of an SBP type series (SBP008 or the like), a TPR type series (TPR002, TPR005, or the like), and an SHPX type series (SHPX003 or the like) manufactured by ROKI TECHNO CO., LTD.

At the time of using filters, different filters (for example, a first filter, a second filter, and the like) may be used in combination. At this time, filtering performed using each filter may be carried out once or twice or more.

Furthermore, filters having different pore sizes within the aforementioned range may be used in combination. As the pore size mentioned herein, the nominal values form filter manufacturers can be referred to. A commercial filter can be selected from various filters provided from, for example, Pall Corporation Japan (DFA4201NXEY or the like), Advantec Toyo Kaisha, Ltd., Nihon Entegris KK (former MICRONICS JAPAN CO., LTD.), KITZ MICRO FILTER CORPORATION, or the like.

As the second filter, a filter formed of the same material as the first filter can be used.

Furthermore, only the dispersion liquid may be filtered by the filtering performed using the first filter, and the filtered dispersion liquid may be mixed with other components and then filtered through the second filter.

<Film>

The film according to the embodiment of the present invention is formed of the composition according to the embodiment of the present invention. It is preferable that the film according to the embodiment of the present invention contains particles having a refractive index equal to or higher than 2.1 for light having a wavelength of 589 nm. Furthermore, it is preferable that the film according to the embodiment of the present invention contains a white pigment.

$L^*$ of the film according to the embodiment of the present invention in the CIE1976 $L^*a^*b^*$ color space is preferably 35 to 100. The value of $L^*$ is preferably equal to or greater than 40, more preferably equal to or greater than 50, and even more preferably equal to or greater than 60. According to this aspect, a film having excellent whiteness can be obtained. The value of $L^*$ of the film is preferably equal to or smaller than 95, more preferably equal to or smaller than 90, and even more preferably equal to or smaller than 85. According to this aspect, a film having an appropriate visible transmittance can be obtained. The value of $L^*$, the value of $a^*$, and the value of $b^*$ in the CIE1976 $L^*a^*b^*$ color space are values measured by the method described in Examples which will be described later.

The value of $a^*$ of the film is preferably equal to or greater than −15, more preferably equal to or greater than −10, and even more preferably equal to or greater than −5. Furthermore, the value of $a^*$ of the film is preferably equal to or smaller than 10, more preferably equal to or smaller than 5, and even more preferably equal to or smaller than 0. According to this aspect, a film having excellent whiteness can be obtained.

The value of $b^*$ of the film is preferably equal to or greater than −35, more preferably equal to or greater than −30, and even more preferably equal to or greater than −25. Furthermore, the value of $b^*$ of the film is preferably equal to or smaller than 20, more preferably equal to or smaller than 10, and even more preferably equal to or smaller than 0. According to this aspect, a film having excellent whiteness can be obtained.

The thickness of the film according to the embodiment of the present invention is preferably 3 to 40 µm. The upper limit of the film thickness is preferably equal to or smaller than 30 µm, more preferably equal to or smaller than 20 µm, and even more preferably equal to or smaller than 15 µm. The lower limit of the film thickness is preferably equal to or greater than 5 µm, more preferably equal to or greater than 7 µm, and even more preferably equal to or greater than 9 µm. In a case where the film thickness is within the above range, it is expected that effects, such as obtaining a thin film sensor and improving optical sensitivity of a device by inhibiting crosstalk, will be obtained.

<Optical Sensor>

The optical sensor according to the embodiment of the present invention has the cured film according to the embodiment of the present invention. Examples of the optical sensor include a solid-state imaging element and the like.

<Manufacturing Method of Film>

The manufacturing method of a film according to the embodiment of the present invention is a method for manufacturing a film by using the composition according to the embodiment of the present invention. It is preferable that the manufacturing method of a film according to the embodiment of the present invention includes a step of forming a composition layer on a support by using the composition according to the embodiment of the present invention, and a step of aggregating particles by providing an external stimulus to the dispersant in the composition layer. It is also preferable that the manufacturing method of a film according to the embodiment of the present invention further includes a step of forming a pattern. Examples of the pattern forming method include a pattern forming method using a photolithography method and a pattern forming method using a dry etching method. Examples of the pattern forming method using a photolithography method include a method including a step of pattern-wise exposing the composition layer and a step of forming a pattern by developing and removing an unexposed portion, and the like. Furthermore, it is preferable that the pattern forming method by a dry etching method includes a step of forming a cured substance layer by curing the composition layer, a step of forming a photoresist layer on the cured substance layer, a step of obtaining a resist pattern by patterning the photoresist layer by means of exposure and development, and a step of forming a pattern by dry-etching the cured substance layer by using the resist pattern as an etching mask. In a case where the manufacturing method of a film according to the embodiment of the present invention includes the step of forming a pattern, it is preferable to provide an external stimulus to the dispersant in the composition layer before the step of forming a pattern is performed, such that the particles are aggregated. Hereinafter, each of the steps will be described.

In the step of forming a composition layer, by using the composition according to the embodiment of the present invention, a composition layer is formed on a support. The support is not particularly limited and can be appropriately selected according to the purpose. Examples of the support include alkali-free glass used in liquid crystal display devices, soda glass, PYREX (registered trademark) glass, quartz glass, a substrate obtained by attaching these to a transparent conductive film, a photoelectric conversion element substrate used in a solid-state imaging element or the like, a silicon substrate, a complementary metal oxide semiconductor (CMOS), and the like. Furthermore, if necessary, these substrates may be provided with an undercoat layer so as to improve the adhesion to the upper layer, prevent the diffusion of substances, block a specific wavelength, or planarize the surface. The composition can be applied to the support by using a known method. Examples thereof include a drop casting method; a slit coating method; a spray method; a roll coating method; a spin coating method; a cast coating method; a slit and spin method; a pre-wetting method (for example, the method described in JP2009-145395A); various printing methods such as inkjet (for example, on-demand method, a piezoelectric method, or a thermal method), jet printing such as nozzle jet, flexographic printing, screen printing, gravure printing, reverse offset printing, and a metal mask printing method; a transfer method using a die; a nanoimprinting method, and the like. The method of applying the composition by using an ink jet is not particularly limited, and examples thereof include the methods described in the patent documents in "Widespread-Usable Ink Jet-Infinite Potentials Viewed from Patent-, February 2005, SB. RESEARCH CO., LTD.) (particularly, pp. 115-133), the methods described in JP2003-262716A, JP2003-185831A, JP2003-261827A, JP2012-126830A, JP2006-169325A, and the like. From the viewpoint of coating suitability, coating carried out by a spin coating method is preferably performed by spin coating at a speed of 300 to 6,000 rpm, and more preferably performed by spin coating at a speed of 400 to 3,000 rpm. Furthermore, at the time of spin coating, the temperature of the support is preferably 10° C. to 100° C., and more preferably 20° C. to 70° C. In a case where the temperature is within the above range, it is easy to manufacture a film having excellent coating uniformity. In a case where a drop casting method is used, in order to obtain a uniform film having a predetermined film thickness, it is preferable to form dropping regions of the composition on a support that are partitioned by a photoresist functioning as walls. By controlling the amount of the composition added dropwise, the concentration of the solid contents in the composition, and the area of the dropping region, the desired film thickness can be obtained. The thickness of the film obtained after drying is not particularly limited, and can be appropriately selected according to the purpose.

The composition layer formed on the support may be dried (pre-baked). The pre-baking is preferably performed, for example, at a temperature of 60° C. to 150° C. for 30 seconds to 15 minutes.

In the step of aggregating particles, an external stimulus is provided to the dispersant in the composition layer. Examples of the method of providing an external stimulus to the dispersant include heating, light irradiation, and the like. By these operations, a stimulus is provided to the dispersant, the solvophilic portion of the dispersant is decomposed or denatured, and hence the dispersant loses its function. As a result, particles can be aggregated.

The step of aggregating particles is performed preferably in a state where the solvent remains in the composition layer, more preferably in a state where the amount of the residual solvent with respect to the amount of the solvent at the time of coating is equal to or greater than 10% by mass, and even more preferably in a state where the amount of the residual solvent is equal to or greater than 30% by mass. The upper limit of the amount of the residual solvent is preferably equal to or smaller than 95% by mass, for example. In a case where the step of aggregating particles is performed in a state where the solvent remains in the composition layer, the particles can be more effectively aggregated.

The step of aggregating particles is preferably performed during the pre-baking of the composition layer or before the pre-baking. Furthermore, in a case where heat is used as an external stimulus, the pre-baking of the composition layer may also function as the step of aggregating particles.

In a case where a pattern is formed by a photolithography method, next, the composition layer is pattern-wise exposed. For example, in a case where the composition layer is exposed using an exposure machine such as a stepper through a mask having a predetermined mask pattern, the composition layer can be pattern-wise exposed. In this way, the exposed portion can be cured. As radiation (light) which can be used at the time of exposure, ultraviolet rays such as a g-line or an i-line (particularly preferably an i-line) are preferably used. The irradiation amount (exposure amount) is, for example, preferably 0.03 to 2.5 J/cm$^2$, and more preferably 0.05 to 1.0 J/cm$^2$. The oxygen concentration at the time of exposure can be appropriately selected. The exposure may be performed in the atmosphere. In addition, for example, the exposure may be performed in a hypoxic atmosphere in which the oxygen concentration is equal to or lower than 19% by volume (for example, in an atmosphere in which the oxygen concentration is equal to or lower than 15% by volume or equal to or lower than 5% by volume, particularly, substantially in an anaerobic atmosphere) or may be performed in a hyperoxic atmosphere in which the oxygen concentration is higher than 21% by volume (for example, in an atmosphere in which the oxygen concentration is equal to or higher than 22% by volume or equal to or higher than 30% by volume, particularly, in an atmosphere in which the oxygen concentration is equal to or higher than 50% by volume). In addition, the exposure illuminance can be appropriately set generally within a range of 1,000 W/m$^2$ to 100,000 W/m$^2$ (for example, at an exposure illuminance equal to or higher than 5,000 W/m$^2$ or equal to or higher than 15,000 W/m$^2$, particularly, at an exposure illuminance equal to or higher than 35,000 W/m$^2$). The conditions of the oxygen concentration and the exposure illuminance may be appropriately combined. For example, a combination of an oxygen concentration of 10% by volume and an illuminance of 10,000 W/m$^2$, a combination of an oxygen concentration of 35% by volume and an illuminance of 20,000 W/m$^2$, and the like can be adopted.

Then, by developing and removing an unexposed portion, a pattern is formed. The unexposed portion can be developed and removed using a developer. By the use of the developer, the composition layer in the unexposed portion is eluted to the developer, and only the photocured portion remains. As the developer, an alkaline developer which does not damage the circuit of the base or the like is desirable. As the developer, the solvents described in the present specification may also be used. The liquid temperature of the developer is preferably 20° C. to 30° C., for example. The development time is preferably 20 to 180 seconds, and more preferably 20 to 90 seconds.

As the developer, an aqueous alkaline solution obtained by diluting an alkaline agent with pure water is preferably used. Examples of the alkaline agent include an organic alkaline compound such as aqueous ammonia, ethylamine, diethylamine, dimethylethanolamine, diglycolamine, diethanolamine, hydroxyamine, ethylenediamine, tetramethylammoniumhydroxide, tetraethylammoniumhydroxide, tetrapropylammoniumhydroxide, tetrabutylammoniumhydroxide, benzyltrimethylammoniumhydroxide, dimethylbis(2-hydroxyethyl)ammoniumhydroxide, choline, pyrrole, piperidine, or 1,8-diazabicyclo[5.4.0]-7-undecene, and an inorganic alkaline compound such as sodium hydroxide, potassium hydroxide, sodium carbonate, sodium hydrogen carbonate, sodium silicate, or sodium metasilicate. The concentration of the alkaline agent in the aqueous alkaline solution is preferably 0.001% to 10% by mass, and more preferably 0.01% to 1% by mass. The developer may further contain a surfactant. Examples of the surfactant include the surfactants described above regarding the composition. In a case where a developer formed of an aqueous alkaline solution is used, generally, it is preferable to perform rinsing by using pure water after development.

After the development, at least either heating (post-baking) or exposure may be further performed. According to this aspect, curing of the film further proceeds, and hence a film more rigidly cured can be manufactured. In a case where the post-baking is performed, the heating temperature is preferably 100° C. to 260° C. The lower limit thereof is preferably equal to or higher than 120° C., and particularly preferably equal to or higher than 160° C. The upper limit thereof is more preferably equal to or lower than 240° C., and particularly preferably equal to or lower than 220° C. In a case where the heating temperature is within the above range, it is easy to obtain a film having excellent hardness. The heating time is preferably 1 to 180 minutes. The lower limit thereof is more preferably equal to or longer than 3 minutes. The upper limit thereof is more preferably equal to or shorter than 120 minutes. The heating device is not particularly limited, and can be appropriately selected from known devices according to the purpose. Examples of the heating device include a dry oven, a hot plate, an infrared heater, and the like.

It is also possible to laminate white patterns by repeating some or all of the steps described above.

EXAMPLES

Hereinafter, the present invention will be more specifically described based on examples, but the present invention is not limited to the examples. Unless otherwise specified, "part" and "%" are based on mass. PGME is an abbreviation for propylene glycol monomethyl ether, and PGME A is an abbreviation for propylene glycol monomethyl ether acetate.

<Measurement of Weight-Average Molecular Weight>

The weight-average molecular weight of a dispersant and a binder was measured by gel permeation chromatography (GPC) under the following conditions.

Type of column: column obtained by connecting TOSOH TSKgel Super HZM-H, TOSOH TSKgel Super HZ4000, and TOSOH TSKgel Super HZ2000

Developing solvent: tetrahydrofuran

Column temperature: 40° C.

Flow rate (amount of sample injected): 1.0 μL (sample concentration: 0.1% by mass)

Device name: HLC-8220GPC manufactured by Tosoh Corporation

Detector: refractive index (RI) detector

Base resin for calibration curve: polystyrene resin

<Measurement of Average Primary Particle Diameter of Particles>

The primary particle diameter of particles was determined by observing the particles with a transmission electron microscope (TEM) and check portions in which the particles were not aggregated. Furthermore, the particle size distribution of the particles was determined by capturing a transmission electron micrograph of primary particles by using a transmission electron microscope and then measuring the particle size distribution with an image processing device by using the micrograph. A number-based arithmetic mean diameter calculated from the particle size distribution was adopted as the average primary particle diameter of the particles. An electron microscope (H-7000) manufactured by Hitachi, Ltd. was used as the transmission electron microscope, and LUZEX AP manufactured by NIRECO. was used as the image processing device.

<Measurement of Refractive Index of Particles>

By using particles, a resin (dispersant) whose refractive index was known, and propylene glycol monomethyl ether acetate (PGMEA), dispersion was performed. Then, the prepared dispersion liquid and the resin whose refractive index was known were mixed together, thereby preparing coating solutions in which the concentration of the particles in the total solid content in each of the coating solutions was 10% by mass, 20% by mass, 30% by mass, and 40% by mass. By using each of these coating solutions, a film having a thickness of 300 nm was formed on a silicon wafer, and then the refractive index of the obtained film was measured using ellipsometry (LAMBDA ACE RE-3300 (trade name), manufactured by DAINIPPON SCREEN MEG. CO., LTD.). Thereafter, the concentration of the particles and the refractive index were plotted on a graph so as to elicit the refractive index of the particles.

SYNTHESIS METHOD OF DISPERSANT (Synthesis Example 1) Synthesis of Dispersant (B-1)

Itaconic acid (110.31 g), dipentaerythritol hexakis(3-mercaptopropionate) (189.69 g), and PGME (700 g) were put into a three-neck flask, heated to 80° C. in a nitrogen atmosphere, and stirred. Then, V-601 (azo-based polymerization initiator manufactured by Wako Pure Chemical Industries, Ltd.) (0.49 g) was added thereto, and the mixture was stirred for 2 hours and then heated to 90° C. and stirred for 3 hours, thereby obtaining a dispersant precursor X.

PGMEA (63.00 g) was put into a three-neck flask and heated to 80° C. in a nitrogen atmosphere. Then, a solution, which was obtained by dissolving the dispersant precursor X (101.46 g), methyl methacrylate (24.61 g), tert-butyl methacrylate (34.95 g), and V-601 (0.34 g) in PGMEA (45.98 g), was added dropwise to the solution in the flask for 2.5 hours. After the dropping ended, the solution was stirred for 5 hours so as to finish the reaction, and PGMEA (30.00 g) was added thereto, thereby obtaining a dispersant (B-1). The dispersant (B-1) had a weight-average molecular weight of 6,000 and a solubility parameter of 20.14 MPa$^{0.5}$. Furthermore, an external stimulus was provided to the dispersant (B-1) by heating the dispersant for 1 to 60 minutes at any temperature within a range of 80° C. to 160° C. or by bringing the dispersant into contact with an acid having any pKa within a range of −10 to 4 for 1 to 60 minutes. In this case, the solubility parameter of a structure obtained after the external stimulus was provided was 22.38 MPa$^{0.5}$. In the dispersant (B-1), a carboxyl group is a particle adsorption group, and the following structure is a solvophilic portion. The solubility parameter of the following structure is 18.58

MPa$^{0.5}$. The numerical value attached to each of the repeating units represents the number of repeating units. The repeating units are not limited to the aspect in which they are linked to each other in the order shown in the following structural formula so as to form a block of each of the repeating units. The repeating units may be randomly bonded to each other.

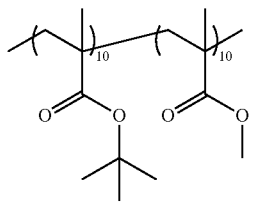

(Synthesis Example 2) Synthesis of Dispersants (B-2) and (B-3)

Dispersants (B-2) and (B-3) were synthesized by the same method as the dispersant (B-1).

The dispersant (B-2) had a weight-average molecular weight of 6,000 and a solubility parameter of 20.24 MPa$^{0.5}$. Furthermore, an external stimulus was provided to the dispersant (B-2) by heating the dispersant for 1 to 60 minutes at any temperature within a range of 80° C. to 160° C. or by bringing the dispersant into contact with an acid having any pKa within a range of −10 to 4 for 1 to 60 minutes. In this case, the solubility parameter of a structure obtained after the external stimulus was provided was 22.38 MPa$^{0.5}$. In the dispersant (B-2), a carboxyl group is a particle adsorption group. In addition, in the dispersant (B-2), the following structure is a solvophilic portion. The solubility parameter of the following structure is 18.94 MPa$^{0.5}$. The numerical value attached to each of the repeating units represents the number of repeating units. The repeating units are not limited to the aspect in which they are linked to each other in the order shown in the following structural formula so as to form a block of each of the repeating units. The repeating units may be randomly bonded to each other.

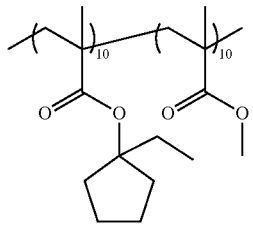

The dispersant (B-3) had a weight-average molecular weight of 6,000 and a solubility parameter of 19.47 MPa$^{0.5}$. Furthermore, an external stimulus was provided to the dispersant (B-3) by heating the dispersant for 1 to 60 minutes at any temperature within a range of 80° C. to 160° C. or by bringing the dispersant into contact with an acid having any pKa within a range of −10 to 4 for 1 to 60 minutes. In this case, the solubility parameter of a structure obtained after the external stimulus was provided was 24.13 MPa$^{0.5}$. In the dispersant (B-3), a carboxyl group is a particle adsorption group. In addition, in the dispersant (B-3), the following structure is a solvophilic portion. The solubility parameter of the following structure is 17.97 MPa$^{0.5}$. The numerical value attached to the repeating unit represents the number of repeating units.

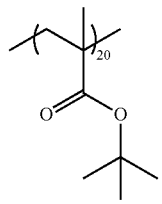

(Synthesis Example 3) Synthesis of Dispersant (B-4)

PGMEA (303.33 g) was put into a three-neck flask and heated to 80° C. in a nitrogen atmosphere. Then, a solution, which was obtained by dissolving 3-mercaptopropionate (8.39 g), methyl methacrylate (79.17 g), tert-butyl methacrylate (112.44 g), and V-601 (1.91 g) in PGMEA (163.33 g), was added dropwise to the solution in the flask for 2.5 hours. After the dropping ended, the mixture was stirred for 5 hours and left to cool. Thereafter, by using a mixed solvent of 600 mL of water and 2,400 mL of methanol, reprecipitation was performed, the precipitate was dried, and then 208.44 g of a macromonomer (Y-1) was obtained.

Polyethylene imine (SP-018, manufactured by NIPPON SHOKUBAI CO., LTD.) (10 g), 100 g of the macromonomer (Y-1), and PGMEA (47.14 g) were put into a three-neck flask, mixed together, and heated for 3 hours at 120° C. Then, the mixture was left to cool to 65° C., a solution, which was obtained by dissolving succinic acid anhydride (3.8 g) in 152.86 g of PGMEA, was slowly added to the solution in the flask, and the mixture was stirred for 2 hours. Thereafter, 65.53 g of PGMEA was added thereto, thereby obtaining a dispersant (B-4). The dispersant (B-4) had a weight-average molecular weight of 25,000 and a solubility parameter of 19.30 MPa$^{0.5}$. Furthermore, an external stimulus was provided to the dispersant (B-4) by heating the dispersant for 1 to 60 minutes at any temperature within a range of 80° C. to 160° C. or by bringing the dispersant into contact with an acid having any pKa within a range of −10 to 4 for 1 to 60 minutes. In this case, the solubility parameter of a structure obtained after the external stimulus was provided was 22.02 MPa$^{0.5}$. In the dispersant (B-4), a carboxyl group is a particle adsorption group, and the following structure is a solvophilic portion. The solubility parameter of the following structure is 18.58 MPa$^{0.5}$. The numerical value attached to each of the repeating units represents the number of repeating units. The repeating units are not limited to the aspect in which they are linked to each other in the order shown in the following structural formula so as to form a block of each of the repeating units. The repeating units may be randomly bonded to each other.

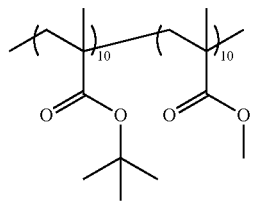

(Synthesis Example 4) Synthesis of Dispersant (B-5)

PGMEA (303.33 g) was put into a three-neck flask and heated to 80° C. in a nitrogen atmosphere. Then, a solution, which was obtained by dissolving 3-mercaptopropionate (8.39 g), methyl methacrylate (79.17 g), tert-butyl methacrylate (112.44 g), and V-601 (1.91 g) in PGMEA (163.33 g), was added dropwise to the solution in the flask for 2.5 hours. After the dropping ended, the mixture was stirred for 5 hours. Thereafter, a 4-hydroxy-2,2,6,6-tetramethylpiperidin-1-oxyl free radical (0.50 g), glycidyl methacrylate (15.00 g), and tetraethylammonium bromide (10.00 g) were added thereto, and reacted for 12 hours at 90° C. The mixture was left to cool and then reprecipitated using a mixed solvent of 600 mL of water and 2,400 mL of methanol, the precipitate was dried, and then 214.71 g of a macromonomer (Y-2) was obtained.

PGMEA (151.67 g) was put into a three-neck flask and heated to 80° C. in a nitrogen atmosphere. Then, a solution, which was obtained by dissolving the macromonomer (Y-2) (39.52 g), LIGHT ESTER HO-MS (manufactured by KYOEISHA CHEMICAL Co., LTD) (59.14 g), dodecylmercaptane (1.33 g), and V-601 (0.31 g) in PGMEA (81.67 g), was added dropwise to the solution in the flask for 2.5 hours. After the dropping ended, the mixture was stirred for 5 minutes, thereby obtaining a dispersant (B-5). The dispersant (B-5) had a weight-average molecular weight of 20,000 and a solubility parameter of 19.31 MPa$^{0.5}$.

Furthermore, an external stimulus was provided to the dispersant (B-5) by heating the dispersant for 1 to 60 minutes at any temperature within a range of 80° C. to 160° C. or by bringing the dispersant into contact with an acid having any pKa within a range of −10 to 4 for 1 to 60 minutes. In this case, the solubility parameter of the structure obtained after the external stimulus was provided was 21.69 MPa$^{0.5}$. In the dispersant (B-5), a carboxyl group is a particle adsorption group, and the following structure is a solvophilic portion. The solubility parameter of the following structure is 18.58 MPa$^{0.5}$. The numerical value attached to each of the repeating units represents the number of repeating units. The repeating units are not limited to the aspect in which they are linked to each other in the order shown in the following structural formula so as to form a block of each of the repeating units. The repeating units may be randomly bonded to each other.

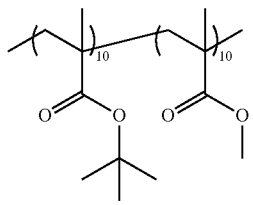

(Synthesis Example 5) Synthesis of Dispersant (B-6)

PGMEA (303.33 g) was put into a three-neck flask and heated to 80° C. in a nitrogen atmosphere. Then, a solution, which was obtained by dissolving 2-mercaptoethanol (6.25 g), methyl methacrylate (80.05 g), tert-butyl methacrylate (113.70 g), and V-601 (1.93 g) in PGMEA (163.33 g), was added dropwise to the solution in the flask for 2.5 hours. After the dropping ended, the mixture was stirred for 5 hours. Thereafter, a 4-benzoyloxy-2,2,6,6-tetramethylpiperidin-1-oxyl free radical (0.50 g) and KARENZ MOI (manufactured by SHOWA DENKO K.K., 20.00 g) were added thereto, and reacted for 12 hours at 90° C. The mixture was left to cool and then reprecipitated using a mixed solvent of 600 mL of water and 2,400 mL of methanol, the precipitate was dried, and then 210.83 g of a macromonomer (Y-3) was obtained.

PGMEA (151.67 g) was put into a three-neck flask and heated to 80° C. in a nitrogen atmosphere. Then, a solution, which was obtained by dissolving the macromonomer (Y-3) (39.52 g), LIGHT ESTER HO-MS (59.14 g), dodecylmercaptane (1.33 g), and V-601 (0.31 g) in PGMEA (81.67 g), was added dropwise to the solution in the flask for 2.5 hours. After the dropping ended, the mixture was stirred for 5 minutes, thereby obtaining a dispersant (B-6). The dispersant (B-6) had a weight-average molecular weight of 22,000 and a solubility parameter of 19.57 MPa$^{0.5}$. Furthermore, an external stimulus was provided to the dispersant (B-6) by heating the dispersant for 1 to 60 minutes at any temperature within a range of 80° C. to 160° C. or by bringing the dispersant into contact with an acid having any pKa within a range of −10 to 4 for 1 to 60 minutes. In this case, the solubility parameter of a structure obtained after the external stimulus was provided was 22.10 MPa$^{0.5}$. In the dispersant (B-6), a carboxyl group is a particle adsorption group, and the following structure is a solvophilic portion. The solubility parameter of the following structure is 18.58 MPa$^{0.5}$. The numerical value attached to each of the repeating units represents the number of repeating units. The repeating units are not limited to the aspect in which they are linked to each other in the order shown in the following structural formula so as to form a block of each of the repeating units. The repeating units may be randomly bonded to each other.

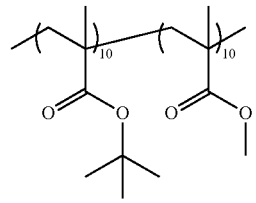

(Synthesis Example 6) Synthesis of Dispersant (B-7) (Dispersant of Comparative Example)

A dispersant (B-7) was synthesized by the same method as the dispersant (B-1). The dispersant (B-7) had a weight-average molecular weight of 6,000 and a solubility parameter of 21.05 MPa$^{0.5}$. In the dispersant (B-7), a carboxyl group is a particle adsorption group. Furthermore, in the dispersant (B-7), the following structure is a solvophilic portion. The solubility parameter of the following structure is 19.50 MPa$^{0.5}$. The following structure was a structure stable against heat, light, an acid, and a base. The numerical value attached to the repeating unit represents the number of repeating units.

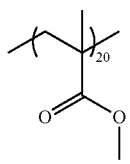

The structures of the dispersants (B-1) to (B-7) are shown below.

In the dispersants (B-1) to (B-3) and (B-7), m and n represent the number of structures in a bracket, and the numerical value (10 or 20) attached to the repeating unit in [ ]n represents the number of repeating units. Furthermore, the repeating units in [ ]n are not limited to the aspect in which the repeating units are linked to each other in order shown in the following structural formula so as to form a block of each of the repeating units. The repeating units may be randomly bonded to each other.

In the dispersants (B-4) to (B-6), the numerical value attached to a main chain of a repeating unit is a molar ratio, and the numerical value attached to a side chain is the number of repeating units. Furthermore, the repeating units in the side chain are not limited to the aspect in which the repeating units are linked to each other in order shown in the following structural formula so as to form a block of each of the repeating units. The repeating units may be randomly bonded to each other.

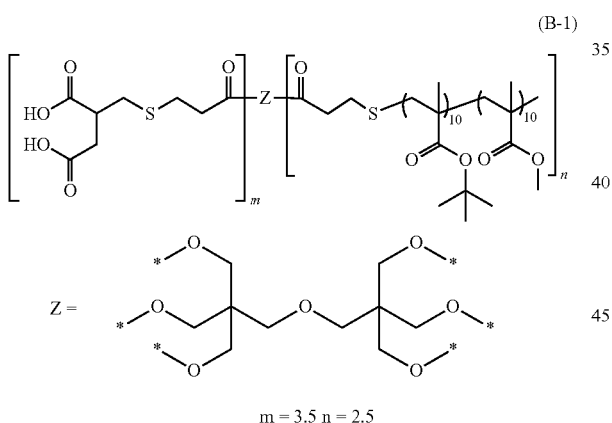

(B-1)

m = 3.5 n = 2.5

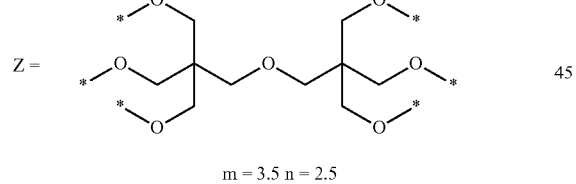

(B-2)

m = 3.5 n = 2.5

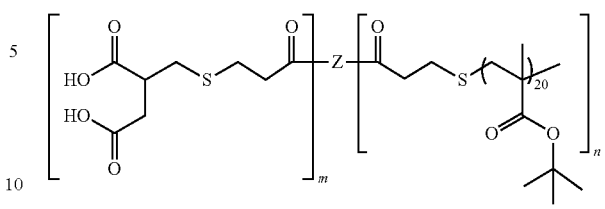

(B-3)

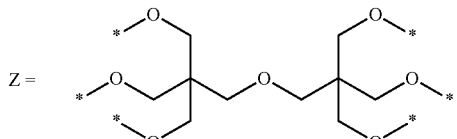

m = 3.5 n = 2.5

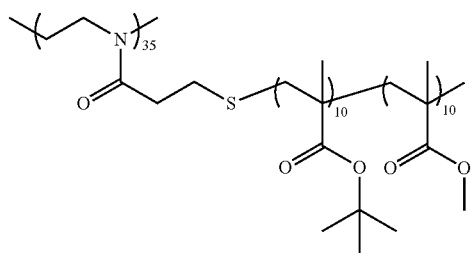

(B-4)

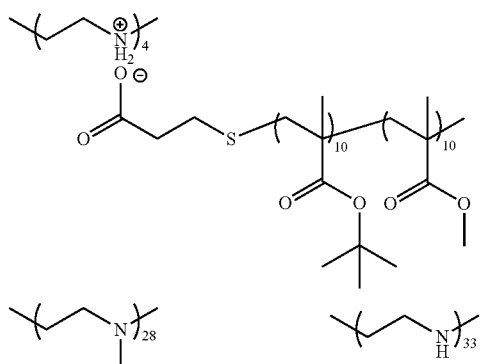

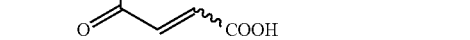

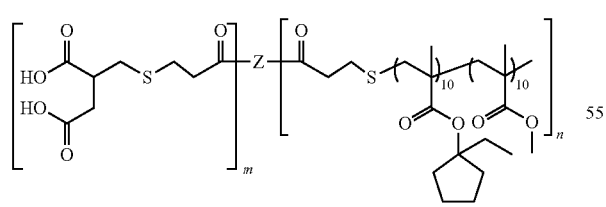

(B-5)

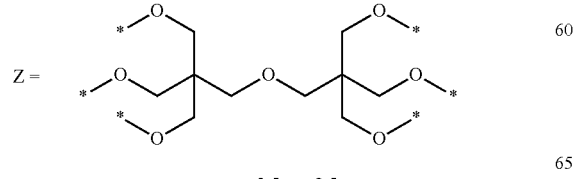

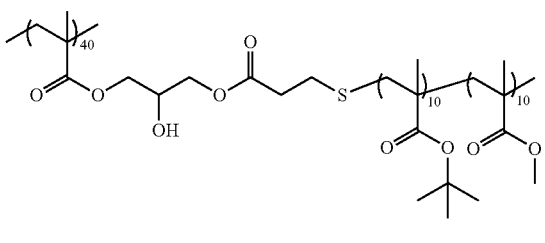

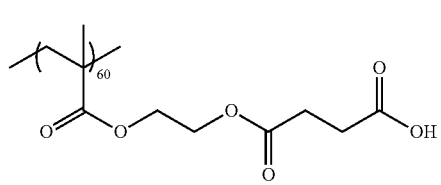

-continued (B-6)

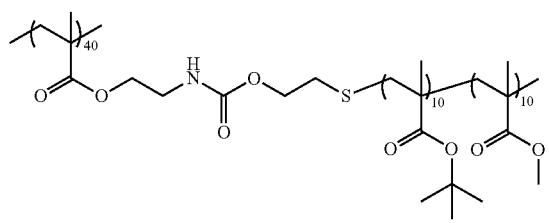

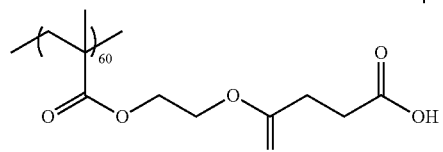

(B-7)

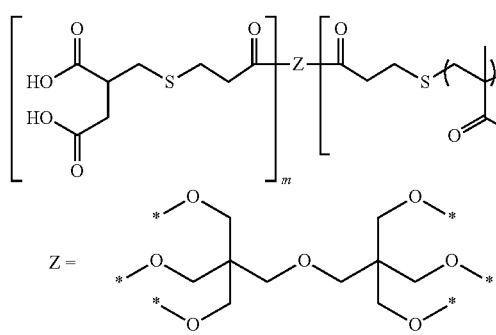

m = 3.5 n = 2.5

<Manufacturing of Dispersion Liquid>

Each of the mixed solutions composed as shown in the following table was subjected to a dispersion treatment described below by using ULTRA APEX MILL manufactured by KOTOBUKI KOGYOU CO., LTD. as a circulation-type dispersion apparatus (beads mill), thereby manufacturing a dispersion liquid. After dispersion was started, the average particle diameter of particles was measured every 30 minutes. Although the average particle diameter of the particles kept decreasing with the passage of dispersion treatment time, the amount of change in the average particle diameter was gradually reduced. The dispersion was stopped at a point in time when the amount of change of d50 (cumulative distribution: 50%) in the particle size distribution disappeared.

Bead size: diameter of 0.2 mm
Filling rate of beads: 65% by volume
Circumferential speed: 6 m/sec
Pump feeding amount: 10.8 kg/hour
Cooling water: tab water
Internal volume of cyclic path of beads mill: 0.15 L
Amount of mixed solution subjected to dispersion treatment: 0.65 kg

TABLE 1

| | White pigment | | Dispersant | | Solvent | |
|---|---|---|---|---|---|---|
| | Type | Added amount (part by mass) | Type | Added amount (part by mass) | Type | Added amount (part by mass) |
| Dispersion liquid 1 | A-1 | 38.5 | B-1 | 38.3 | BDGAC | 23.2 |
| Dispersion liquid 2 | A-1 | 38.5 | B-2 | 38.3 | BDGAC | 23.2 |
| Dispersion liquid 3 | A-1 | 38.5 | B-3 | 38.3 | BDGAC | 23.2 |
| Dispersion liquid 4 | A-1 | 38.5 | B-4 | 38.3 | BDGAC | 23.2 |
| Dispersion liquid 5 | A-1 | 38.5 | B-5 | 38.3 | BDGAC | 23.2 |
| Dispersion liquid 6 | A-1 | 38.5 | B-6 | 38.3 | BDGAC | 23.2 |
| Dispersion liquid 7 | A-2 | 38.5 | B-1 | 38.3 | BDGAC | 23.2 |
| Dispersion liquid 8 | A-3 | 38.5 | B-1 | 38.3 | BDGAC | 23.2 |
| Dispersion liquid 9 | A-1 | 38.5 | B-1 | 38.3 | TGDAC | 23.2 |
| Dispersion liquid 10 | A-1 | 38.5 | B-1 | 38.3 | Tributyrin | 23.2 |
| Dispersion liquid 11 | A-1 | 38.5 | B-1/B-6 | 26.8/11.5 | BDGAC | 23.2 |
| Dispersion liquid 12 | A-1 | 38.5 | B-3/B-7 | 26.8/11.5 | BDGAC | 23.2 |
| Dispersion liquid 13 | A-1 | 38.5 | B-7 | 38.3 | BDGAC | 23.2 |

The raw materials described in the above table are as below.

(White Pigment)

TABLE 2

| | Particles | Material | Surface treatment agent | Manufacturer | Average primary particle diameter | Density [g/cm$^3$] | Refractive index |
|---|---|---|---|---|---|---|---|
| A-1 | TTO-80A | Titanium oxide | Aluminum hydroxide | ISHIHARA SANGYO KAISHA, LTD. | 60 nm | 4.1 | 2.7 |
| A-2 | MPT-141 | Titanium oxide | Aluminum hydroxide | ISHIHARA SANGYO KAISHA, LTD. | 91 nm | 4.1 | 2.7 |
| A-3 | Z incox Super F-1 | Zinc oxide | N/A | Hakusuitech Co., Ltd. | 100 nm | 5.6 | 2.0 |

(Dispersant)
Dispersants (B-1) to (B-7) described above
(Solvent)
BDGAC: diethylene glycol monobutyl ether acetate (solubility parameter=18.87 MPa$^{0.5}$, boiling point=247° C.)
TGDAC: triethylene glycol diacetate (solubility parameter=20.73 MPa$^{0.5}$, boiling point=300° C.)
Tributyrin: glycerol tributyrate (solubility parameter=19.79 MPa$^{0.5}$, boiling point=305° C.)

By mixing together the raw materials described in the following table, compositions were manufactured.

TABLE 3

| | Dispersion liquid | | | Alkali-soluble resin | | Polymerizable compound | | Photopolymerization initiator | | Additive | |
|---|---|---|---|---|---|---|---|---|---|---|---|
| | Type | Part by mass | Content of white pigment (% by mass with respect to total solid content) | Type | Part by mass | Type | Part by mass | Type | Part by mass | Type | Part by mass |
| Composition 1 | Dispersion liquid 1 | 52 | 42.1 | C-1 | 8.4 | D-1 | 9.3 | E-1 | 2.8 | F-1 | 1.0 |
| Composition 2 | Dispersion liquid 1 | 52 | 41.9 | C-1 | 8.4 | D-1 | 9.3 | E-1 | 2.8 | F-1 | 1.0 |
| Composition 3 | Dispersion liquid 1 | 52 | 41.9 | C-1 | 8.4 | D-1 | 9.3 | E-1 | 2.8 | F-1 | 1.0 |
| Composition 4 | Dispersion liquid 1 | 52 | 41.9 | C-1 | 8.4 | D-1 | 9.3 | E-1 | 2.8 | F-1 | 1.0 |
| Composition 5 | Dispersion liquid 1 | 52 | 41.9 | C-1 | 8.4 | D-1 | 9.3 | E-1 | 2.8 | F-1 | 1.0 |
| Composition 6 | Dispersion liquid 1 | 52 | 39.8 | C-1 | 8.4 | D-1 | 9.3 | E-1 | 2.8 | F-1 | 1.0 |
| Composition 7 | Dispersion liquid 1 | 52 | 38.1 | C-1 | 8.4 | D-1 | 9.3 | E-1 | 2.8 | F-1 | 1.0 |
| Composition 8 | Dispersion liquid 1 | 52 | 38.1 | C-1 | 8.4 | D-1 | 9.3 | E-1 | 2.8 | F-1 | 1.0 |
| Composition 9 | Dispersion liquid 1 | 52 | 39.2 | C-1 | 8.4 | D-1 | 9.3 | E-1 | 2.8 | F-1 | 1.0 |
| Composition 10 | Dispersion liquid 1 | 52 | 39.2 | C-1 | 8.4 | D-1 | 9.3 | E-1 | 2.8 | F-2 | 1.0 |
| Composition 11 | Dispersion liquid 1 | 52 | 39.2 | C-1 | 8.4 | D-1 | 9.3 | E-1 | 2.8 | F-1 | 1.0 |
| Composition 12 | Dispersion liquid 1 | 52 | 39.2 | C-1 | 8.4 | D-1 | 9.3 | E-1 | 2.8 | F-1 | 1.0 |
| Composition 13 | Dispersion liquid 2 | 52 | 39.2 | C-1 | 8.4 | D-1 | 9.3 | E-1 | 2.8 | F-1 | 1.0 |
| Composition 14 | Dispersion liquid 3 | 52 | 39.2 | C-1 | 8.4 | D-1 | 9.3 | E-1 | 2.8 | F-1 | 1.0 |
| Composition 15 | Dispersion liquid 4 | 52 | 39.2 | C-1 | 8.4 | D-1 | 9.3 | E-1 | 2.8 | F-1 | 1.0 |
| Composition 16 | Dispersion liquid 5 | 52 | 39.2 | C-1 | 8.4 | D-1 | 9.3 | E-1 | 2.8 | F-1 | 1.0 |
| Composition 17 | Dispersion liquid 6 | 52 | 39.2 | C-1 | 8.4 | D-1 | 9.3 | E-1 | 2.8 | F-1 | 1.0 |
| Composition 18 | Dispersion liquid 7 | 52 | 39.2 | C-1 | 8.4 | D-1 | 9.3 | E-1 | 2.8 | F-1 | 1.0 |
| Composition 19 | Dispersion liquid 8 | 52 | 39.2 | C-1 | 8.4 | D-1 | 9.3 | E-1 | 2.8 | F-1 | 1.0 |
| Composition 20 | Dispersion liquid 9 | 52 | 39.2 | C-1 | 8.4 | D-1 | 9.3 | E-1 | 2.8 | F-1 | 1.0 |
| Composition 21 | Dispersion liquid 9 | 52 | 39.2 | C-1 | 8.4 | D-1 | 9.3 | E-1 | 2.8 | F-1 | 1.0 |
| Composition 22 | Dispersion liquid 10 | 52 | 39.2 | C-1 | 8.4 | D-1 | 9.3 | E-1 | 2.8 | F-1 | 1.0 |
| Composition 23 | Dispersion liquid 10 | 52 | 39.2 | C-1 | 8.4 | D-1 | 9.3 | E-1 | 2.8 | F-1 | 1.0 |
| Composition 24 | Dispersion liquid 10 | 52 | 39.9 | C-1 | 8.4 | D-1 | 9.3 | E-1 | 2.8 | — | |
| Composition 25 | Dispersion liquid 11 | 52 | 39.2 | C-1 | 8.4 | D-1 | 9.3 | E-1 | 2.8 | F-1 | 1.0 |
| Composition 26 | Dispersion liquid 12 | 52 | 39.2 | C-1 | 8.4 | D-1 | 9.3 | E-1 | 2.8 | F-1 | 1.0 |
| Composition 27 | Dispersion liquid 1 | 52 | 39.2 | C-2 | 8.4 | D-1 | 9.3 | E-1 | 2.8 | F-1 | 1.0 |
| Composition 28 | Dispersion liquid 1 | 52 | 39.2 | C-1 | 8.4 | D-2 | 9.3 | E-1 | 2.8 | F-1 | 1.0 |
| Composition 29 | Dispersion liquid 1 | 52 | 39.2 | C-1 | 8.4 | D-1 | 9.3 | E-2 | 2.8 | F-1 | 1.0 |
| Composition 30 | Dispersion liquid 1 | 52 | 39.2 | C-1 | 8.4 | D-1 | 9.3 | E-3 | 2.8 | F-1 | 1.0 |
| Composition 31 | Dispersion liquid 1 | 52 | 39.2 | C-1 | 8.4 | D-1 | 9.3 | E-4 | 2.8 | F-1 | 1.0 |
| Composition 32 | Dispersion liquid 13 | 52 | 39.2 | C-1 | 8.4 | D-1 | 9.3 | E-1 | 2.8 | F-1 | 1.0 |

| | Solvent | | Anti-coloring agent | | Adhesion agent | | Chain transfer agent | | Epoxy compound | | Surfactant |
|---|---|---|---|---|---|---|---|---|---|---|---|
| | Type | Part by mass | Type | Part by mass | Type | Part by mass | Type | Part by mass | Type | Part by mass | Part by mass |
| Composition 1 | BDGAC | 26.5 | — | | — | | — | | — | | 0.03 |
| Composition 2 | BDGAC | 26.2 | G-1 | 0.3 | — | | — | | — | | 0.03 |
| Composition 3 | BDGAC | 26.2 | G-2 | 0.3 | — | | — | | — | | 0.03 |
| Composition 4 | BDGAC | 26.2 | G-3 | 0.3 | — | | — | | — | | 0.03 |
| Composition 5 | BDGAC | 26.2 | G-4 | 0.3 | — | | — | | — | | 0.03 |
| Composition 6 | BDGAC | 23.7 | G-3 | 0.3 | H-1 | 2.5 | — | | — | | 0.03 |
| Composition 7 | BDGAC | 21.5 | G-3 | 0.3 | H-1 | 2.5 | — | | J-1 | 2.2 | 0.03 |
| Composition 8 | BDGAC | 21.5 | G-3 | 0.3 | H-1 | 2.5 | — | | J-2 | 2.2 | 0.03 |
| Composition 9 | BDGAC | 22.9 | G-3 | 0.3 | H-1 | 2.5 | I-1 | 0.8 | — | | 0.03 |
| Composition 10 | BDGAC | 22.9 | G-3 | 0.3 | H-1 | 2.5 | I-1 | 0.8 | — | | 0.03 |
| Composition 11 | TGDAC | 22.9 | G-3 | 0.3 | H-1 | 2.5 | I-1 | 0.8 | — | | 0.03 |
| Composition 12 | Tributyrin | 22.9 | G-3 | 0.3 | H-1 | 2.5 | I-1 | 0.8 | — | | 0.03 |
| Composition 13 | BDGAC | 22.9 | G-3 | 0.3 | H-1 | 2.5 | I-1 | 0.8 | — | | 0.03 |
| Composition 14 | BDGAC | 22.9 | G-3 | 0.3 | H-1 | 2.5 | I-1 | 0.8 | — | | 0.03 |
| Composition 15 | BDGAC | 22.9 | G-3 | 0.3 | H-1 | 2.5 | I-1 | 0.8 | — | | 0.03 |
| Composition 16 | BDGAC | 22.9 | G-3 | 0.3 | H-1 | 2.5 | I-1 | 0.8 | — | | 0.03 |
| Composition 17 | BDGAC | 22.9 | G-3 | 0.3 | H-1 | 2.5 | I-1 | 0.8 | — | | 0.03 |
| Composition 18 | BDGAC | 22.9 | G-3 | 0.3 | H-1 | 2.5 | I-1 | 0.8 | — | | 0.03 |
| Composition 19 | BDGAC | 22.9 | G-3 | 0.3 | H-1 | 2.5 | I-1 | 0.8 | — | | 0.03 |
| Composition 20 | BDGAC | 22.9 | G-3 | 0.3 | H-1 | 2.5 | I-1 | 0.8 | — | | 0.03 |
| Composition 21 | TGDAC | 22.9 | G-3 | 0.3 | H-1 | 2.5 | I-1 | 0.8 | — | | 0.03 |
| Composition 22 | BDGAC | 22.9 | G-3 | 0.3 | H-1 | 2.5 | I-1 | 0.8 | — | | 0.03 |
| Composition 23 | Tributyrin | 22.9 | G-3 | 0.3 | H-1 | 2.5 | I-1 | 0.8 | — | | 0.03 |
| Composition 24 | Tributyrin | 23.9 | G-3 | 0.3 | H-1 | 2.5 | I-1 | 0.8 | — | | 0.03 |

TABLE 3-continued

| | | | | | | | | | | |
|---|---|---|---|---|---|---|---|---|---|---|
| Composition 25 | BDGAC | 22.9 | G-3 | 0.3 | H-1 | 2.5 | I-1 | 0.8 | — | 0.03 |
| Composition 26 | BDGAC | 22.9 | G-3 | 0.3 | H-1 | 2.5 | I-1 | 0.8 | — | 0.03 |
| Composition 27 | BDGAC | 22.9 | G-3 | 0.3 | H-1 | 2.5 | I-1 | 0.8 | — | 0.03 |
| Composition 28 | BDGAC | 22.9 | G-3 | 0.3 | H-1 | 2.5 | I-1 | 0.8 | — | 0.03 |
| Composition 29 | BDGAC | 22.9 | G-3 | 0.3 | H-1 | 2.5 | I-1 | 0.8 | — | 0.03 |
| Composition 30 | BDGAC | 22.9 | G-3 | 0.3 | H-1 | 2.5 | I-1 | 0.8 | — | 0.03 |
| Composition 31 | BDGAC | 22.9 | G-3 | 0.3 | H-1 | 2.5 | I-1 | 0.8 | — | 0.03 |
| Composition 32 | BDGAC | 22.9 | G-3 | 0.3 | H-1 | 2.5 | I-1 | 0.8 | — | 0.03 |

The raw materials described in the above table are as below.

(Dispersion Liquid)

Dispersion liquids 1 to 13: dispersion liquids 1 to 13 described above (Alkali-Soluble Resin)

C-1: resin having the following structure (acid value=113 mgKOH/g, Mw=33,000), the numerical value shown together with each repeating unit represents the content (mass ratio) of each repeating unit.

C-2: resin having the following structure (acid value=32 mgKOH/g, Mw=14,000), the numerical value shown together with each repeating unit represents the content (mass ratio) of each repeating unit.

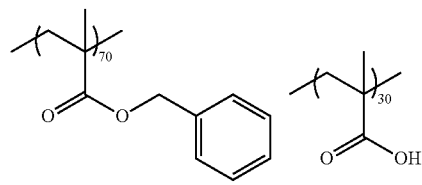

(C-1)

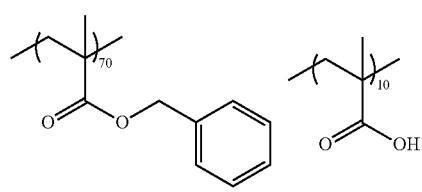

(C-2)

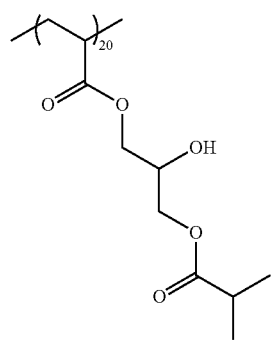

(Polymerizable Compound)

D-1: KAYARAD DPHA (manufactured by Nippon Kayaku Co., Ltd.)

D-2: NK ESTER A-TMMT (manufactured by SHIN-NAKAMURA CHEMICAL CO., LTD.)

(Photopolymerization Initiator)

E-1: the following compound

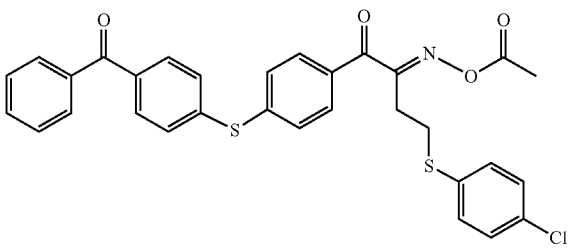

(E-1)

E-2: IRGACURE 379 (manufactured by BASF SE)

E-3: IRGACURE TPO (manufactured by BASF SE)

E-4: IRGACURE 819 (manufactured by BASF SE)

(Additive)

F-1: SAN-AID SI-60L (manufactured by SANSHIN CHEMICAL INDUSTRY CO., LTD.)

F-2: CPI-200K (manufactured by San-Apro Ltd.)

(Anti-Coloring Agent)

G-1: ADEKA STAB PEP-36A (manufactured by ADEKA CORPORATION)

G-2: ADEKA STAB AO-50 (manufactured by ADEKA CORPORATION)

G-3: ADEKA STAB AO-80 (manufactured by ADEKA CORPORATION)

G-4: ADEKA STAB AO-412S (manufactured by ADEKA CORPORATION)

(Adhesion Agent)

H-1: the following compound

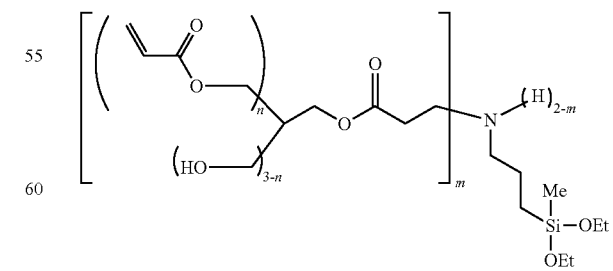

(H-1)

$m = 1, 2$
$n = 1, 2, 3$
(main product: $m = 2$, $n = 3$)

(Chain Transfer Agent)
I-1: the following compound

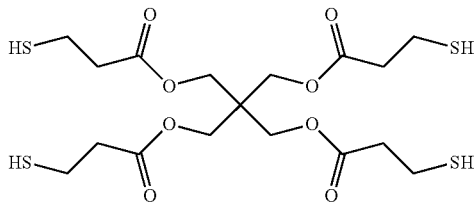

(I-1)

(Epoxy Compound)
J-1: EHPE3150 (manufactured by Daicel Corporation)
J-2: EPICLON N-695 (manufactured by DIC Corporation)
(Surfactant)
The following compound (Mw=14,000, the numerical value shown together with each repeating unit represents the content [mass ratio] of each repeating unit, and the numerical value attached to a side chain represents the number of repeating units.)

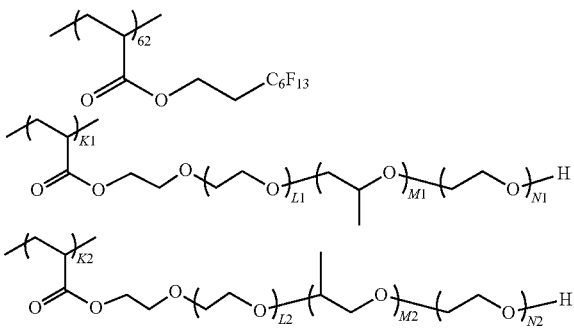

K1 + K2 = 38
L1 + L2 + N1 + N2 = 14
M1 + M2 = 17

<Manufacturing of Pattern>

Examples 1 to 9 and 11 to 31 and Comparative Example 1

By using a spin coater, an 8-inch glass wafer (1 inch equals 2.54 cm) with an undercoat layer (CT-4000L manufactured by FUJIFILM Electronic Materials Co., Ltd.; thickness: 0.1 μm) was coated with each of the compositions obtained as above such that the thickness thereof became 3.0 μm after drying. Then, by using a hot plate of 110° C., a heating treatment (pre-baking) was performed for 30 minutes. Thereafter, by using an i-line stepper exposure machine FPA-3000i5+(manufactured by Canon Inc.), the coating film was exposed by being irradiated with light having a wavelength of 365 nm at 1,000 mJ/cm² through a mask having a 2 cm×2 cm pattern. Subsequently, the glass wafer, on which the exposed coating film was formed, was placed on a horizontally rotating table of a spin shower development machine (DW-30 model; manufactured by Chemitronics, Co., Ltd.) and subjected to puddle development for 65 seconds at 23° C. by using a 0.3% by mass aqueous tetramethylammonium hydroxide (TMAH) solution, thereby forming a white pattern on the glass wafer. The glass wafer on which the white pattern was formed was fixed to the horizontally rotating table by a vacuum chuck method. The glass wafer was rotated at a rotation speed of 50 rpm by a rotation device, and in this state, a rinsing treatment was performed by supplying pure water in the form of shower from a spray nozzle from above the rotation center. Then, by performing spray drying, a pattern was manufactured.

Example 10

By using a spin coater, an 8-inch glass wafer (1 inch equals 2.54 cm) with an undercoat layer (CT-4000L manufactured by FUJIFILM Electronic Materials Co., Ltd.; thickness: 0.1 μm) was coated with the composition 10 obtained as above such that the thickness thereof became 3.0 μm after drying.

Then, by using an i-line stepper exposure machine FPA-3000i5+(manufactured by Canon Inc.), the entirety of the coating film was exposed to light having a wavelength of 365 nm at 100 mJ/cm². Subsequently, by using a hot plate of 110° C., a heating treatment (pre-baking) was performed for 30 minutes.

Thereafter, by using an i-line stepper exposure machine FPA-3000i5+(manufactured by Canon Inc.), the coating film was exposed by being irradiated with light having a wavelength of 365 nm at 1,000 mJ/cm² through a mask having a 2 cm×2 cm pattern.

Subsequently, the glass wafer, on which the exposed coating film was formed, was placed on a horizontally rotating table of a spin shower development machine (DW-30 model; manufactured by Chemitronics, Co., Ltd.) and subjected to puddle development for 65 seconds at 23° C. by using a 0.3% by mass aqueous tetramethylammonium hydroxide (TMAH) solution, thereby forming a white pattern on the glass wafer. The glass wafer on which the white pattern was formed was fixed to the horizontally rotating table by a vacuum chuck method. The glass wafer was rotated at a rotation speed of 50 rpm by a rotation device, and in this state, a rinsing treatment was performed by supplying pure water in the form of shower from a spray nozzle from above the rotation center. Then, by performing spray drying, a white pattern was manufactured.

<Evaluation of Whiteness>

The value of L* of the obtained white pattern in the CIE1976 L*a*b* color space was measured using a spectrophotometer (X-rite 528, manufactured by X-rite, Incorporated). A D65 light source was used as a light source, a field of view was set to be 2°, and a standard of white was set using a white patch of a calibration standard plate attached to the spectrophotometer. A white pattern evaluated as A, B, C, or D is preferable, a white pattern evaluated as A, B, or C is more preferable, a white pattern evaluated as A or B is particularly preferable, and a white pattern evaluated as A is most preferable.

A: The value of L* is equal to or greater than 80.
B: The value of L* is equal to or greater than 70 and less than 80.
C: The value of L* is equal to or greater than 60 and less than 70.
D: The value of L* is equal to or greater than 50 and less than 60.
E: The value of L* is less than 50.

<Temporal Stability of Solution>

Each of the compositions obtained as above was dried under the conditions of 160° C. and 1 hour by using an oven. The amount of the composition volatilized was determined by measuring the mass of the composition before and after drying, and a difference between the mass of each composition before drying and the amount of each composition volatilized was calculated for each of the compositions so as to calculate "solid contents before centrifugation treatment". Furthermore, each of the obtained compositions was subjected to a centrifugation treatment under the conditions of room temperature and 3,400 rpm for 50 minutes, and then for the obtained supernatant solution, "solid contents after centrifugation treatment" was calculated by the same method as described above. A difference between "solid contents after centrifugation treatment" and "solid contents before centrifugation treatment" was divided by "solid contents before centrifugation treatment" and expressed as a percentage, thereby calculating a precipitation rate of solid contents. The temporal stability of solution of the compositions was tested by classifying the compositions as described below. In a case where a composition was evaluated as A, B, C, or D, the composition was regarded as unproblematic for practical use. A composition evaluated as A, B, or C is preferable, a composition evaluated as A or B is more preferable, and a composition evaluated as A is even more preferable. The obtained results are described in the following table.

A: The precipitation rate of solid contents is within a range equal to or lower than 2% by mass.

B: The precipitation rate of solid contents is within a range higher than 2% by mass and equal to or lower than 5% by mass.

C: The precipitation rate of solid contents is within a range higher than 5% by mass and equal to or lower than 10% by mass.

D: The precipitation rate of solid contents is within a range higher than 10% by mass and equal to or lower than 15% by mass.

E: The precipitation rate of solid contents is higher than 15% by mass.

<Light Fastness>

By using a spin coater, an 8-inch glass wafer with an undercoat layer (CT-4000L manufactured by FUJIFILM Electronic Materials Co., Ltd.; film thickness: 0.1 μm) was coated with each of the compositions obtained as above such that the film thickness thereof became 5.0 μm after drying. Then, by using a hot plate of 105° C., a heating treatment (pre-baking) was performed for 120 minutes. Thereafter, by using an i-line stepper exposure machine FPA-3000i5+ (manufactured by Canon Inc.), the coating film was exposed to light having a wavelength of 365 nm at 1,000 mJ/cm$^2$ through a mask having a 2 cm×2 cm pattern. Subsequently, the glass wafer, on which the exposed film was formed, was placed on a horizontally rotating table of a spin shower development machine (DW-30 model; manufactured by Chemitronics, Co., Ltd.) and subjected to puddle development for 60 seconds at 23° C. by using a 0.3% by mass aqueous tetramethylammonium hydroxide (TMAH) solution, thereby forming a white pattern on the glass wafer. The glass wafer on which the white pattern was formed was fixed to the horizontally rotating table by a vacuum chuck method. The glass wafer was rotated at a rotation speed of 50 rpm by a rotation device, and in this state, a rinsing treatment was performed by supplying pure water in the form of shower from a spray nozzle from above the rotation center. Then, the pattern was spray-dried. Thereafter, a heating treatment (post-baking) was performed for 5 minutes by using a hot plate of 200° C., and the film thickness after post-baking was measured using a stylus-type film thickness meter DEK-TAK. Subsequently, by using a super xenon weather meter SX75 manufactured by Suga Test Instruments Co., Ltd., the film was irradiated with 100,000 lux light for 50 hours, and then the film thickness was measured and adopted as a film thickness after a light fastness test. Based on a ratio of the film thickness after a light fastness test to the film thickness after post-baking (=(film thickness after light fastness test/film thickness after post-baking)×100), the compositions were classified as below so as to be evaluated by the light fastness test. A composition evaluated as A, B, C, or D is preferable, a composition evaluated as A, B, or C is more preferable, a composition evaluated as A or B is particularly preferable, and a composition evaluated as A is more particularly preferable. The obtained results are described in the following table.

A: The ratio of the film thickness after a light fastness test to the film thickness after post-baking is within a range higher than 95% and equal to or lower than 100%.

B: The ratio of the film thickness after a light fastness test to the film thickness after post-baking is within a range equal to or higher than 90% and less than 95%.

C: The ratio of the film thickness after a light fastness test to the film thickness after post-baking is within a range equal to or higher than 80% and less than 90%.

D: The ratio of the film thickness after a light fastness test to the film thickness after post-baking is within a range equal to or higher than 70% and less than 80%.

E: The ratio of the film thickness after a light fastness test to the film thickness after post-baking is within a range less than 70%.

<Colorability>

The spectral characteristics (L*, a*, b*) of the white pattern were measured using a spectrophotometer (X-rite 528, manufactured by X-rite, Incorporated). Then, after the spectral characteristics were measured, the white pattern was heated for 15 minutes at 265° C. by using a hot plate. After heating, the spectral characteristics of the white pattern were measured, and a color difference ΔE*ab of the pattern before and after heating in the CIE1976 L*a*b* color space was calculated. The color difference ΔE*ab is calculated by the following equation.

$$\text{Color difference } \Delta E^*ab=[(\Delta L^*)^2+(\Delta a^*)^2+(\Delta b^*)^2]^{1/2}$$

A: The color difference ΔE*ab is equal to or greater than 0 and less than 0.5.

B: The color difference ΔE*ab is equal to or greater than 0.5 and less than 1.0.

C: The color difference ΔE*ab is equal to or greater than 1.0 and less than 2.0.

D: The color difference ΔE*ab is equal to or greater than 2.0 and less than 3.0.

E: The color difference ΔE*ab is equal to or greater than 3.0.

<Defect>

By using a spin coater, an 8-inch silicon wafer with an undercoat layer (CT-4000L manufactured by FUJIFILM Electronic Materials Co., Ltd.; thickness: 0.1 μm) was coated with each of the compositions obtained as above such that the thickness thereof became 3.0 μm after drying. Then, by using a hot plate of 110° C., a heating treatment (pre-baking) was performed for 120 seconds, thereby forming a composition layer. By using a defect evaluation machine ComPLUS (manufactured by Applied Materials, Inc.), the number of foreign substances having a size equal to or greater than 5.0 μm on the substrate on which the composition layer was formed was counted.

The evaluation was performed on the immediately prepared composition and the composition that had been stored for 1 month at room temperature (23° C.), and the rate of increase of foreign substances was evaluated based on the following evaluation standards.

The rate of increase of foreign substances was calculated by (number of foreign substances after storage for 1 month at room temperature/number of foreign substances immediately after preparation). A composition evaluated as A, B, C, or D is preferable, a composition evaluated as A, B, or C is more preferable, a composition evaluated as A or B is even more preferable, and a composition evaluated as A is particularly preferable. The obtained results are described in the following table.

A: Less than 1.1
B: Equal to or higher than 1.1 and less than 1.3
C: Equal to or higher than 1.3 and less than 1.5
D: Equal to or higher than 1.5 and less than 3.0
E: Equal to or higher than 3.0

TABLE 4

|  | Composition | Whiteness | Temporal stability of solution | Light fastness | Colorability | Defect |
|---|---|---|---|---|---|---|
| Example 1 | Composition 1 | C | A | A | D | A |
| Example 2 | Composition 2 | C | A | A | C | A |
| Example 3 | Composition 3 | C | A | A | B | A |
| Example 4 | Composition 4 | C | A | A | A | A |
| Example 5 | Composition 5 | C | A | A | C | A |
| Example 6 | Composition 6 | C | A | A | A | A |
| Example 7 | Composition 7 | C | A | A | A | A |
| Example 8 | Composition 8 | C | A | A | A | A |
| Example 9 | Composition 9 | C | A | A | A | A |
| Example 10 | Composition 10 | C | A | A | A | A |
| Example 11 | Composition 11 | C | A | A | A | A |
| Example 12 | Composition 12 | C | A | A | A | A |
| Example 13 | Composition 13 | C | B | A | A | A |
| Example 14 | Composition 14 | B | B | A | A | A |
| Example 15 | Composition 15 | C | C | A | A | A |
| Example 16 | Composition 16 | C | D | A | A | A |
| Example 17 | Composition 17 | C | D | A | A | A |
| Example 18 | Composition 18 | A | A | A | A | A |
| Example 19 | Composition 19 | C | A | A | A | C |
| Example 20 | Composition 20 | C | A | A | A | A |
| Example 21 | Composition 21 | B | A | A | A | A |
| Example 22 | Composition 22 | C | A | A | A | A |
| Example 23 | Composition 23 | B | A | A | A | A |
| Example 24 | Composition 24 | C | A | A | A | A |
| Example 25 | Composition 25 | C | B | A | A | A |
| Example 26 | Composition 26 | C | A | A | A | A |
| Example 27 | Composition 27 | C | A | A | A | A |
| Example 28 | Composition 28 | C | A | A | A | A |
| Example 29 | Composition 29 | C | A | A | A | A |
| Example 30 | Composition 30 | C | A | A | A | A |
| Example 31 | Composition 31 | C | A | A | A | A |
| Comparative Example 1 | Composition 32 | E | A | A | A | A |

As is evident from the above results, the compositions of examples had excellent temporal stability of solution and made it possible to manufacture a film having excellent whiteness. From these results, it is understood that the compositions of examples have excellent particle dispersibility and make it possible to manufacture a film having a high color valency. In contrast, in comparative examples, the whiteness of the film was insufficient.

What is claimed is:
1. A dispersion liquid comprising:
   particles;
   a solvent; and
   a dispersant,
   wherein the particles are a white pigment,
   wherein the dispersant is a graft polymer having a particle adsorption portion and a solvophilic portion,
   the solvophilic portion includes a moiety which is decomposed or denatured by an action of heat, light, an acid, or an alkali,
   the moiety which is decomposed or denatured by the action of heat includes a structure represented by Formulae a-1, a structure represented by Formulae a-2, or a structure represented by Formulae a-3,
   the moiety which is decomposed or denatured by the action of light includes a structure represented by Formulae a-11, a structure represented by Formulae a-12, a structure represented by Formulae a-13, a structure represented by Formulae a-14, or a structure represented by Formulae a-15,
   the moiety which is decomposed or denatured by the action of an acid includes a structure represented by Formulae a-21, a structure represented by Formulae a-22, or a structure represented by Formulae a-23, and
   the moiety which is decomposed or denatured by the action of an alkali includes a structure represented by Formulae a-31 or a structure represented by Formulae a-32,

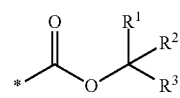

a-1

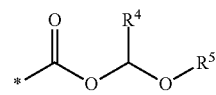

a-2

-continued

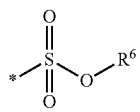
a-3 wherein $R^1$ to $R^6$ each independently represent an alkyl group or an aryl group,
* represents a bond,
$R^1$ and $R^2$ optionally form an aliphatic ring by being bonded to each other,
$R^4$ and $R^5$ optionally form a cyclic ether by being bonded to each other;

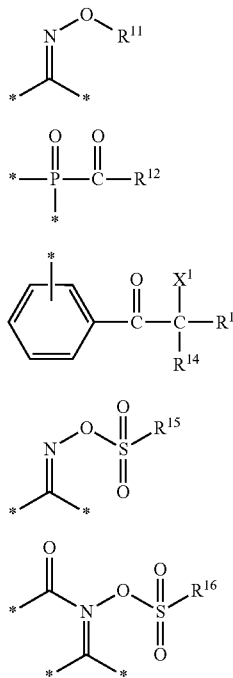

a-11 a-12 a-13 a-14 a-15 wherein $R^{11}$ to $R^{16}$ each independently represent an alkyl group or an aryl group,
$X^1$ represents $OR^{x1}$, $NR^{x2}R^{x3}$, or $SR^{x4}$,
$R^{x1}$ to $R^{x4}$ each independently represent an alkyl group or an aryl group,
* represents a bond;

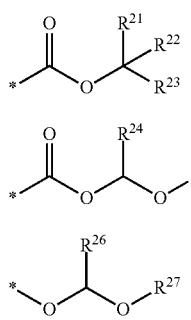

a-21 a-22 a-23 wherein $R^{21}$ to $R^{27}$ each independently represent an alkyl group or an aryl group,
* represents a bond,
$R^{21}$ and $R^{22}$ optionally form an aliphatic ring by being bonded to each other,
$R^{24}$ and $R^{25}$ optionally form a cyclic ether by being bonded to each other,
$R^{26}$ and $R^{27}$ optionally form a cyclic ether by being bonded to each other;

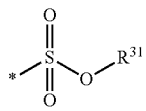
a-31

*—$R^{32}$—$X^2$
a-32 wherein $R^{31}$ represents an alkyl group or an aryl group,
$R^{32}$ represents an alkylene group,
$X^2$ represents a halogen atom,
* represents a bond.

2. The dispersion liquid according to claim 1,
wherein the dispersant is a dispersant whose solubility parameter changes by 0.5 $MPa^{0.5}$ or more by an external stimulus.

3. The dispersion liquid according to claim 1,
wherein the solvophilic portion includes a moiety which is decomposed or denatured by the action of heat.

4. The dispersion liquid according to claim 1,
wherein the particle adsorption portion contains at least one kind of group selected from the group consisting of an acid group, a colorant structure, a heterocyclic group, or an acyclic heteroatom-containing group.

5. The dispersion liquid according to claim 1,
wherein an absolute value of a difference between a solubility parameter of the solvophilic portion and a solubility parameter of the solvent is equal to or smaller than 2.5 $MPa^{0.5}$.

6. The dispersion liquid according to claim 1,
wherein the particles are titanium oxide.

7. A composition comprising;
the dispersion liquid according to claim 1; and
a binder.

8. The composition according to claim 7, further comprising:
an acid generator or a base generator.

9. The composition according to claim 7, further comprising:
a curable compound.

10. A manufacturing method of a film comprising:
applying the composition according to claim 7 on a support to form a composition layer on the support; and
aggregating the particles by providing an external stimulus to the dispersant in the composition layer.

11. A dispersant comprising:
a particle adsorption portion; and
a solvophilic portion,
wherein the solvophilic portion includes a moiety which is decomposed or denatured by an action of heat, light, an acid, or an alkali,
the moiety which is decomposed or denatured by the action of heat includes a structure represented by Formulae a-2 or a structure represented by Formulae a-3, the moiety which is decomposed or denatured by the action of light includes a structure represented by Formulae a-11, a structure represented by Formulae a-12, a structure represented by Formulae a-13, a structure represented by Formulae a-14, or a structure represented by Formulae a-15, the moiety which is decomposed or denatured by the action of an acid includes a structure represented by Formulae a-22 or a structure represented by Formulae a-23, and the moiety which is decomposed or denatured by the action of an alkali includes a structure represented by Formulae a-31 or a structure represented by Formulae a-32,

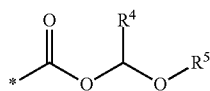
a-2

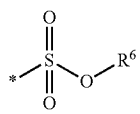
a-3 wherein $R^4$ to $R^6$ each independently represent an alkyl group or an aryl group,

* represents a bond, $R^4$ and $R^5$ optionally form a cyclic ether by being bonded to each other;

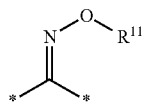
a-11

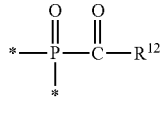
a-12

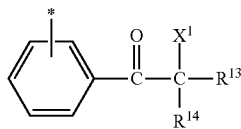
a-13

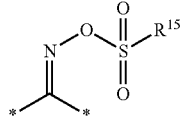
a-14

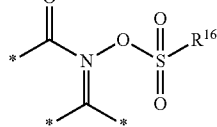
a-15 wherein $R^{11}$ to $R^{16}$ each independently represent an alkyl group or an aryl group, $X^1$ represents $OR^{x1}$, $NR^{x2}R^{x3}$, or $SR^{x4}$, $R^{x1}$ to $R^{x4}$ each independently represent an alkyl group or an aryl group,

* represents a bond;

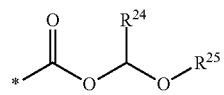
a-22

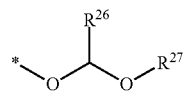
a-23 wherein $R^{24}$ to $R^{27}$ each independently represent an alkyl group or an aryl group,

* represents a bond, $R^{24}$ and $R^{25}$ optionally form a cyclic ether by being bonded to each other, $R^{26}$ and $R^{27}$ optionally form a cyclic ether by being bonded to each other;

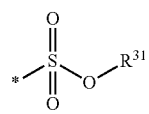
a-31

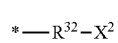
a-32 wherein $R^{31}$ represents an alkyl group or an aryl group, $R^{32}$ represents an alkylene group, $X^2$ represents a halogen atom,

* represents a bond.

12. The dispersion liquid according to claim 1, wherein the moiety which is decomposed or denatured by the action of heat includes the structure represented by Formulae a-2 or the structure represented by Formulae a-3, the moiety which is decomposed or denatured by the action of light includes the structure represented by Formulae a-11, the structure represented by Formulae a-12, the structure represented by Formulae a-13, the structure represented by Formulae a-14, or the structure represented by Formulae a-15, the moiety which is decomposed or denatured by the action of an acid includes the structure represented by Formulae a-22, or the structure represented by Formulae a-23, and the moiety which is decomposed or denatured by the action of an alkali includes the structure represented by Formulae a-31 or the structure represented by Formulae a-32.

13. The dispersion liquid according to claim 1, wherein the dispersant is a dispersant whose solubility parameter changes by 0.8 $MPa^{0.5}$ or more by an external stimulus.

14. The dispersion liquid according to claim 1, wherein the solvophilic portion is a group represented by Formula (P-1);

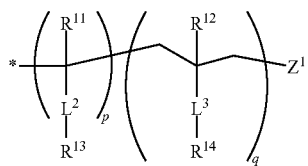 (P-1)

wherein, * represents a bond, $R^{11}$ and $R^{12}$ each independently represent a hydrogen atom or an alkyl group, $L^2$ and $L^3$ each independently represent a single bond or a divalent linking group, $Z^1$ represents a hydrogen atom or a substituent, $R^{13}$ is a substituent including the moiety which is decomposed or denatured by an action of heat, light, an acid, or an alkali, or forms a substituent including the moiety which is decomposed or denatured by an action of heat, light, an acid, or an alkali in the form of "-$L^2$-$R^{13}$", $R^{14}$ represents a hydrogen atom or a substituent, p represents an integer equal to or greater than 2, q represents an integer equal to or greater than 0, and p/(p+q) is 0.1 to 1, in a case where p is equal to or greater than 2, a plurality of $R^{11}$'s, $R^{13}$'s and $L^2$'s may be the same as or different from each other, in a case where q is equal to or greater than 2, a plurality of $R^{12}$'s, $R^{14}$'s, and $L^3$'s may be the same as or different from each other.

15. The dispersant according to claim 11, wherein the dispersant is a graft polymer having the particle adsorption portion and the solvophilic portion.

* * * * *